US009090722B2

(12) United States Patent
Fujimori et al.

(10) Patent No.: US 9,090,722 B2
(45) Date of Patent: Jul. 28, 2015

(54) CHEMICAL AMPLIFICATION RESIST COMPOSITION, AND MOLD PREPARATION METHOD AND RESIST FILM USING THE SAME

(75) Inventors: Toru Fujimori, Shizuoka (JP); Koji Shirakawa, Shizuoka (JP); Toshihiro Usa, Kanagawa (JP); Kenji Sugiyama, Kanagawa (JP); Takayuki Ito, Shizuoka (JP); Hideaki Tsubaki, Shizuoka (JP); Katsuhiro Nishimaki, Kanagawa (JP); Shuji Hirano, Shizuoka (JP); Hidenori Takahashi, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 440 days.

(21) Appl. No.: 13/256,397

(22) PCT Filed: Jun. 23, 2010

(86) PCT No.: PCT/JP2010/061096

§ 371 (c)(1),
(2), (4) Date: Sep. 13, 2011

(87) PCT Pub. No.: WO2010/150917

PCT Pub. Date: Dec. 29, 2010

(65) Prior Publication Data

US 2012/0006788 A1 Jan. 12, 2012

(30) Foreign Application Priority Data

Jun. 23, 2009 (JP) ................................ 2009-149229
Feb. 15, 2010 (JP) ................................ 2010-030654

(51) Int. Cl.

| | |
|---|---|
| ***C08F 20/50*** | (2006.01) |
| ***G03F 7/00*** | (2006.01) |
| ***G03F 7/039*** | (2006.01) |
| ***B82Y 10/00*** | (2011.01) |
| ***B82Y 40/00*** | (2011.01) |
| *B29C 59/02* | (2006.01) |
| *B29C 33/38* | (2006.01) |
| *B29C 33/42* | (2006.01) |
| *G03F 7/004* | (2006.01) |

(52) U.S. Cl.

CPC ................ *C08F 20/50* (2013.01); *B82Y 10/00* (2013.01); *B82Y 40/00* (2013.01); *G03F 7/0002* (2013.01); *G03F 7/0017* (2013.01); *G03F 7/0392* (2013.01); *G03F 7/0397* (2013.01); *B29C 33/38* (2013.01); *B29C 2033/426* (2013.01); *B29C 2059/023* (2013.01); *G03F 7/0046* (2013.01)

(58) Field of Classification Search

CPC B29C 2059/023; B29C 59/022; B29C 59/14; B29C 33/3878; B29C 71/04; B29C 33/424; G03F 7/32

USPC ........ 430/296, 270.1, 281.1, 322; 216/41, 47, 216/49, 50, 51

See application file for complete search history.

(56) References Cited

U.S. PATENT DOCUMENTS

| | | | | |
|---|---|---|---|---|
| 7,771,914 | B2 * | 8/2010 | Hatakeyama et al. | 430/270.1 |
| 2002/0042017 | A1 * | 4/2002 | Hatakeyama | 430/270.1 |
| 2004/0091817 | A1 | 5/2004 | Komatsu et al. | |
| 2005/0219992 | A1 * | 10/2005 | Takeda et al. | 369/275.1 |
| 2006/0068322 | A1 * | 3/2006 | Sasaki | 430/270.1 |
| 2006/0188810 | A1 * | 8/2006 | Ohsawa et al. | 430/270.1 |
| 2006/0194140 | A1 * | 8/2006 | Shimbori | 430/270.1 |
| 2006/0199112 | A1 * | 9/2006 | Watanabe | 430/330 |
| 2007/0277927 | A1 * | 12/2007 | Momose | 156/272.8 |
| 2008/0020289 | A1 | 1/2008 | Hatakeyama et al. | |
| 2009/0189317 | A1 * | 7/2009 | Sato et al. | 264/447 |
| 2010/0255411 | A1 | 10/2010 | Sato et al. | |

FOREIGN PATENT DOCUMENTS

| | | | |
|---|---|---|---|
| JP | 10-221852 | A | 8/1998 |
| JP | 2002-072483 | A | 3/2002 |
| JP | 2004-158287 | A | 6/2004 |
| JP | 2006-259508 | A | 9/2006 |
| JP | 2007-216501 | A | 8/2007 |
| JP | 2007-329276 | A | 12/2007 |
| JP | 2008-050568 | A | 3/2008 |
| JP | 2008-142915 | A | 6/2008 |
| JP | 2008-162101 | A | 7/2008 |
| JP | 2008-241931 | A | 10/2008 |
| JP | 2009-048687 | A | 3/2009 |
| JP | 2009-129506 | A | 6/2009 |
| TW | I 253543 | | 4/2006 |
| WO | 2009/041551 | A1 | 4/2009 |

OTHER PUBLICATIONS

Extended European Search Report, dated May 8, 2013, issued by the European Patent Office in counterpart European Application No. 10792234.6.

Fosshaug, Hans et al: "Influence of writing strategy on CD control for the spatial-light-modulator-based Sigma7300 DUV laser pattern generator", Proceedings of SPIE, vol. 5376, May 14, 2004, pp. 879-894, XP055059319.

Wang, M et al: "Fluorine-contained photoacid generators (PAGs) and corresponding polymer resists", Journal of Fluorine Chemistry, Elsevier, NL, vol. 129, No. 7, Jul. 1, 2008, pp. 607-612, XP022834338.

Office Action dated Dec. 17, 2013, issued by the Japanese Patent Office in counterpart Japanese Application No. 2010-142062.

Office Action dated Jul. 4, 2014, issued by the Taiwan Patent Office, in counterpart Taiwanese Application No. 099120354.

International Search Report [PCT/ISA/210] issued in corresponding International application No. PCT/JP2010/061096 on Oct. 12, 2010.

Written Opinion of the International Searching Authority [PCT/ISA/237] issued in corresponding International application No. PCT/2010/061096 on Oct. 12, 2010.

Office Action dated Jun. 10, 2014 issued by the Japanese Patent Office in Application No. 2010-142062.

* cited by examiner

*Primary Examiner* — Lan Vinh

(74) *Attorney, Agent, or Firm* — Sughrue Mion, PLLC

(57) ABSTRACT

A chemical amplification resist composition that is used for preparation of a mold, and a mold preparation method and a resist film each using the composition are provided.

19 Claims, No Drawings

CHEMICAL AMPLIFICATION RESIST COMPOSITION, AND MOLD PREPARATION METHOD AND RESIST FILM USING THE SAME

TECHNICAL FIELD

The present invention relates to a chemical amplification resist composition, preferably a chemical amplification resist composition for electron beam, which is suitably usable for the preparation of a mold used in an imprint process. More specifically, the present invention relates to a resist composition suitable for the preparation of a mold (stamper) used in an information recording medium and nanoimprint.

BACKGROUND ART

A resist composition for electron beam has been heretofore widely studied on its application to the formation of a semiconductor fine pattern or the formation of a mask pattern for fine pattern projection, and recently, its application to a mold (sometimes referred to as a "stamper" or the like; hereinafter, in the context of the present invention, unless otherwise indicated, the "mold" and the "stamper" have the same meaning) used in an imprint process is also being studied.

As one application, for example, in JP-A-2004-158287 (the term "JP-A" as used herein means an "unexamined published Japanese patent application") and JP-A-2008-162101 where a mold structural body or stamper carrier having a concave-convex structure is used in the process of preparing an information recording medium, use of a resist composition in preparing the mold structural body or stamper itself is described. The information recording medium as used herein is a concept including a magnetic recording medium (e.g., hard disk), an optical disk, a magento-optical disk and the like.

Furthermore, a so-called nanoimprint technique is positioned as one of candidate techniques for the formation of a semiconductor microcircuit, particularly an ultrafine semiconductor circuit pattern in the line width generation of 22 nm or less, and also in this technique, studies are being made on the application of an electron beam resist to the preparation of a mold.

For example, in performing reactive ion etching on a substrate, a pattern formed of a resist composition is used as a mask, and the substrate surface is thereby selectively etched to prepare a mold having a concave-convex pattern.

Also, in preparing a mold by a procedure of (1) forming a concave-convex pattern on a substrate such as silicon (Si) substrate, which is disadvantageous in view of strength and life but is excellent in terms of processability such as reaction ion etching (RIE), to prepare a mold (sometimes referred to as a "master mold"), and (2) then transferring the pattern of the master mold to a substrate having higher durability, thereby preparing a plurality of practically endurable molds (sometimes referred to as a "replica mold"), a pattern formed of a resist composition for electron beam is utilized as the mask for RIE in (1).

As one example of this method, a method of preparing an Ni mold (replica mold) by electroformation using an Si mold as the master mold is disclosed in Science and New Technology in Nanoimprint, edited by Yoshihiko Hirai, Frontier Publishing, page 30 or 60.

Here, in the pattern formation by electron beam irradiation, correction of a so-called "proximity effect" is important. The proximity effect is a problem that electrons collided against a carrier are scattered in the proximity to cause formation of a latent image even in an unirradiated portion and a desired pattern cannot be obtained. In the application to the conventional formation of a semiconductor fine pattern, this effect at the pattern drawing by scanning in the x-y direction can be reduced to a certain extent by virtue of development of devices.

On the other hand, in the preparation of, for example, the above-described mold structural body or stamper carrier having a concave-convex structure, which is used in the preparation of an information recording medium, it is proposed in the documents above to perform the exposure by scanning an electron beam in the r-O direction on a discotic substrate. Scanning in the r-θ direction also requires to solve the problem of proximity effect not only from the device side but also from the resist material side.

Furthermore, also in the pattern drawing by scanning in, the x-y direction, the electron beam resist is required to be more enhanced in its performance so as to form an ultrafine pattern for nanoimprint. Because, in the application to the formation of a mask pattern for lithography, which is the main application of the conventional resist composition for electron beam, the formation of a final semiconductor circuit is performed by so-called reduction exposure and therefore, a mask pattern having an approximately double size compared with the pattern size, if it could be prepared, can be used in practice, whereas the nanoimprint process allows in principle only for pattern transfer at the same magnification and a pattern having a line width in the 20 nm order must be satisfactorily formed at the stamper preparation stage.

SUMMARY OF INVENTION

The present invention has been made by taking into consideration the above-described technical tasks and an object of the present invention is to provide a chemical amplification resist composition (preferably a chemical amplification resist composition for electron beam) suitable particularly for the preparation of a mold and capable of forming a pattern excellent not only in the sensitivity and resolution but also in the line width roughness (LWR) performance, and a mold preparation method and a resist film each using the composition.

The present invention has the following configurations.

<1> A chemical amplification resist composition that is used for preparation of a mold.

<2> The chemical amplification resist composition as described in <1> above, wherein the mold is a mold used for forming an information recording medium.

<3> The chemical amplification resist composition as described in <1> above, wherein the mold is a mold used for forming a semiconductor microcircuit.

<4> The chemical amplification resist composition as described in any one of <1> to <3> above, comprising:

(A) a resin capable of decomposing by an action of an acid to increase a solubility of the resin (A) in an alkali developer, wherein the resin (A) has a group represented by the following formula (I) or (II):

(I)

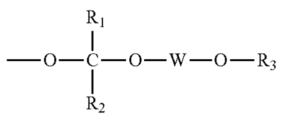

wherein each of $R_1$ and $R_2$ independently represents a hydrogen atom or an alkyl group;

W represents a divalent organic group; and $R_3$ represents an alkyl group, a cycloalkyl group, an aryl group or an aralkyl group:

(II)

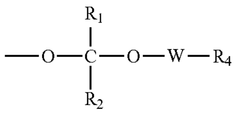

wherein $R_1$, $R_2$ and W have the same meanings as those in formula (I); and $R_4$ represents a cycloalkyl group or an aryl group.

<5> The chemical amplification resist composition as described in any one of <1> to <3> above, comprising:

(A) a resin capable of decomposing by an action of an acid to increase a solubility of the resin (A) in an alkali developer, wherein the resin (A) contains a repeating unit represented by the following formula (III):

(III)

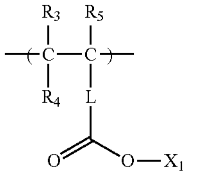

wherein each of $R_3$ to $R_5$ independently represents a hydrogen atom, a fluorine atom, a chlorine atom, a cyano group or an alkyl group;

$X_1$ represents a group capable of leaving by an action of an acid; and

L represents a single bond or a divalent linking group.

<6> The chemical amplification resist composition as described in <4>or <5> above, wherein the resin (A) further contains at least one repeating unit selected from the group consisting of the following formulae (IV) to (VD:

(IV)

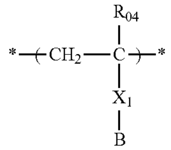

(V)

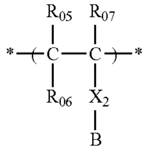

(VI)

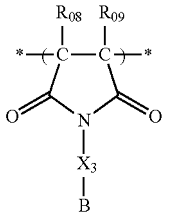

wherein each of $R_{04}$, $R_{05}$ and $R_{07}$ to $R_{09}$ independently represents a hydrogen atom, an alkyl group, a cycloalkyl group, a halogen atom, a cyano group or an alkoxycarbonyl group;

$R_{06}$ represents a cyano group, a carboxyl group, —CO—$OR_{25}$ or —CO—$N(R_{26})(R_{27})$, wherein $R_{26}$ and $R_{27}$ may combine with each other to form a ring together with the nitrogen atom;

each of $X_1$ to $X_3$ independently represents a single bond, an arylene group, an alkylene group, a cycloalkylene group, —O—, —$SO_2$—, —CO—, —COO—, —$N(R_{33})$— or a divalent linking group formed by combining a plurality of these groups;

$R_{25}$ represents an alkyl group, a cycloalkyl group, an alkenyl group, an aryl group or an aralkyl group;

each of $R_{26}$, $R_{27}$ and $R_{33}$ independently represents a hydrogen atom, an alkyl group, a cycloalkyl group, an alkenyl group, an aryl group or an aralkyl group; and B represents a structural moiety capable of decomposing upon irradiation with an actinic ray or radiation to produce an acid.

<7> The chemical amplification resist composition as described in any one of <1> to <6> above, comprising:

(B) a compound capable of generating an acid upon irradiation with an actinic ray or radiation, wherein the compound (B) contains a compound capable of generating an acid represented by the following formula (a):

(a)

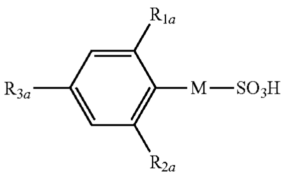

wherein each of $R_{1a}$, $R_{2a}$ and $R_{3a}$ independently represents an alkyl group or a cycloalkyl group; and M represents a single bond or a divalent linking group.

<8> A method for preparing a mold, comprising:

forming a pattern on a substrate by using the chemical amplification resist composition described in any one of <1> to <7> above; and performing an etching treatment by using the pattern as a mask.

<9> A resist film formed from the chemical amplification resist composition described in any one of <1> to <7> above.

Furthermore, the present invention preferably includes the following configurations.

<10> The chemical amplification resist composition as described in any one of <4>, <6> and <7> above, wherein the resin (A) has the group represented by formula (I), and $R_3$ represents an aryl group or an aralkyl group.

<11> The chemical amplification resist composition as described in any one of <6>, <7> and <10> above, wherein B in formulae (IV) to (VI) is a structure represented by the following formula (ZI') or (ZII'):

(ZI')

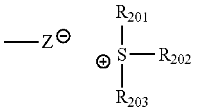

-continued (ZII')

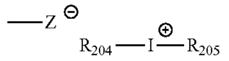

wherein each of $R_{201}$, $R_{202}$ and $R_{203}$ independently represents an organic group, two members out of $R_{201}$ to $R_{203}$ may combine with each other to form a ring structure, and the ring may contain an oxygen atom, a sulfur atom, an ester bond, an amide bond or a carbonyl group;

each of $R_{204}$ and $R_{205}$ independently represents an aryl group, an alkyl group or a cycloalkyl group; and $Z^-$ represents an acid anion that is generated by decomposition upon irradiation with an actinic ray or radiation.

<12> The chemical amplification resist composition as described in <11> above, wherein the acid anion $Z^-$ in formulae (ZI') and (ZII') is an acid anion corresponding to an aliphatic sulfonate anion substituted with a fluorine atom at the α-position, an aromatic sulfonate anion substituted with a fluorine atom or a fluorine atom-containing group, a bis(alkylsulfonyl)imide anion in which the alkyl group is substituted with a fluorine atom, or a tris(alkylsulfonyl)methide anion in which the alkyl group is substituted with a fluorine atom.

<13> The chemical amplification resist composition as described in any one of <1> to <5>, <7> and <10> above, comprising:

(B) a compound capable of generating an acid upon irradiation with an actinic ray or radiation, wherein a content of the compound (B) is from 3 to 30 mass % based on the entire solid content of the chemical amplification resist composition.

<14> The chemical amplification resist composition as described in <13>above, wherein the content of the compound (B) is from 5 to 25 mass % based on the entire solid content of the chemical amplification resist composition.

<15> The chemical amplification resist composition as described in any one of <1> to <7> and <10> to <14> above, comprising:

(C) an organic basic compound.

<16> The chemical amplification resist composition as described in <15> above, wherein the organic basic compound (C) is a compound having an onium hydroxide structure.

<17> The chemical amplification resist composition as described in <16> above, wherein the compound having an onium hydroxide structure is a tetraalkylammonium hydroxide.

DESCRIPTION OF EMBODIMENTS

The mode for carrying out the present invention is described in detail below.

Incidentally, in the present invention, when a group (atomic group) is denoted without specifying whether substituted or unsubstituted, the group includes both a group having no substituent and a group having a substituent. For example, an "alkyl group" includes not only an alkyl group having no substituent (unsubstituted alkyl group) but also an alkyl group having a substituent (substituted alkyl group).

Also, in the present invention, the term "actinic ray" or "radiation" indicates, for example, a bright line spectrum of a mercury lamp, a far ultraviolet ray typified by an excimer laser, an extreme-ultraviolet ray (EUV light), an X-ray or an electron beam. Furthermore, in the present invention, the "light" means an actinic ray or radiation. In the present invention, unless otherwise indicated, the "exposure" includes not only exposure to a mercury lamp, a far ultraviolet ray typified by excimer laser, an X-ray, EUV light or the like but also lithography with a particle beam such as electron beam and ion beam. In this connection, the composition of the present invention is effective particularly with electron beam irradiation, but its use with other actinic rays or radiation is not restricted.

The chemical amplification resist composition of the present invention is described below.

The composition of the present invention is a chemical amplification resist composition that is used for the preparation of a mold. The mold may be a mold used for the purpose of forming an information recording medium or a mold used for the purpose of forming a semiconductor microcircuit.

The composition of the present invention is preferably a positive resist composition, that is, a resist composition where the portion irradiated with an actinic ray such as electron beam is dissolved to thereby form an image.

For forming the positive image, the composition preferably contains (A) a resin capable of decomposing by the action of an acid to increase the solubility in an alkali developer (hereinafter sometimes referred to as a "resin (A)" or an "acid-decomposable resin").

The resin (A) is a resin capable of increasing the solubility in an alkali developer by the action of an acid, and this is a resin having a group capable of decomposing by the action of an acid to produce an alkali-soluble group (hereinafter sometimes referred to as "an acid-decomposable group"), in either one or both of the main and side chains of the resin.

Preferred examples of the alkali-soluble group include a phenolic hydroxyl group, a carboxyl group, a fluorinated alcohol group (preferably hexafluoroisopropanol), and a sulfonic acid group.

The acid-decomposable group is preferably a group where a hydrogen atom of the alkali-soluble group above is replaced by a group capable of leaving by the action of an acid.

Examples of the group capable of leaving by the action of an acid include $-C(R_{36})(R_{37})(R_{38})$, $-C(R_{36})(R_{37})(R_{39})$ and $-C(R_{01})(R_{02})(OR_{39})$.

In the formulae, each of $R_{36}$ to $R_{39}$ independently represents an alkyl group, a cycloalkyl group, an aryl group, an aralkyl group or an alkenyl group. $R_{36}$ and $R_{37}$ may combine with each other to form a ring.

Each of $R_{01}$ and $R_{02}$ independently represents a hydrogen atom, an alkyl group, a cycloalkyl group, an aryl group, an aralkyl group or an alkenyl group.

In the present invention, the resin (A) preferably contains a structure represented by the following formula (I) or (II). Such a group functions as the above-described acid-decomposable group.

(I)

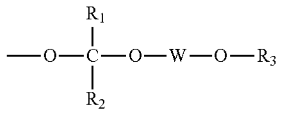

In formula (I), each of $R_1$ and $R_2$ independently represents a hydrogen atom or an alkyl group (preferably having a total carbon number of 1 to 4), W represents a divalent organic group, and $R_3$ represents an alkyl group (preferably having a total carbon number of 1 to 30, more preferably from 11 to 18), a cycloalkyl group (preferably having a total carbon number of 3 to 30, more preferably from 11 to 18), an aryl group (preferably having a total carbon number of 6 to 40, more preferably from 6 to 25), or an aralkyl group (preferably having a total carbon number of 7 to 40, more preferably from 12 to 25).

In formula (I), $R_3$ is preferably an aryl group or an aralkyl group.

In formula (I), the alkyl group of $R_1$ and $R_2$ may be linear or branched, and examples thereof include an alkyl group having a carbon number of 1 to 4, such as methyl group, ethyl group, n-propyl group, isopropyl group, n-butyl group, isobutyl group, sec-butyl group and tert-butyl group.

The divalent linking group of W is preferably an alkylene group, a cycloalkylene group, an arylene group, a heteroarylene group, an aralkylene group, —O—, —S—, —C(═O)—, —N($R_4$)—, —SO—, —$SO_2$— or a divalent group formed by combining two or more of these groups. $R_4$ is a hydrogen atom or an alkyl group (specific examples of the alkyl group are the same as those for $R_1$ above).

The alkylene group of W may be linear or branched and is preferably an alkylene having a carbon number of 1 to 10, and examples thereof include a methylene group, an ethylene group, a propylene group, a tetramethylene group, a 1,2-butylene group, a 1,3-butylene group, a 2,3-butylene group, a pentamethylene group and a hexamethylene group.

The cycloalkylene group of W is preferably a cycloalkylene group having a carbon number of 6 to 20, and examples thereof include a 1,2-cyclopentylene group, a 1,3-cyclopentylene group, a 1,2-cyclohexylene group, a 1,3-cyclohexylene group, a 1,4-cyclohexylene group, a 1,2-cycloheptylene group, a 1,3-cycloheptylene group, a 1,4-cycloheptylene group, a norbornylene group and an adamantylene group.

The arylene group of W is preferably an arylene group having a carbon number of 6 to 10, and examples thereof include a 1,2-phenylene group, a 1,3-phenylene group, a 1,4-phenylene group, a 2,3-tolylene group, a 2,4-tolylene group, a 2,5-tolylene group and a 1,4-naphthylene group.

The heteroarylene group of W is preferably a heteroarylene group having a carbon number of 5 to 9, and examples thereof include pyridinediyl and thiophenediyl.

The aralkylene group of W is preferably an aralkylene group having a carbon number of 7 to 13, and examples thereof include an o-xylylene group, an m-xylylene group and a p-xylylene group.

W is preferably an alkylene group, more preferably a linear alkylene group having a carbon number of 1 to 6.

The alkyl group of $R_3$ may be a linear or branched, and examples thereof include a methyl group, an ethyl group, a propyl group, an isopropyl group, a n-butyl group, an i-butyl group, a sec-butyl group, a tert-butyl group, a pentyl group, a neopentyl group, an n-hexyl group, an i-hexyl group, an n-heptyl group, an i-heptyl group, an n-octyl group, an i-octyl group, an n-nonyl group, an i-nonyl group, an n-decyl group, an i-decyl group, an n-undecyl group, an i-undecyl group, an n-dodecyl group, an i-dodecyl group, an n-tridecyl group, an i-tridecyl group, an n-tetradecyl group, an i-tetradecyl group, an n-pentadecyl group, an i-pentadecyl group, an n-hexadecyl group, an i-hexadecyl group, an n-heptadecyl group, an i-heptadecyl group, an n-octadecyl group, an i-octadecyl group, and n-nonadecyl group, and an i-nonadecyl group.

Examples of the cycloalkyl group of $R_3$ include a cyclopropyl group, a cyclobutyl group, a cyclopentyl group, a cyclohexyl group, a cycloheptyl group, a cyclooctyl group, a cyclononyl group, a cyclodecyl group, a cycloundecyl group, a cyclodecyl group, a cyclotridecyl group, a cyclotetra decyl group, a cyclopentadecyl group, a cyclohexyldecyl group, a cycloheptadecyl group, a cyclooctadecyl group, a cyclonoadecyl group, a 4-cyclohexylcyclohexyl group, a 4-n-hexylcyclohexyl group, a pentanylcyclohexyl group, a hexyloxycyclohexyl group and a pentanyloxycyclohexyl group.

Examples of the aryl group of $R_3$ include a phenyl group, a xylyl group, a toluyl group, a cumenyl group, a naphthyl group, an anthracenyl group, a 4-cyclopentylphenyl group, a 4-cyclohexylphenyl group, a 4-cyclohexylphenyl group, a 4-cyclooctanylphenyl group, a 2-cyclopentylphenyl group, a 2cyclohexylphenyl group, 2-cycloheptenylphenyl group, a 2-cyclooctanylphenyl group, 3-cyclopentylphenyl group, a 3-cyclohexylphenyl group, a 3-cycloheptenylphenyl group, a 3-cyclooctanylphenyl group, a 4-cyclopentyloxyphenyl group, a 4-cyclohexyloxyphenyl group, a 4-cycloheptenyloxyphenyl group, a 4-cyclooctanyloxyphenyl group, a 2-cyclopentylphenyl group, a 2-cyclohexyloxyphenyl group, a 2-cycloheptenyloxyphenyl group, a 2-cyclooctanyloxyphenyl group, a 3-cyclopentyloxyphenyl group, a 3-cyclohexyloxyphenyl group, a 3-cycloheptenyloxyphenyl group, a 3-cyclooctanloxyphenyl group, a 4-n-pentylphenyl group, a 4-n-hexylphenyl group, a 4-n-heptenylphenyl group, a 4-n-octanylphenyl group, a 2-n-pentylphenyl group, 2-n-hexylphenyl group, a 2-n-heptenylphenyl group, a 2-n-octanylphenyl group, a 3-n-pentylphenyl, group, a 3-n-hexylphenyl group, a 3-n-heptenylphenyl group, a 3-n-octanylphenyl group, a 2,6-di-isopropylphenyl group, 2,3-di-isopropylphenyl group, a 2,4-di-isopropylphenyl group, a 3,4-di-isopropylphenyl group, a 3,6-di-tert-butylphenyl group, a 2,3-di-tert-butylphenyl group, a 2,4-di-tert-butylphenyl group, a 3,4-di-tert-butylphenyl group, a 2,6-di-n-butylphenyl group, a 2,3-di-n-butylphenyl group, a 2,4-di-n-butylphenyl group, a 3,4-di-n-butylphenyl group, a 2,6-di-i-butylphenyl group, a 2,3-di-i-butylphenyl group, a 2,4-di-i-butylphenyl group, a 3,4-di-i-butylphenyl group, a 2,6-di-tert-amylphenyl group, a 2,3-di-tert-amylphenyl group, a 2,4-di-tert-amylphenyl group, a 3,4-di-tert-amylphenyl group, a 2,6-di-i-amylphenyl group, a 2,3-di-i-amylphenyl group, a 2,4-di-i-amylphenyl group, a 3,4-di-i-amylphenyl group, a 2,6-di-n-pentylphenyl group, a 2,3-di-n-pentylphenyl group, a 2,4-di-n-pentylphenyl group, a 3,4-di-n-pentylphenyl group, a 4-adamantylphenyl group, a 2-adamantylphenyl group, a 4-isoboronoylphenyl group, a 3-isoboronylphenyl group, a 2-isoboronylphenyl group, a 4-cyclopentyloxyphenyl group, a 4-cyclohexyloxyphenyl group, a 4-cycloheptenyloxyphenyl group, a 4-cyclooctanylphenyl group, a 2-cyclopentyloxyphenyl group, a 2-cyclohexyloxyphenyl group, a 2-cycloheptenyloxyphenyl group, a 2-cyclootanyloxyphenyl group, a 3-cyclopentyloxyphenyl group, a 3-cyclohexyloxyphenyl group, a 3-cycloheptenyloxyphenyl group, a 3-cyclooctanyloxyphenyl group, a 4-n-pentyloxyphenyl group, a 4-n-hexyloxyphenyl group, a 4-n-heptenyloxyphenyl group, a 4-n-octanyloxyphenyl group, a 2-n-pentyloxyphenyl group, a 2-n-hexyloxyphenyl group, a 2-n-heptenyloxyphenyl group, a 2-n-octanyloxyphenyl group, a 3-n-pentyloxyphenyl group, a 3-n-hexyloxyphenyl group, a 3-n-heptenyloxyphenyl group, a 3-n-octanyloxyphenyl group, a 2,6-di-isopropyloxyphenyl group, a 2,3-di-isopropylphenyl group, a 2,4-di-isopropyloxyphenyl group, a 3,4-di-isopropyloxyphenyl group, a 2,6-di-tert-butyloxyphenyl group, a 2,3-di-tert-butyloxyphenyl group, a 2,4-di-tert-butyloxyphenyl group, a 3,4-di-tert-butyloxyphenyl group, a 2,6-di-n-butyloxyphenyl group, a 2,3-di-n-butyloxyphenyl group, a 2,4-di-n-butyloxyphenyl group, a 3,4-di-n-butyloxyphenyl group, a 2,6-di-i-butyloxyphenyl group, a 2,3-di-i-butyloxyphenyl group, a 2,4-di-i-butyloxyphenyl group, a 3,4-di-i-butyloxyphenyl group, a 2,6-di-tert-amyloxyphenyl group, a 2,3-di-tert-amyloxyphenyl group, a 2,4-di-tert-amyloxyphenyl group, a 3,4-di-tert-amyloxyphenyl group, a 2,6-di-i-amyloxyphenyl group, a 2,3-di-i-amyloxyphenyl group, a 2,4-di-i-amyloxyphenyl group, a 3,4-di-i-amyloxyphenyl group, a 2,6-di-n-pentyloxyphenyl group, a 2,3-di-n-pentyloxyphenyl group, a 2,4-di-n-pentyloxyphenyl group, a 3,4-di-n-pentyloxyphenyl group, a 4-adamantyloxyphenyl group, a 3-adamantyloxyphenyl group, a 2-adamantyloxyphenyl group, a 4-isoboronyloxyphenyl group, a 3-isoboronyloxyphenyl group and a 2-isoboronyloxyphenyl group. Each of these groups may be further substituted within the above-described range, and the substituent is not limited to the substituents other than those described above.

Examples of the aralkyl group of $R_3$ include a benzyl group, a diphenylmethyl group, an a-methylbenzyl group, an a-dimethylbenzyl group, an $\alpha$-trifluoromethylbenzyl group, a 1,2-diphenyl-2-propyl group, a 1-phenyl-1-propyl group, a 2,2-dimethyl-1-phenyl-1-propyl group, a 1-phenyl-1-butyl group, an $\alpha$-cyclopropylbenzyl group, a cyclopropyldiphenylmethyl group, a phenylethyl group, an $\alpha$-methyl-phenylethyl group, a $\beta$-methyl-phenylethyl group, a 3-phenylpropyl group, a phenylbutyl group, a cinnamyl group, a naphthylmethyl group, a fluorenyl group, a fluorenylmethyl group, a 1,2,3,4-tetrahydronaphthyl group, an indanyl group, an acenaphthyl group, an anthracenemethyl group, a pyrenemethyl group, a 4-cyclopentylphenylethyl group, a 4-cyclohexylphenylethyl group, a 4-cycloheptenylphenylethyl group, a 4-cyclooctanylphenylethyl group, a 2-cyclopentylphenylethyl group, a 2-cyclohexylphenylethyl group, 2-cycloheptenylphenylethyl group, a 2-cyclooctanylphenylethyl group, a 3-cyclopentylphenylethyl group, a 3-cyclohexylphenylethyl group, a 3-cycloheptenylphenylethyl group, a 3-cyclooctanylphenylethyl group, a 4-cyclopentyloxyphenylethyl group, a 4-cyclohexyloxyphenylethyl group, a 4-cycloheptenyloxyphenylethyl group, a 4-cyclooctanyloxyphenylethyl group, a 2-cyclopentyloxyphenylethyl group, a 2-cyclohexyloxyphenylethyl group, a 2-cycloheptenyloxyphenylethyl group, a 2-cyclooctanyloxyphenylethyl group, a 3-cyclopentyloxyphenyl ethyl group, a 3-cyclohexyloxyphenylethyl group, a 3-cycloheptenyloxyphenylethyl group, a 3-cyclooctanyloxyphenylethyl group, a 4-n-phenylphenylethyl group, a 4-n-hexylphenylethyl group, a 4-n-heptenylphenylethyl group, a 4-n-octanylphenylethyl group, a 2-n-pentylphenylethyl group, a 2-n-hexylphenylethyl group, a 2-n-heptenylphenylethyl group, a 2-n-octanylphenylethyl group, a 3-n-pentylphenylethyl group, a 3-n-hexylphenylethyl group, a 3-n-heptenylphenylethyl group, a 3-n-octanylphenylethyl group, a 2,6-di-isopropylphenylethyl group, a 2,3-di-isopropylphenylethyl group, a 2,4-di-isopropylphenylethyl group, a 3,4-di-isopropylphenylethyl group, a 2,6-di-tert-butylphenylethyl group, a 2,3-di-tert-butylphenylethyl group, a 2,4-di-tert-butylphenylethyl group, a 3,4-di-tert-butylphenylethyl group, a 2,6-di-n-butylphenylethyl group, a 2,3-di-n-butylphenylethyl group, a 2,4-di-n-butylphenylethyl group, a 3,4-di-n-butylphenylethyl group, a 2,6-di-i-butylphenylethyl group, a 2,3-di-i-butylphenylethyl group, a 2,4-di-i-butylphenylethyl group, a 3,4-di-i-butylphenylethyl group, a 2,6-di-tert-amylphenylethyl group, a 2,3-di-tert-amylphenylethyl group, a 2,4-di-tert-amylphenylethyl group, a 3,4-di-tert-amylphenylethyl group, a 2,6-di-i-amylphenylethyl group, a 2,3-di-i-amylphenylethyl group, a 2,4-di-i-amylphenylethyl group, a 3,4-di-i-amylphenylethyl group, a 2,6-di-n-pentylphenylethyl group, a 2,3-di-n-pentylphenylethyl group, a 2,4-di-n-pentylphenylethyl group, a 3,4-di-n-pentylphenylethyl group, a 4-adamantylphenylethyl group, a 3-adamantylphenylethyl group, a 2-adamantylphenylethyl group, a 4-isoboronylphenylethyl group, a 3-isoboronylphenylethyl group, a 2-isoboronylphenylethyl group, a 4-cyclopentyloxyphenylethyl group, a 4-cyclohexyloxyphenylethyl group, a 4-cycloheptenyloxyphenylethyl group, a 4-cyclooctanyloxyphenylethyl group, a 2-cyclopentyloxyphenylethyl group, a 2-cyclohexyloxyphenylethyl group, a 2-cycloheptenyloxyphenylethyl group, a 2-cyclooctanyloxyphenylethyl group, a 3-cyclopentyloxyphenylethyl group, a 3-cyclohexyloxyphenylethyl group, a 3-cycloheptenyloxyphenylethyl group, a 3-cyclooctanyloxyphenylethyl group, a 4-n-pentyloxyphenylethyl group, a 4-n-hexyloxyphenylethyl group, a 4-n-heptenyloxyphenyl group, a 4-n-octanyloxyphenylethyl group, a 2-n-pentyloxyphenylethyl group, a 2-n-hexyloxyphenylethyl group, a 2-n-heptenyloxyphenylethyl group, a 2-n-octanyloxyphenylethyl group, a 3-n-pentyloxyphenylethyl group, a 3-n-hexyloxyphenylethyl group, a 3-n-heptenyloxyphenylethyl group, a 3-n-octanyloxyphenylethyl group, a 2,6-di-isopropyloxyphenylethyl group, a 2,3-di-isopropyloxyphenylethyl group, a 2,4-di-isopropyloxyphenylethyl group, a 3,4-di-isopropyloxyphenylethyl group, a 2,6-di-tert-butyloxyphenylethyl group, a 2,3-di-tert-butyloxyphenylethyl group, a 2,4-di-tert-butyloxyphenylethyl group, a 3,4-di-tert-butyloxyphenylethyl group, a 2,6-di-n-butyloxyphenylethyl group, a 2,3-di-n-butyloxyphenylethyl group, a 2,4-di-n-butyloxyphenylethyl group, a 3,4-di-n-butyloxyphenylethyl group, a 2,6-di-i-butyloxyphenyl ethyl group, a 2,3-di-i-butyloxyphenylethyl group, a 2,4-di-i-butyloxyphenylethyl group, a 3,4-di-i-butyloxyphenylethyl group, a 2,6-di-tert-amyloxyphenylethyl group, a 2,3-di-tert-amyloxyphenylethyl group, a 2,4-di-tert-amyloxyphenylethyl group, a 3,4-di-tert-amyloxyphenylethyl group, a 2,6-di-i-amyloxyphenylethyl group, a 2,3-di-i-amyloxyphenylethyl group, a 2,4-di-i-amyloxyphenylethyl group, a 3,4-di-i-amyloxyphenylethyl 2,6-di-n-pentyloxyphenylethyl group, a 2,3-di-n-pentyloxyphenylethyl group, a 2,4-di-n-pentyloxyphenylethyl group, a 3,4-di-n-pentyloxyphenylethyl group, a 4-adamantyloxyphenylethyl group, a 3-adamantyloxyphenylethyl group, a 2-adamantyloxyphenylethyl group, a 4-isoboronyloxyphenylethyl group, a 3-isoboronyloxyphenylethyl group, a 2-isoboronyloxyphenylethyl group.

The alkyl group of $R_1$, $R_2$, $R_3$ and $R_4$ and the alkylene group of W may further have a substituent, and examples of the further substituent include a hydroxyl group, a halogen atom (e.g., fluorine, chlorine, bromine, iodine), a nitro group, a cyano group, a cycloalkyl group such as cyclopropyl group, cyclobutyl group, cyclopentyl group and cyclohexyl group, an alkoxy group such as methoxy group, ethoxy group, hydroxyethoxy group, propoxy group, hydroxypropoxy group, n-butoxy group, isobutoxy group, sec-butoxy group, tert-butoxy group, cyclopentyloxy group and cyclohexyloxy group, an alkoxycarbonyl group such as methoxycarbonyl group and ethoxycarbonyl group, an aralkyl group such as benzyl group, phenethyl group and cumyl group, an aralkyloxy group, an acyl group such as formyl group, acetyl group, butyryl group, benzoyl group, cyanamyl group and valeryl group, an acyloxy group such as butyryloxy group, an alkenyl group such as vinyl group, propenyl group, allyl group and butenyl group, an alkenyloxy group such as vinyloxy group, propenyloxy group, allyloxy group and butenyloxy group, an aryl group such as phenyl group, xylyl group, toluyl group, cumenyl group, naphthyl group and anthracenyl group, an aryloxy group such as phenoxy group, and an aryloxycarbonyl group such as benzoyloxy group.

The cycloalkylene group, arylene group, heteroarylene group and aralkylene group of W and the cycloalkyl group, aryl group and aralkyl group of $R_3$ may further have a substituent, and examples of the further substituent include an alkyl group such as methyl group, ethyl group, propyl group, n-butyl group, sec-butyl group and tert-butyl group, and the above-described groups as the substituent which the alkyl group of $R_1$, $R_2$, $R_3$ and $R_4$ and the alkylene group of W may further have.

$R_3$ is preferably an aryl group or an aralkyl group.

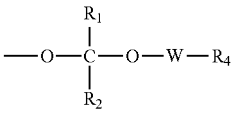

(II)

In formula (II), the definitions, specific examples and preferred examples of $R_1$, $R_2$ and W are the same as those in formula (I), and $R_4$ represents a cycloalkyl group or an aryl group.

The cycloalkyl group of $R_4$ may be monocyclic or polycyclic but is preferably a monocyclic cycloalkyl group. The cycloalkyl group of $R_4$ preferably has a carbon number of 3 to 12, more preferably from 5 to 8, and specific examples thereof include a cyclopropyl group, a cyclobutyl group, a cyclopentyl group, a cyclohexyl group, a cycloheptyl group, a cyclooctyl group, a cyclononyl group, a cyclodecyl group, a cycloundecyl group and a cyclododecyl group.

The aryl group of $R_4$ preferably has a carbon number of 6 to 40, more preferably from 6 to 11, and specific examples thereof include a phenyl group, a xylyl group, a toluyl group, a cumenyl group, a naphthyl group and an anthracenyl group.

The cycloalkyl group and aryl group of $R_4$ may further have a substituent, and specific examples of the further substituent are the same as specific examples of the substituent which the cycloalkylene group, arylene group, heteroarylene group and aralkylene group of W in formula (I) and the cycloalkyl group, aryl group and aralkyl group of $R_3$ may further have.

Specific examples of the structure represented by formula (I) or (II) are set forth below, but the present invention is not limited thereto.

1

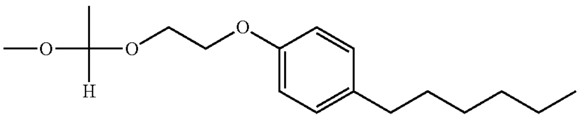

2

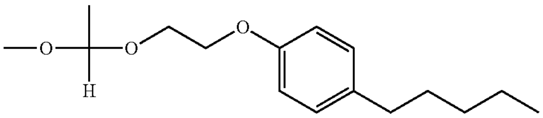

3

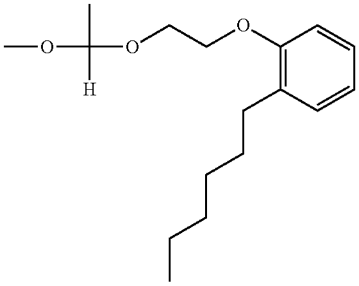

-continued

4

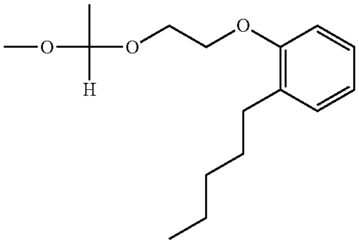

5

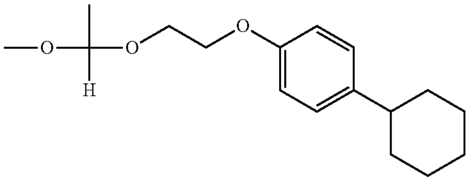

6

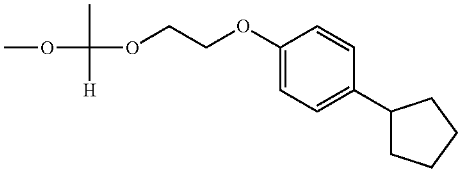

7

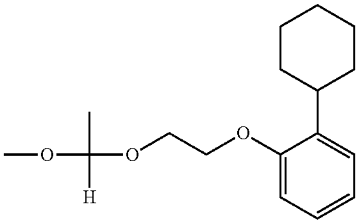

8

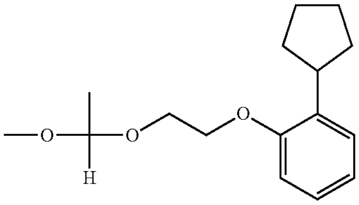

9

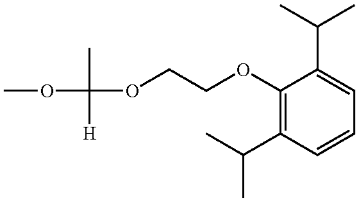

10

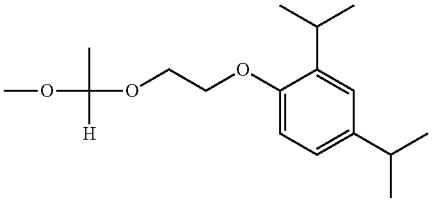

-continued
11
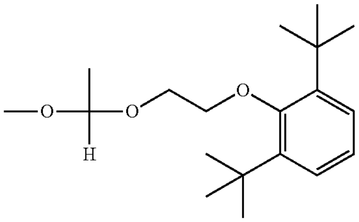
12
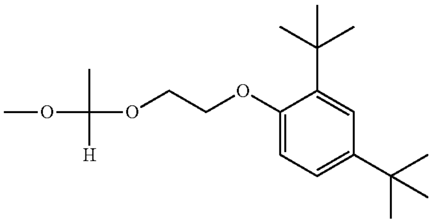
13
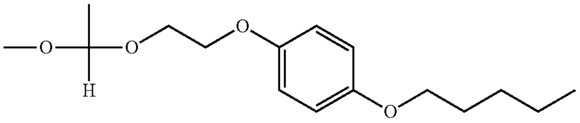
14
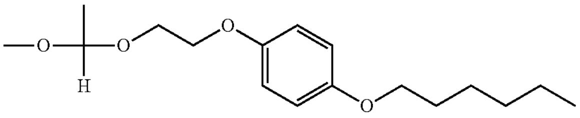
15
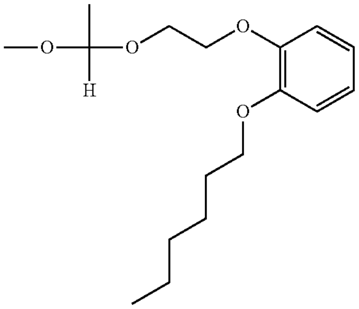
16
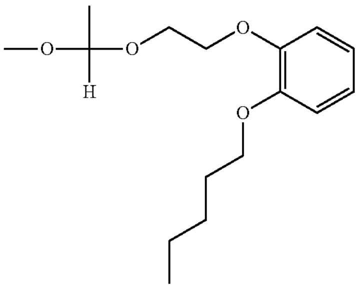
17
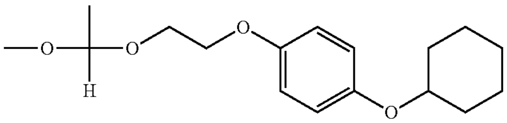
-continued
18
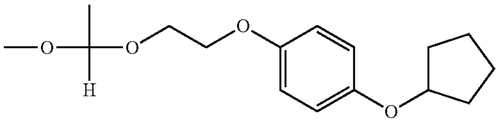
19
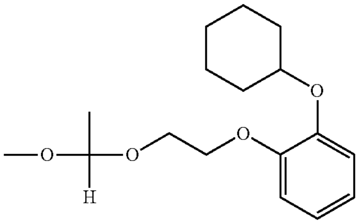
20
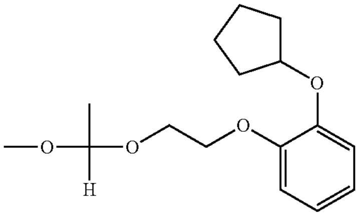
21
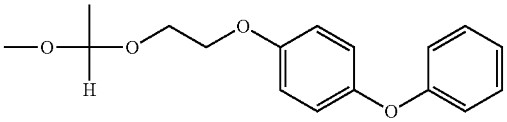
22
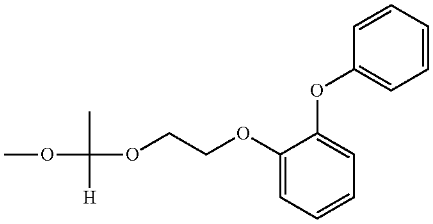
23
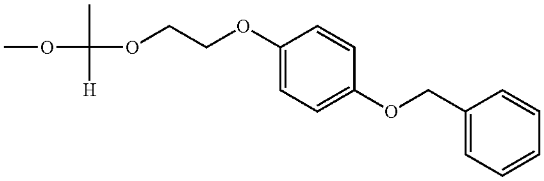
24
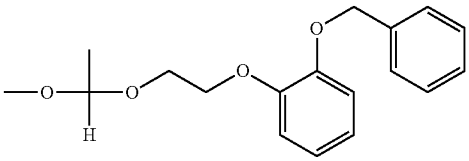
25
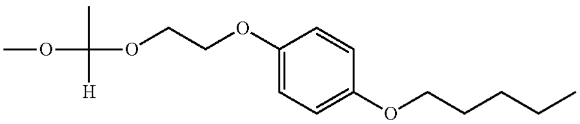

-continued
26
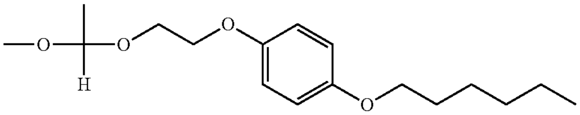
27
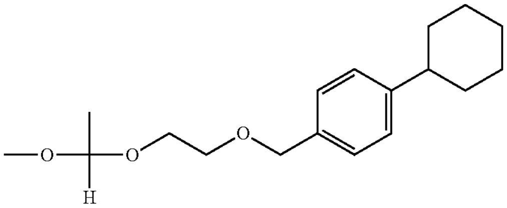
28
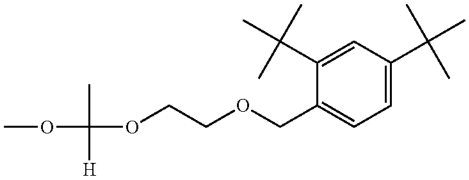
29
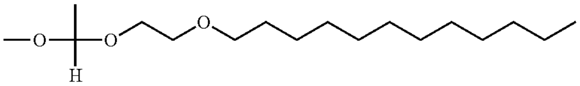
30
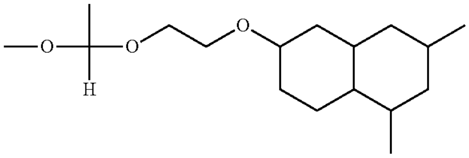
31
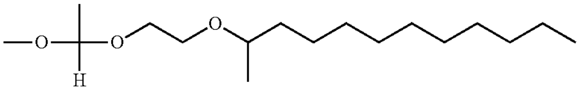
32
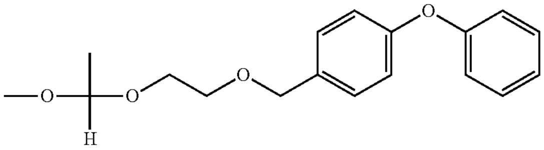
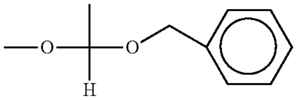
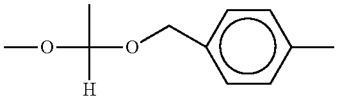
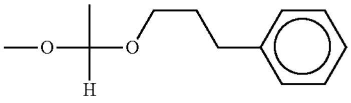
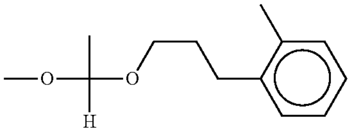
-continued
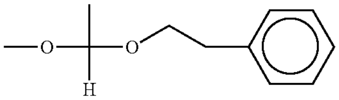
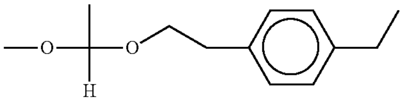
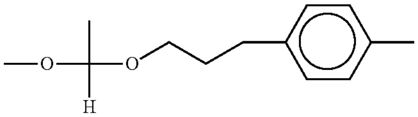
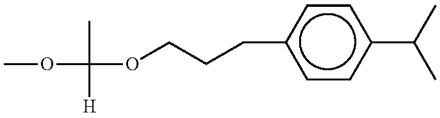
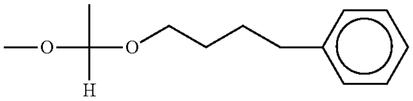
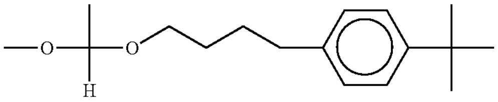
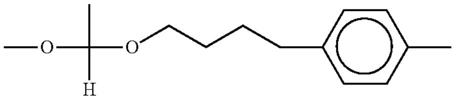
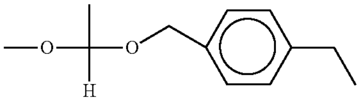
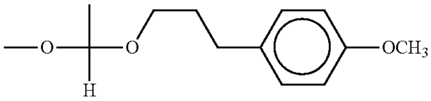
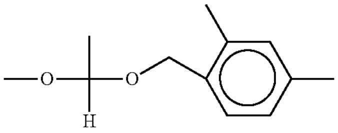
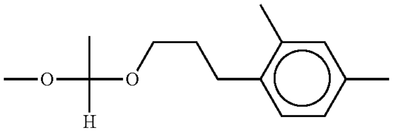
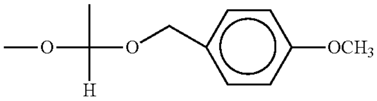
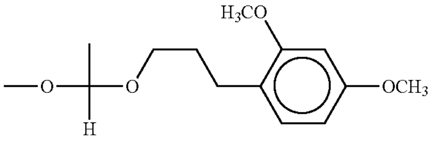
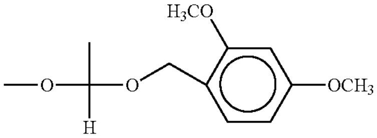
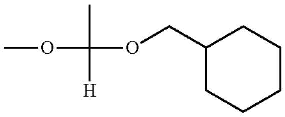

-continued

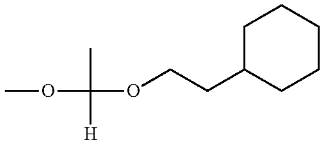

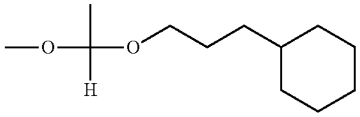

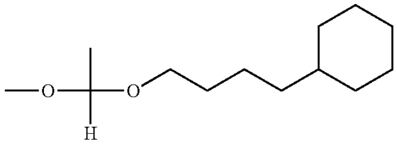

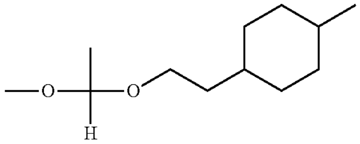

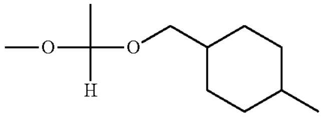

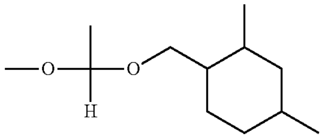

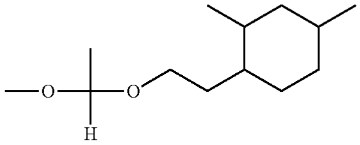

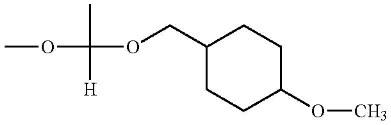

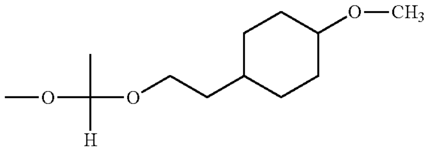

Furthermore, a resin containing a structure represented by the following formula (II') is also preferred as the resin (A).

(II')

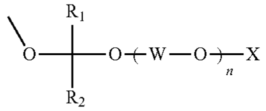

In formula (II'), the definitions, specific examples and preferred examples of $R_1$, $R_2$ and W are the same as those in formula (I).

X represents an organic group and is (c) a residue structure of H—O—X where —O—X exhibits an ionization potential value smaller than the ionization potential value (IP value) of phenol.

n represents an integer of 1 to 4. When n is an integer of 2 to 4, each W may be the same as or different from every other W.

The IP value as used herein indicates a value calculated by molecular orbital computation using MOPAC.

The molecular orbital computation using MOPAC is a computation by the technique described in James J. P. Stewart, Journal of Computer-Aided Molecular Design, Vol. 4, No. 1, pp. 1-105 (1990).

The molecular orbital computation can be performed by using, for example, CAChe software from Oxford Molecular Co.

Here, the parameter used in this computation is preferably a PM3 parameter.

The Ip value of phenol as calculated by this computation is 9.175 eV, and the Ip value of the compound having an Ip value smaller than the Ip value of phenol, from which the residue structure (c) is derived, is preferably less than 9.0, more preferably 8.8 or less, still more preferably 8.5 or less.

The lower limit is not particularly limited but is preferably 2 or more, more preferably 3 or more, still more preferably 4 or more.

In the present invention, the residue structure of a compound having an Ip value smaller than that of phenol means a group obtained by removing one hydrogen atom from the compound having the Ip value.

In formula (II'), X is preferably a structure represented by formula (II"):

-L-Y (II")

In formula (II"), L represents a single bond or an alkylene group, and Y represents a group selected from the following formulae (Y-1) to (Y-7):

(Y-1)

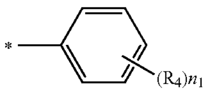

(Y-2)

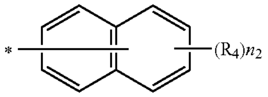

(Y-3)

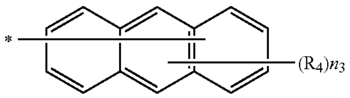

(Y-4)

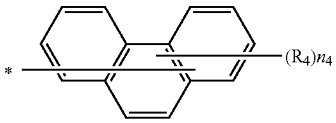

(Y-5)

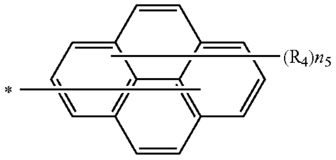

(Y-6)

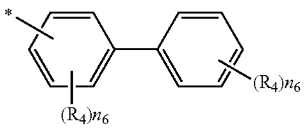

-continued (Y-7)

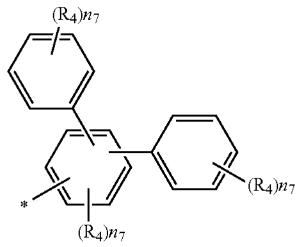

In the formulae, each $R_4$ independently represents an alkyl group or an alkoxy group.

n1 represents an integer of 0 to 3, n2 represents an integer of 0 to 7, n3 represents an integer of 0 to 9, n4 represents an integer of 0 to 9, n5 represents an integer of 0 to 9, n6 represents an integer of 0 to 3, and n7 represents an integer of 0 to 3.

* represents a bonding site to L.

Formula (II") and formulae (Y-1) to (Y-7) are described in detail below.

The alkylene group as L includes a group represented by the following formula:

$$—[C(Rf)(Rg)]_r-$$

wherein each of Rf and Rg independently represents a hydrogen atom, an alkyl group or an alkoxy group, and when r is 2 or more, each Rf or Rg may be the same as or different from every other Rf or Rg.

The alkyl group is preferably an alkyl group having a carbon number of 1 to 4, such as methyl group, ethyl group, propyl group, isopropyl group and butyl group, and is more preferably selected from a methyl group, an ethyl group, a propyl group and an isopropyl group.

The alkoxy group includes an alkoxy group having a carbon number of 1 to 4, such as methoxy group, ethoxy group, propoxy group and butoxy group.

r represents an integer of 1 to 10 and is preferably an integer of 1 to 3.

The alkyl group as $R_4$ may be linear or branched and is preferably an alkyl group having a carbon number of 1 to 6, and examples thereof include a methyl group, an ethyl group, a propyl group, a butyl group, a pentyl group and a hexyl group.

The alkoxy group as $R_4$ is preferably an alkoxy group having a carbon number of 1 to 4, and examples thereof include a methoxy group, an ethoxy group, a propoxy group and a butoxy group, with a methoxy group being preferred.

Each of n1 to n7 is preferably an integer of 0 to 2, more preferably 0 or 1.

The alkyl group and alkoxy group as Rf, Rg and $R_4$ may further have a substituent, and examples of the further substituent include a halogen atom, an alkoxy group, an alkoxycarbonyl group, an acyl group and acyloxy group. The carbon number thereof is preferably 10 or less.

The structure represented by formula (I), (II) or (II') is preferably introduced into the resin in the form of substituting for a phenolic hydroxyl group of an alkali-soluble resin having a phenolic hydroxyl group.

The alkali-soluble resin having a phenolic hydroxyl group is preferably a homopolymer of an o-, m- or p-hydroxystyrene (these are collectively referred to as a "hydroxystyrene") or an o-, m- or p-hydroxy-α-methylstyrene (these are collectively referred to as a "hydroxy-α-methylstyrene"), a copolymer containing at least 30 mol %, preferably 50 mol % or more, of a repeating unit corresponding to the hydroxystyrene or hydroxy-α-methylstyrene, or a resin where the benzene nucleus of the unit above is partially hydrogenated, more preferably a p-hydroxystyrene homopolymer. As for the monomer other than the hydroxystyrene and hydroxy-α-methylstyrene, which is used for preparing the copolymer above by copolymerization, acrylic acid esters, methacrylic acid esters, acrylamides, methacrylamides, acrylonitrile, methacrylonitrile, maleic anhydride, styrene, α-methylstyrene, acetoxystyrene and alkoxystyrenes are preferred, and styrene, acetoxystyrene and tert-butoxy styrene are more preferred.

In the present invention, the content of the repeating unit having a structure represented by formula (I), (II) or (II') in the resin is preferably from 5 to 50 mol %, more preferably from 5 to 35 mol %, based on all repeating units.

Incidentally, when the resin (A) contains a structure represented by formula (I), (II) or (II'), the resin may have an acid-decomposable group different from the structure.

The resin containing a group represented by formula (I), (II) or (II') can be obtained by synthesizing a corresponding vinyl ether and reacting it with a phenolic hydroxyl group-containing alkali-soluble resin dissolved in an appropriate solvent such as tetrahydrofuran, by a known method. The reaction is usually preformed in the presence of an acidic catalyst, preferably an acidic ion exchange resin, hydrochloric acid, p-toluenesulfonic acid, or a salt such as pyridinium tosylate. The corresponding vinyl ether can be synthesized from an active raw material such as chloroethyl vinyl ether by a method such as a nucleophilic substitution reaction.

As a preferred embodiment when the resin (A) contains an acid-decomposable group different from the structure of formula (I), (II) or (II'), a resin containing a repeating unit represented by the following formula (III) is also suitably used.

(III)

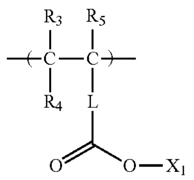

In formula (III), each of $R_3$ to $R_5$ independently represents a hydrogen atom, a halogen atom, a cyano group or an alkyl group, $X_1$ represents a group capable of leaving by the action of an acid, and L represents a single bond or a divalent linking group.

The alkyl group of $R_3$ to $R_5$ includes an alkyl group having a carbon number of 1 to 6 and is preferably a methyl group.

The halogen atom of $R_3$ to $R_5$ is preferably a fluorine atom or a chlorine atom.

The group capable of leaving by the action of an acid of $X_1$ includes, for example, $—C(R_{11a})(R_{12a})(R_{13a})$.

Each of $R_{11a}$ to $R_{13a}$ independently represents a hydrogen atom, an alkyl group, a cycloalkyl group, an alkenyl group, an aralkyl group or an aryl group, provided that two or more of $R_{11a}$ to $R_{13a}$ are not a hydrogen atom at the same time.

The alkyl group of $R_{11a}$ to $R_{13a}$ is preferably an alkyl group having a carbon number of 1 to 12, and examples thereof include a methyl group, an ethyl group, a propyl group, an n-butyl group, a sec-butyl group and a tert-butyl group.

The cycloalkyl group of $R_{11a}$ to $R_{13a}$ is preferably a cycloalkyl group having a carbon number of 3 to 12, and examples thereof include a cyclopropyl group, a cyclobutyl group, a cyclopentyl group, a cyclohexyl group, a cycloheptyl group, an adamantyl group and a diamantyl group.

The alkenyl group of $R_{11a}$ to $R_{13a}$ is preferably an alkenyl group having a carbon number of 2 to 12, and examples thereof include a vinyl group, a propenyl group, an allyl group and a butenyl group.

The aralkyl group of $R_{11a}$ to $R_{13a}$ is preferably an aralkyl group having a carbon number of 7 to 20, and examples thereof include a benzyl group, a phenethyl group and a cumyl group.

The aryl group of $R_{11a}$ to $R_{13a}$ is preferably an aryl group having a carbon number of 6 to 20, and examples thereof include a phenyl group, a xylyl group, a toluyl group, a cumenyl group, a naphthyl group and an anthracenyl group.

The carbon number of $R_{11a}$ to $R_{13a}$ is preferably from 1 to 10. Incidentally, two members out of $R_{11a}$, $R_{12a}$ and $R_{13a}$ may combine with each other to form a ring. The carbon number of this ring is preferably from 4 to 12, more preferably from 5 to 8, and most preferably 5 or 6. Specific examples of such an embodiment include a case where $R_{11a}$ is an ethyl group and $R_{12a}$ and $R_{13a}$ are combined to form a cyclopentane ring, and a case where $R_{11a}$ is a methyl group and $R_{12a}$ and $R_{13a}$ are combined to form a cyclohexane ring. These configurations have a relatively high reactivity and can contribute to elevation of the sensitivity of the composition.

Examples of the divalent linking group represented by L include an alkylene group, an arylene group, an aralkylene group, —COO-L'-, —O-L'-, and a group formed by combining two or more of these groups. L' represents an alkylene group, a cycloalkylene group, an arylene group or an aralkylene group, and specific examples thereof are the same as those described for the alkylene group, cycloalkylene group, arylene group and aralkylene group of W in formula (I).

L is preferably a single bond, a group represented by —COO-L'- (L is preferably an alkylene group having a carbon number of 1 to 5, more preferably a methylene group or a propylene group), or an arylene group.

In the present invention, the content of the repeating unit represented by formula (III) in the resin is preferably from 5 to 60 mol %, more preferably from 5 to 40 mol %, based on all repeating units.

Specific examples of the repeating unit represented by formula (III) are set forth below, but the present invention is not limited thereto.

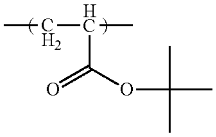
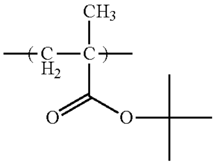
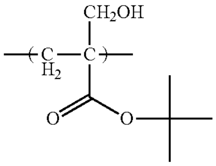
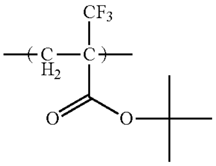
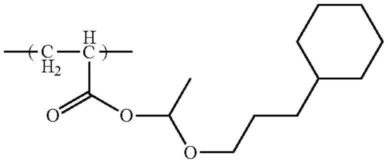

-continued

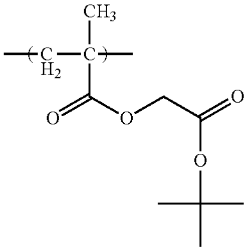
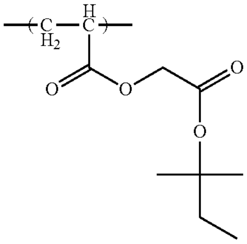
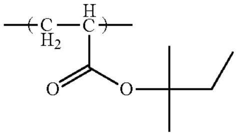
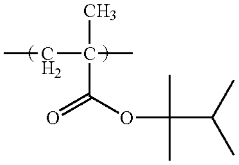
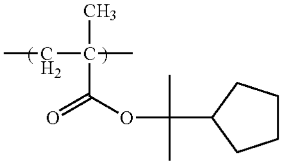
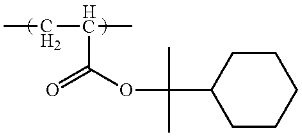
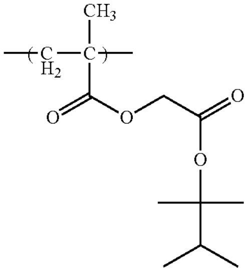
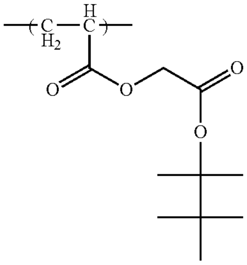
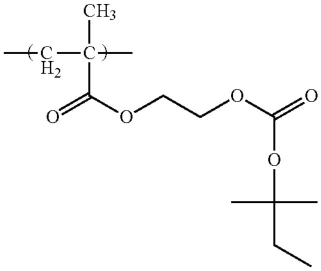
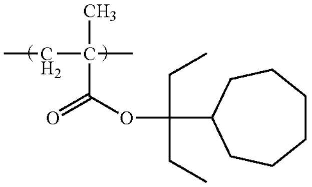
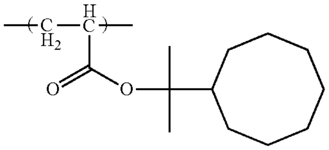

-continued
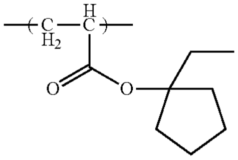
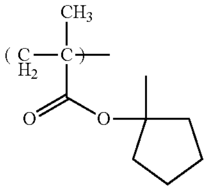
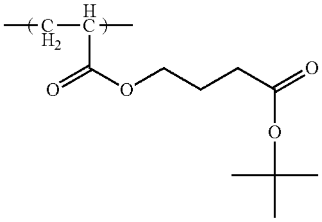
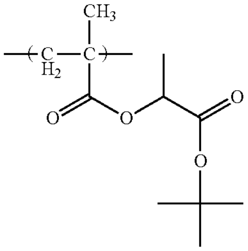
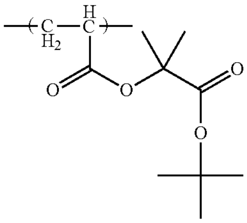
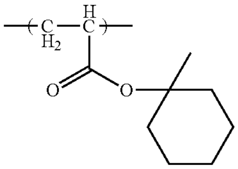
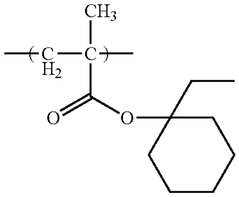
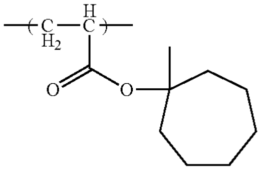
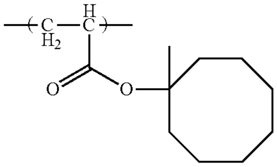
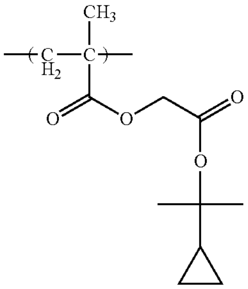
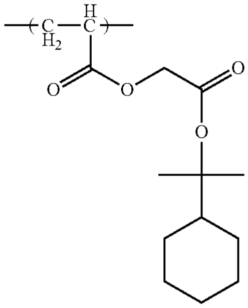
-continued
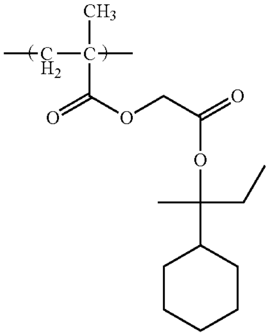
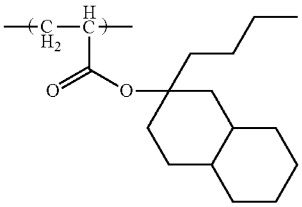
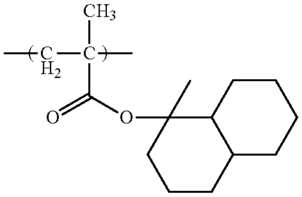
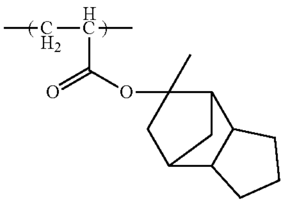
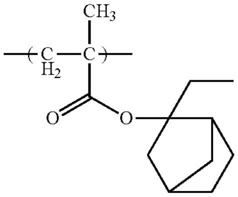
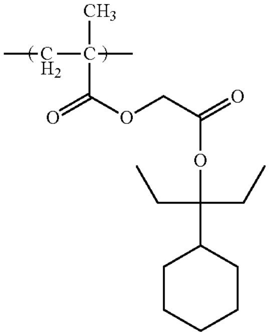
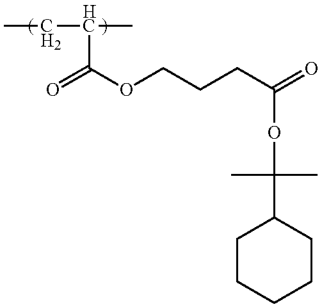

-continued
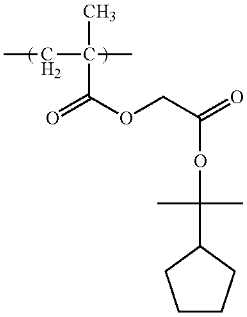
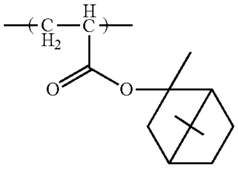
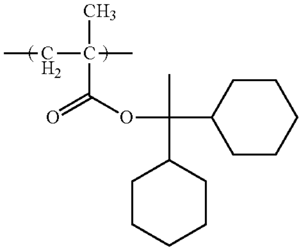
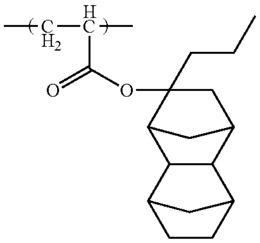
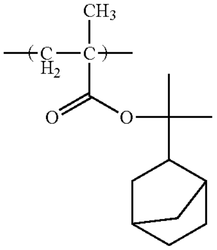
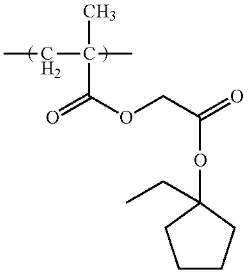
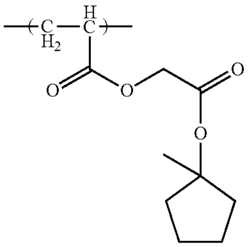
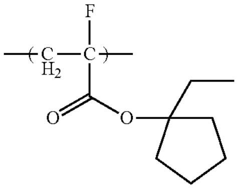
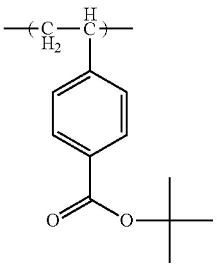
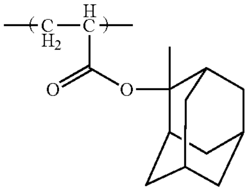
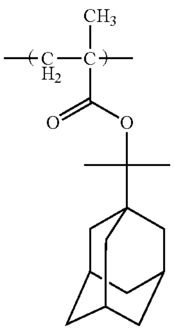
-continued
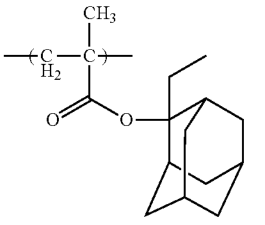
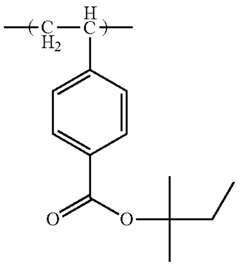
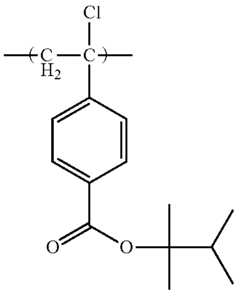
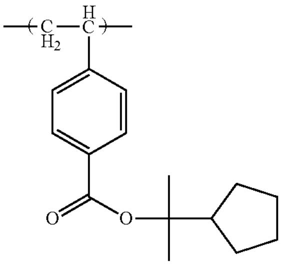
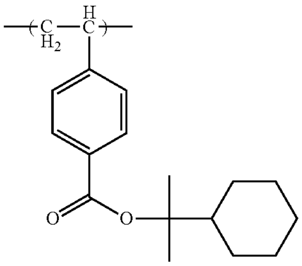
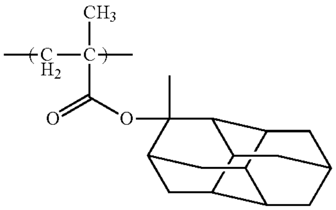
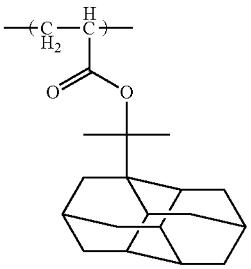
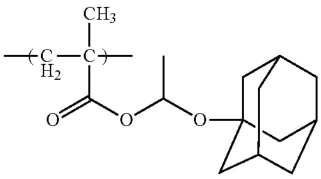

-continued
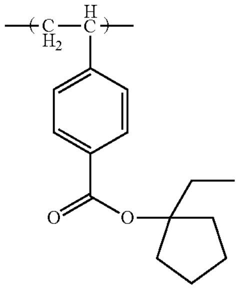
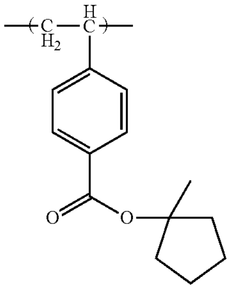
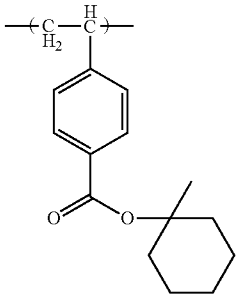
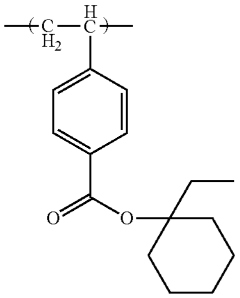
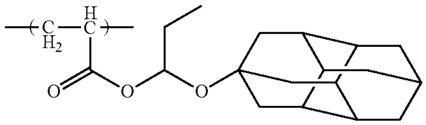
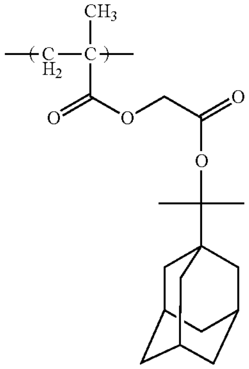
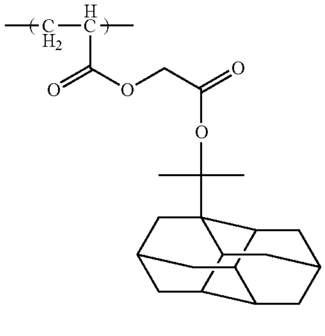
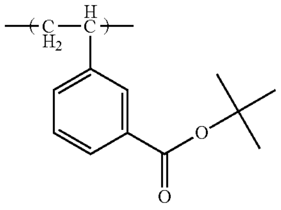
-continued
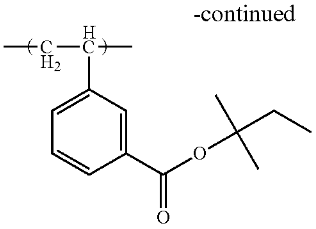
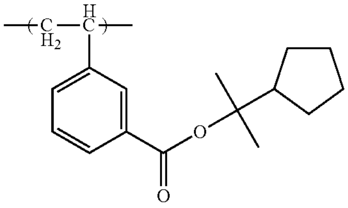
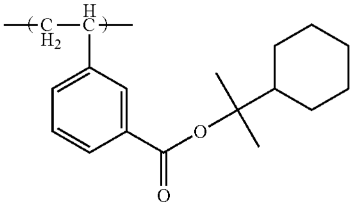
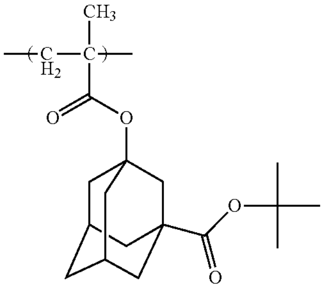
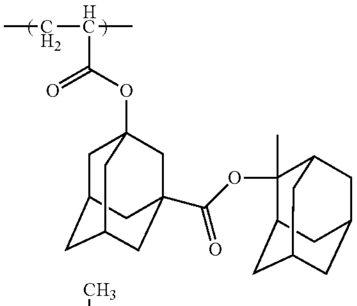
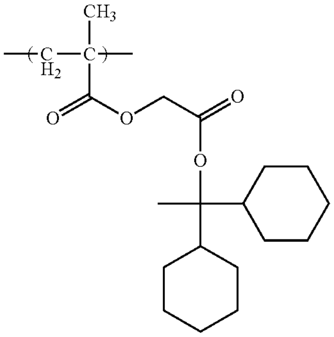
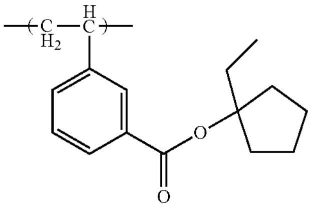

-continued
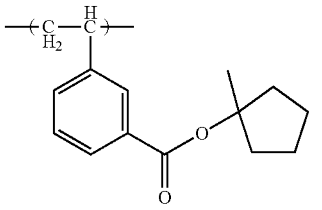
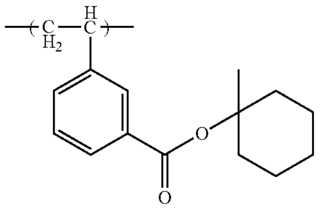
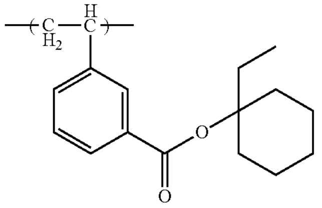
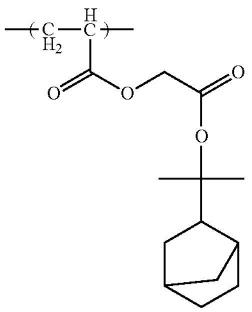
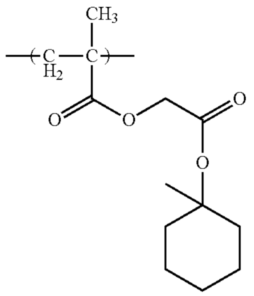
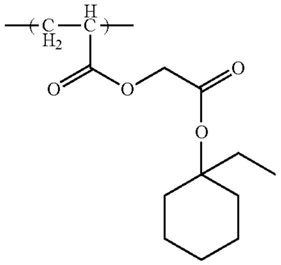
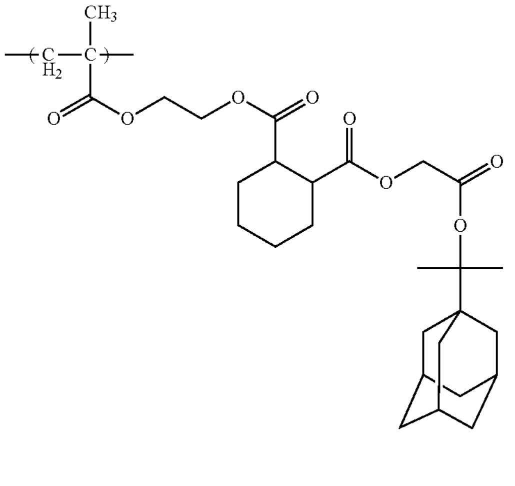
-continued
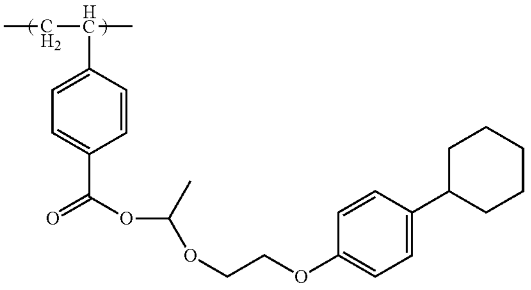
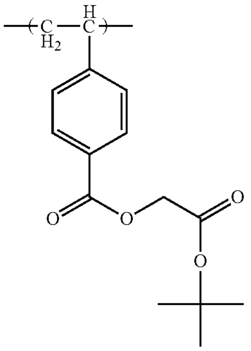
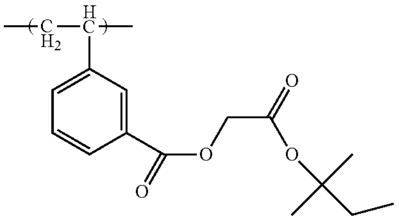
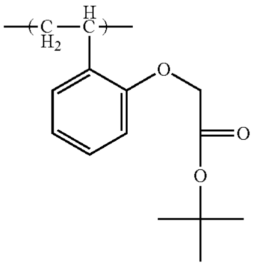
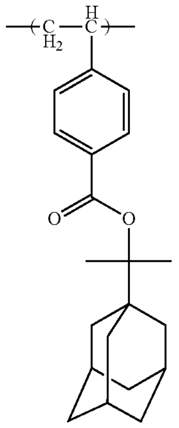
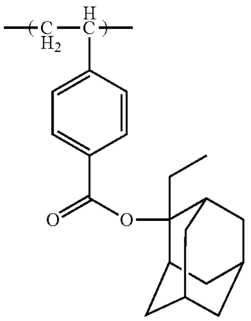
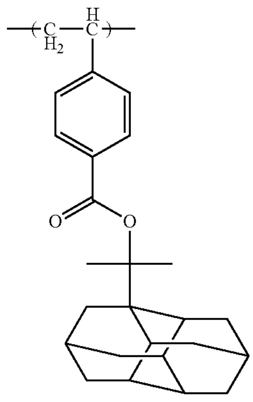

-continued
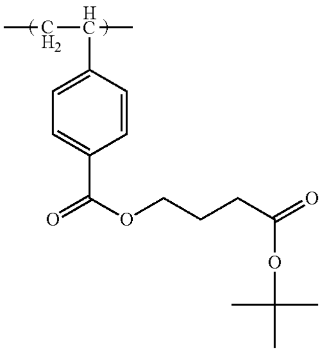
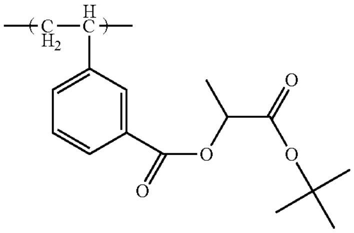
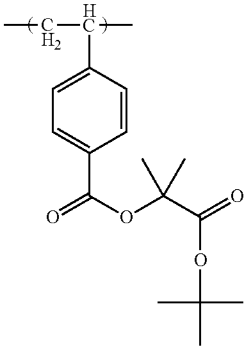
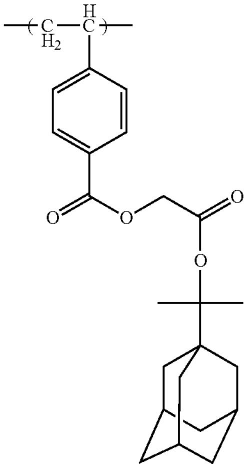
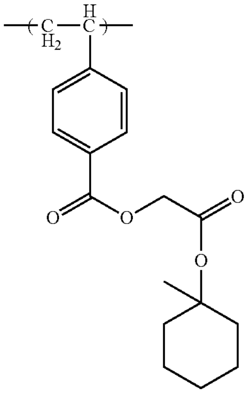
-continued
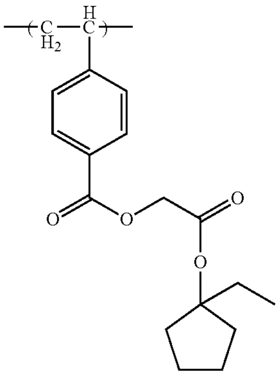
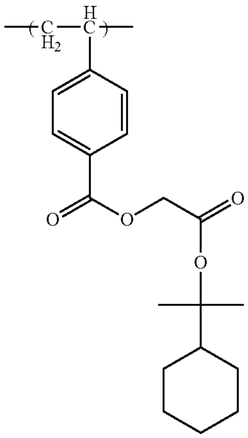
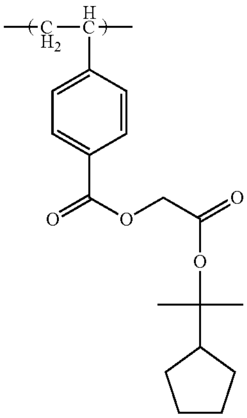
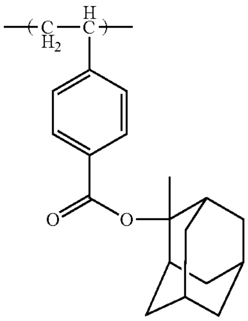
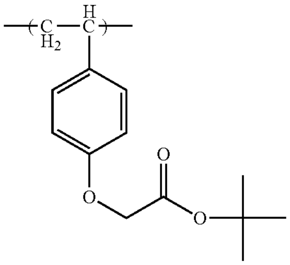
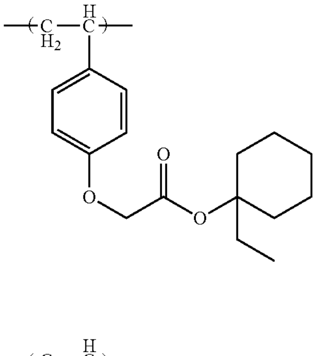
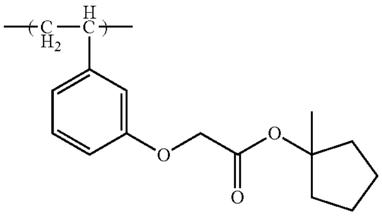

-continued

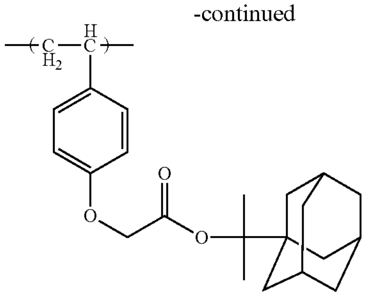

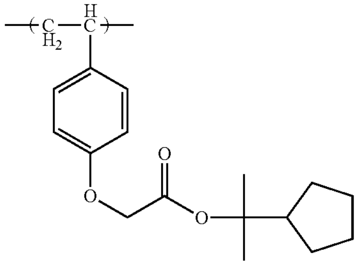

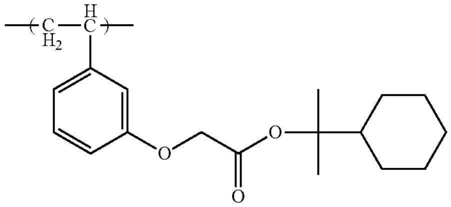

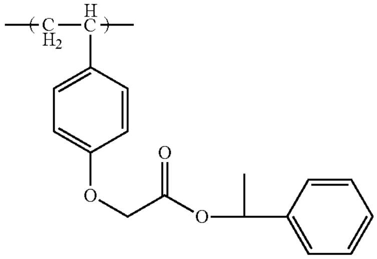

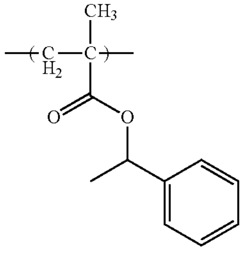

The resin (A) preferably contains a repeating unit represented by the following formula (X):

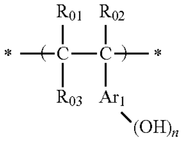

(X)

wherein each of $R_{01}$, $R_{02}$ and $R_{03}$ independently represents a hydrogen atom, an alkyl group, a cycloalkyl group, a halogen atom, a cyano group or an alkoxycarbonyl group, or $R_{03}$ may represent an alkylene group and combine with Ar, to form a 5- or 6-membered ring, $Ar_1$ represents an aromatic ring group, and n represents an integer of 1 to 4.

The alkyl group of $R_{01}$ to $R_{03}$ in formula (X) may have a substituent and is preferably an alkyl group having a carbon number of 20 or less, which may have a substituent, such as methyl group, ethyl group, propyl group, isopropyl group, n-butyl group, sec-butyl group, hexyl group, 2-ethylhexyl group, octyl group and dodecyl group, more preferably an alkyl group having a carbon number of 8 or less.

As for the alkyl group contained in the alkoxycarbonyl group of $R_{01}$ to $R_{03}$, the same as those for the alkyl group in $R_{01}$ to $R_{03}$ are preferred.

The cycloalkyl group of $R_{01}$ to $R_{01}$ includes a cycloalkyl group which may be either monocyclic or polycyclic and may have a substituent. A monocyclic cycloalkyl group having a carbon number of 3 to 8, which may have a substituent, such as cyclopropyl group, cyclopentyl group and cyclohexyl group, is preferred.

The halogen atom includes a fluorine atom, a chlorine atom, a bromine atom and an iodine atom and is preferably a fluorine atom.

In the case where $R_{03}$ represents an alkylene group, the alkylene group is preferably an alkylene group having a carbon number of 1 to 8, such as methylene group, ethylene group, propylene group, butylene group, hexylene group and octylene group.

The aromatic ring group of Ar, is preferably an aromatic ring group having a carbon number of 6 to 14, and specific examples thereof include a benzene ring, a toluene ring and a naphthalene ring.

$Ar_1$ may further have a substituent other than a hydroxyl group, and examples of the further substituent include a halogen atom, an alkyl group, a cycloalkyl group, an aryl group, an alkenyl group, an aralkyl group, an alkoxy group, an alkylcarbonyloxy group, an alkylsulfonyloxy group, an alkyloxycarbonyl group and an aryloxycarbonyl group.

The further substituent is preferably a linear or branched alkyl group having a carbon number of 1 to 8, a cycloalkyl group having a carbon number of 5 to 10, an aryl group having a carbon number of 6 to 15, an alkenyl group having a carbon number of 1 to 8, an aralkyl group having a carbon number of 7 to 16, an alkoxy group having a carbon number of 1 to 8, an alkylcarbonyloxy group having a carbon number of 1 to 8, an alkylsulfonyloxy group having a carbon number of 1 to 8, an alkyloxycarbonyl group having a carbon number of 1 to 8, or an aryloxycarbonyl group having a carbon number of 7 to 16.

$Ar_1$ may have a plurality of the further substituents above and in this case, the plurality of further substituents may combine with each other to form a ring.

Specific examples of the repeating unit represented by formula (X) are set forth below, but the present invention is not limited thereto.

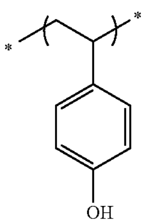

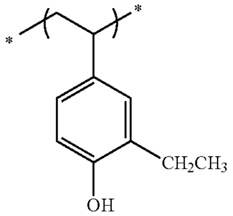

-continued

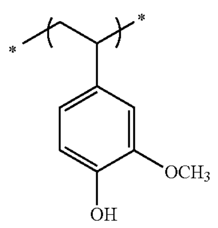

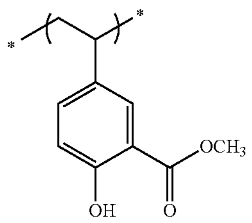

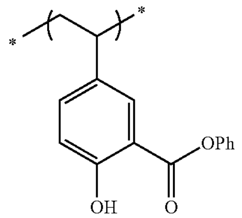

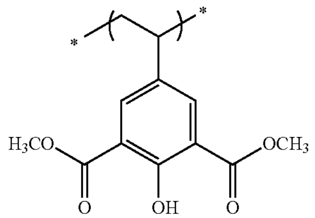

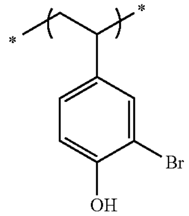

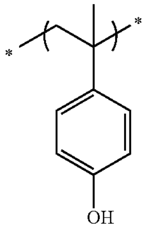

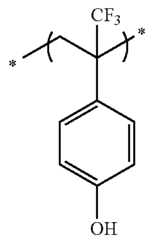

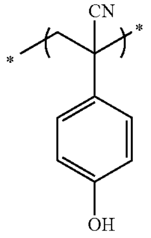

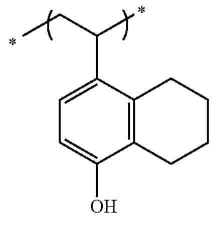

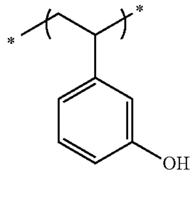

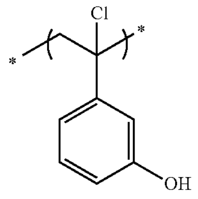

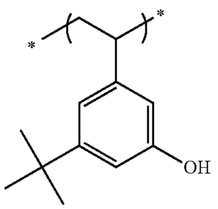

-continued

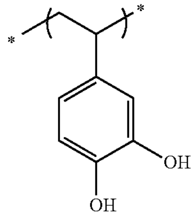

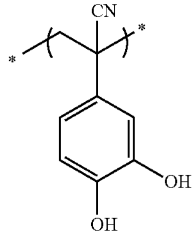

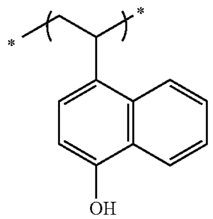

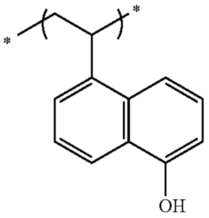

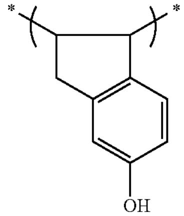

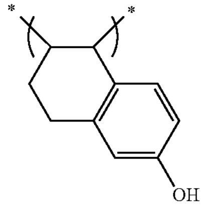

In the present invention, the content of the repeating unit represented by formula (X) in the resin (A) is preferably from 3 to 90 mol %, more preferably from 15 to 85 mol %, still more preferably from 30 to 80 mol %, based on all repeating units.

Incidentally, the resin (A) may appropriately contain a repeating unit having a structure different from the above-described structures. Preferred examples of such a repeating unit include a repeating unit stable to the action of an acid and a repeating unit having a lactone structure, which are described below.

More specifically, the repeating unit stable to the action of an acid includes a repeating unit represented by the following formula (CIII). By virtue of having this structure, adjustment of the contrast and enhancement of the etching resistance can be expected.

(CIII)

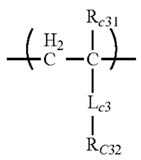

In formula (CIII), $R_{c31}$ represents a hydrogen atom, an alkyl group which may be substituted with fluorine, a cyano group or a —$CH_2$—O—$Rac_2$ group, wherein $Rac_2$ represents a hydrogen atom, an alkyl group or an acyl group. $R_{c31}$ is preferably a hydrogen atom, a methyl group, a hydroxymethyl group or a trifluoromethyl group, more preferably a hydrogen atom or a methyl group.

$R_{c32}$ represents a group having a hydrocarbon group, and this group may be substituted with an alkyl group, a cycloalkyl group, an alkenyl group, a cycloalkenyl group, an alkoxycarbonyl group, an alkylcarbonyloxy group, a silicon atom-containing group, a halogen atom (preferably a fluorine atom) or the like.

$L_{c3}$ represents a single bond or a divalent linking group.

Examples of $R_{c32}$ include an alkyl group, a cycloalkyl group, an alkenyl group, a cycloalkenyl group, an aryl group and an aralkyl group.

The alkyl group of $R_{c32}$ is preferably a linear or branched alkyl group having a carbon number of 3 to 20.

The cycloalkyl group of $R_{c32}$ is preferably a cycloalkyl group having a carbon number of 3 to 20.

The alkenyl group of $R_{c32}$ is preferably an alkenyl group having a carbon number of 3 to 20.

The cycloalkenyl group of $R_{c32}$ is preferably a cycloalkenyl group having a carbon number of 3 to 20.

The aryl group of $R_{c32}$ is preferably an aryl group having a carbon number of 6 to 20, more preferably a phenyl group or a naphthyl group, and each of these groups may have a substituent.

The aralkyl group of $R_{c32}$ is preferably an aralkyl group having a carbon number of 7 to 20.

$R_{c32}$ is preferably an unsubstituted alkyl group or a fluorine atom-substituted alkyl group.

The divalent linking group of $L_{c3}$ is preferably an alkylene group (preferably having a carbon number of 1 to 5), an oxy group, a phenylene group or an ester bond (a group represented by —COO—).

The repeating unit (CIII) is preferably a repeating unit represented by the following formula (CIII-1) or (CIII-2):

(CIII-1)

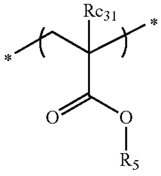

In formula (CIII-1), $R_5$ represents a hydrocarbon group, and $R_{c31}$ has the same meaning as $R_{c31}$ in formula (CIII).

The hydrocarbon group of $R_5$ preferably has a cyclic structure therein. In the case of having a cyclic structure, specific examples of the hydrocarbon group include a monocyclic or polycyclic cycloalkyl group (preferably having a carbon number of 3 to 12, more preferably from 3 to 7), a monocyclic or polycyclic cycloalkenyl group (preferably having a carbon number of 3 to 12), an aryl group (preferably having a carbon number of 6 to 20, more preferably from 6 to 12), and an aralkyl group (preferably having a carbon number of 7 to 20, more preferably from 7 to 12).

The cycloalkyl group includes a ring gathered hydrocarbon group and a crosslinked cyclic hydrocarbon group. Examples of the crosslinked cyclic hydrocarbon ring include a bicyclic hydrocarbon ring, a tricyclic hydrocarbon ring and a tetracyclic hydrocarbon ring. The crosslinked cyclic hydrocarbon ring also includes a condensed ring formed by condensing, for example, a plurality of 5- to 8-membered cycloalkane rings.

Preferred examples of the crosslinked cyclic hydrocarbon ring include a norbornyl group, an adamantyl group, a bicyclooctanyl group and a tricyclo[5,2,1,$0^{2,6}$]decanyl group. Of these crosslinked cyclic hydrocarbon rings, a norbornyl group and an adamantyl group are preferred.

Preferred examples of the aryl group include a phenyl group, a naphthyl group and a biphenyl group, and preferred examples of the aralkyl group include a phenylmethyl group, a phenylethyl group and a naphthylmethyl group.

Such a hydrocarbon group may have a substituent, and preferred examples of the substituent include a halogen atom, an alkyl group, a hydroxyl group with the hydrogen atom being replaced, and an amino group with the hydrogen atom being replaced. The halogen atom is preferably bromine atom, chlorine atom or fluorine atom, and the alkyl group is preferably a methyl group, an ethyl group, a butyl group or a tert-butyl group. This alkyl group may further have a substituent, and the substituent which the alkyl group may further have includes a halogen atom, an alkyl group, a hydroxyl group with the hydrogen atom being replaced, and an amino group with the hydrogen atom being replaced.

Examples of the substituent for the hydrogen atom include an alkyl group, a cycloalkyl group, an aralkyl group, a substituted methyl group, a substituted ethyl group, an alkoxycarbonyl group and an aralkyloxycarbonyl group. The alkyl group is preferably an alkyl group having a carbon number of 1 to 4, the substituted methyl group is preferably a methoxymethyl group, a methoxythiomethyl group, a benzyloxymethyl group, a tert-butoxymethyl group or a 2-methoxyethoxymethyl group, the substituted ethyl group is preferably a 1-ethoxyethyl group or a 1-methyl-1-methoxyethyl group, the acyl group is preferably an aliphatic acyl group having a carbon number of 1 to 6, such as formyl group, acetyl group, propionyl group, butyryl group, isobutyryl group, valeryl group and pivaloyl group, and the alkoxycarbonyl group is preferably an alkoxycarbonyl group having a carbon number of 1 to 4.

(CIII-2)

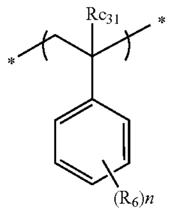

In formula (CIII-2), $R_{c31}$ has the same meaning as $R_{c31}$ in formula (CIII).

$R_6$ represents a halogen atom, an alkyl group, a cycloalkyl group, an alkenyl group, a cycloalkenyl group, an alkoxycarbonyl group or an alkylcarbonyloxy group. Each of these groups may be further substituted with a fluorine atom or a silicon atom.

The alkyl group of $R_6$ is preferably a linear or branched alkyl group having a carbon number of 1 to 20.

The cycloalkyl group of $R_6$ is preferably a cycloalkyl group having a carbon number of 3 to 20.

The alkenyl group of $R_6$ is preferably an alkenyl group having a carbon number of 3 to 20.

The cycloalkenyl group of $R_6$ is preferably a cycloalkenyl group having a carbon number of 3 to 20.

The alkoxycarbonyl group of $R_6$ is preferably an alkoxycarbonyl group having a carbon number of 2 to 20.

The alkylcarbonyloxy group of $R_6$ is preferably an alkylcarbonyloxy group having a carbon number of 2 to 20.

n represents an integer of 0 to 5. When n is an integer of 2 or more, each $R_6$ may be the same as or different from every other $R_6$.

$R_6$ is preferably an unsubstituted alkyl group or an alkyl group substituted with a fluorine atom, more preferably a trifluoromethyl group or a tert-butyl group.

The resin (A) may or may not contain the repeating unit represented by formula (CIII) and in the case of containing the repeating unit, the content thereof is preferably from 1 to 40 mol %, more preferably from 1 to 20 mol %, based on all repeating units in the resin (A).
Specific examples of the repeating unit represented by formula (CIII) are set forth below, but the present invention is not limited thereto. In the formulae, Ra represents H, $CH_3$, $CH_2OH$ or $CF_3$.
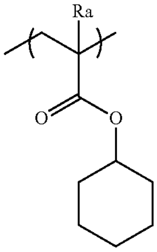
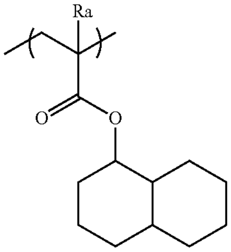
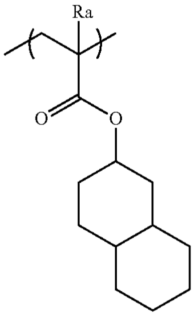
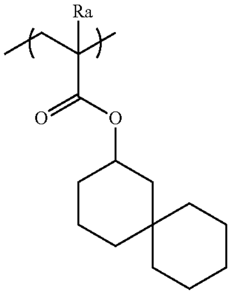
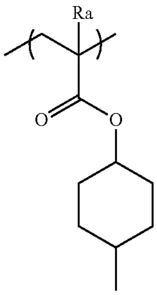
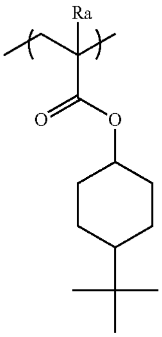
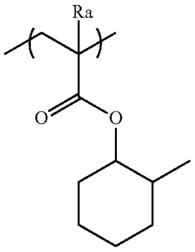
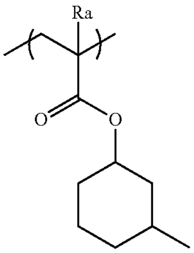
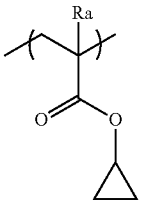
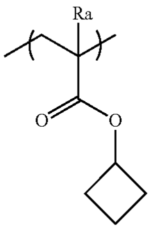
-continued
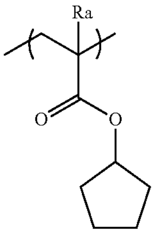
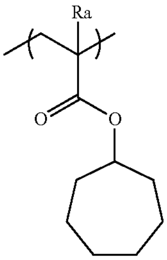
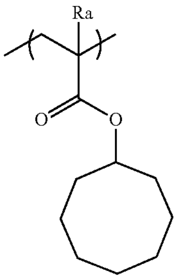
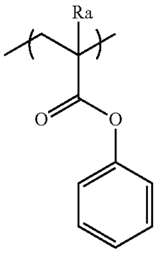
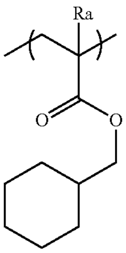
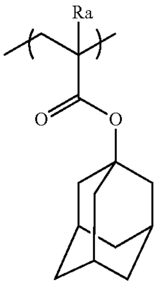
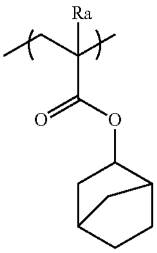
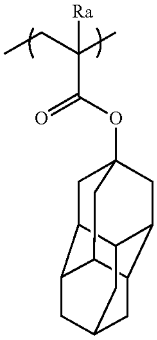
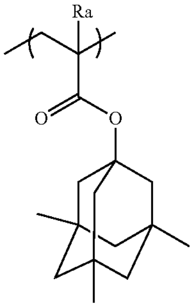
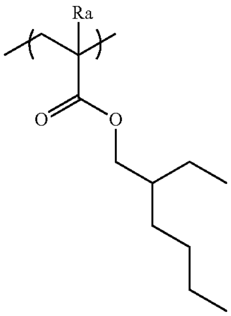
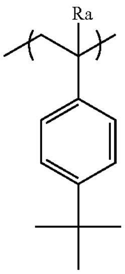

-continued
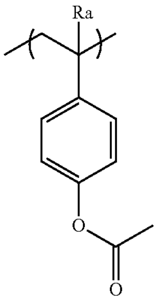
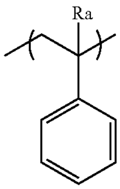
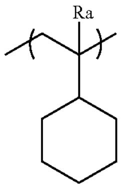
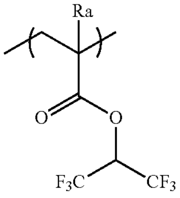
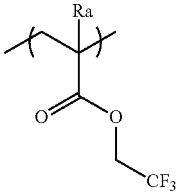
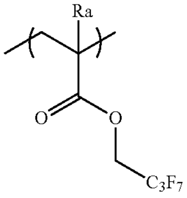
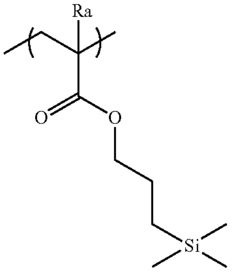
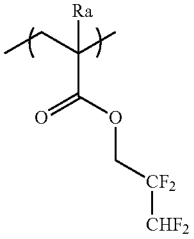
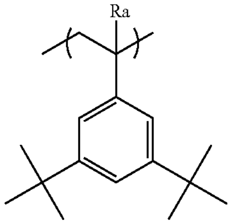
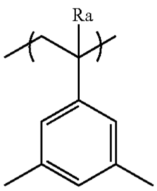
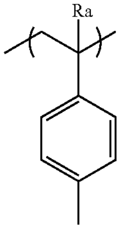
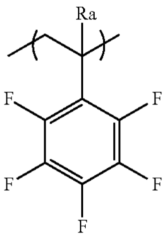
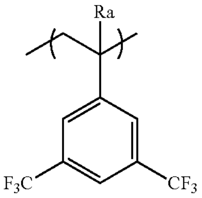
-continued
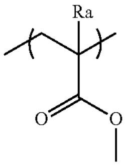
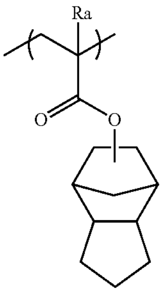
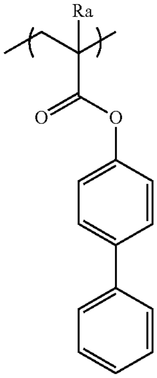
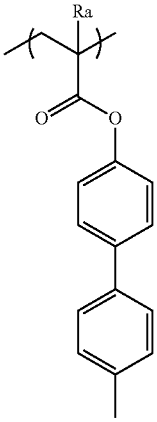
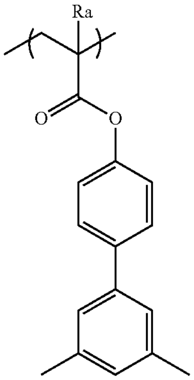
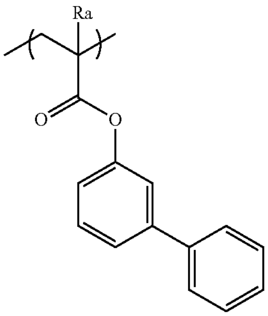
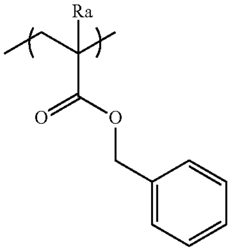
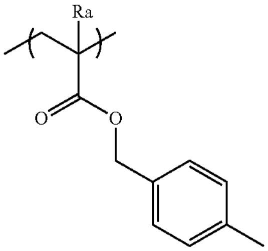
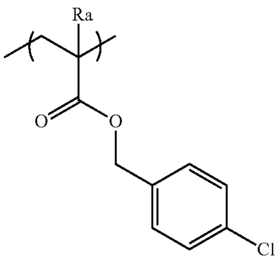

-continued

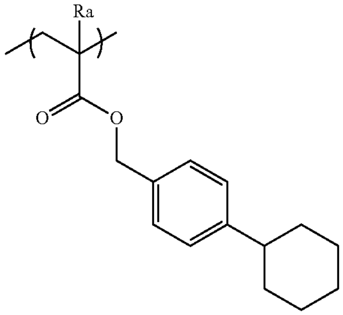

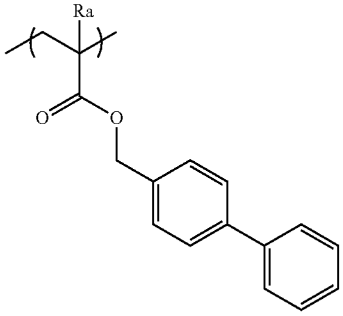

As for the lactone structure contained in the repeating unit having a lactone structure, any may be used as long as it has a lactone structure, but the lactone structure is preferably a 5- to 7-membered ring lactone structure, and a structure where another ring structure is condensed to a 5- to 7-membered ring lactone structure in the form of forming a bicyclo or Spiro structure is preferred. The resin more preferably contains a repeating unit having a lactone structure represented by any one of the following formulae (LC1-1) to (LC1-17). The lactone structure may be bonded directly to the main chain. Among these lactone structures, (LC1-1), (LC1-4), (LC1-5), (LC1-6), (LC1-13), (LC1-14) and (LC1-17) are preferred, and (LC1-4) is more preferred. By using a specific lactone group, the line edge roughness and development defect are improved.

LC1-1

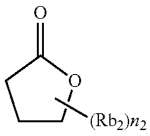

LC1-2

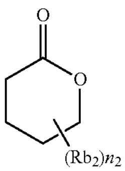

LC1-3

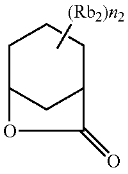

-continued

LC1-4

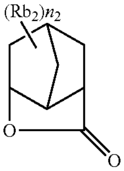

LC1-5

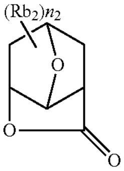

LC1-6

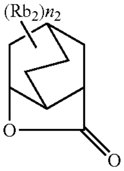

LC1-7

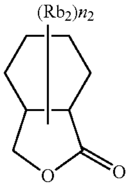

LC1-8

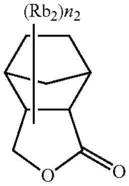

LC1-9

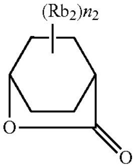

LC1-10

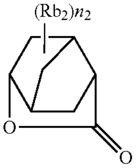

LC1-11

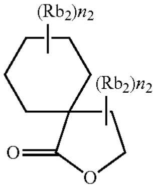

-continued

LC1-12

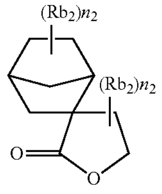

LC1-13

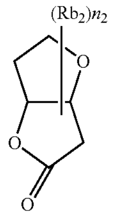

LC1-14

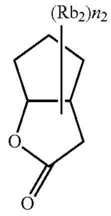

LC1-15

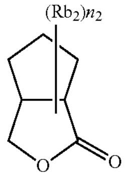

LC1-16

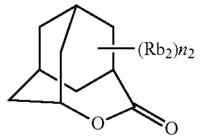

LC1-17

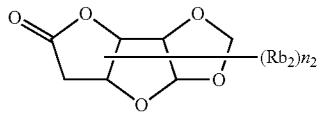

The lactone structure moiety may or may not have a substituent ($Rb_2$). Preferred examples of the substituent ($Rb_2$) include an alkyl group having a carbon number of 1 to 8, a cycloalkyl group having a carbon number of 4 to 7, an alkoxy group having a carbon number of 1 to 8, an alkoxycarbonyl group having a carbon number of 2 to 8, a carboxyl group, a halogen atom, a hydroxyl group, a cyano group and an acid-decomposable group. Among these, an alkyl group having a carbon number of 1 to 4, a cyano group and an acid-decomposable group are more preferred. $n_2$ represents an integer of 0 to 4. When $n_2$ is an integer of 2 or more, each substituent ($Rb_2$) may be the same as or different from every other substituents ($Rb_2$) and also, one substituent ($Rb_2$) may combine with another substituent ($Rb_2$) to form a ring.

The repeating unit having a lactone structure represented by any one of formulae (LC1-1) to (LC1-17) includes a repeating unit represented by the following formula (AII):

(AII)

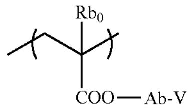

In formula (AII), $Rb_0$ represents a hydrogen atom, a halogen atom or an alkyl group (preferably having a carbon number of 1 to 4). The alkyl group of $Rb_0$ may have a substituent, and preferred examples of the substituent include a hydroxyl group and a halogen atom. The halogen atom of $Rb_0$ includes a fluorine atom, a chlorine atom, a bromine atom and an iodine atom. $Rb_0$ is preferably a hydrogen atom, a methyl group, a hydroxymethyl group or a trifluoromethyl group, more preferably a hydrogen atom or a methyl group.

Ab represents a single bond, an alkylene group, a divalent linking group having a monocyclic or polycyclic alicyclic hydrocarbon structure, an ether group, an ester group, a carbonyl group, or a divalent linking group formed by combining these groups and is preferably a single bond or a divalent linking group represented by $-Ab_1-CO_2-$.

$Ab_1$ represents an alkylene group (may be linear or branched) or a monocyclic or polycyclic cycloalkylene group and is preferably a methylene group, an ethylene group, a cyclohexylene group, an adamantylene group or a norbornylene group.

V represents a group having a structure represented by any one of formulae (LC1-1) to (LC1-17).

The repeating unit having a lactone group usually has an optical isomer, but any optical isomer may be used. One optical isomer may be used alone or a mixture of a plurality of optical isomers may be used. In the case of mainly using one optical isomer, the optical purity (ee) thereof is preferably 90% or more, more preferably 95% or more.

Specific examples of the repeating unit having a lactone structure are set forth below, but the present invention is not limited thereto. In the formulae, Rx represents H, $CH_3$, $CH_2OH$ or $CF_3$.

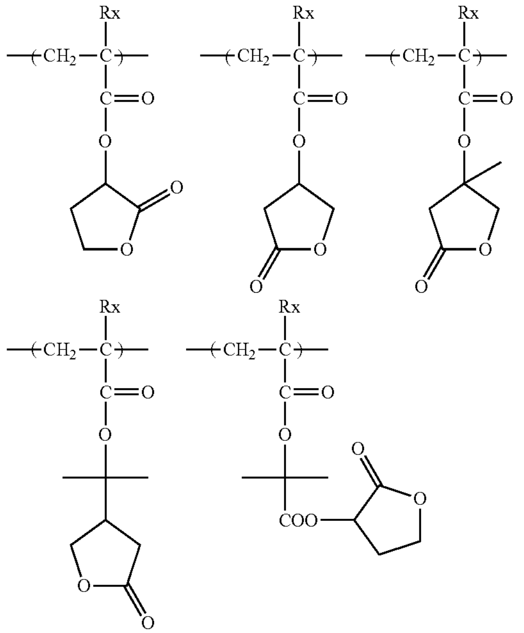

-continued
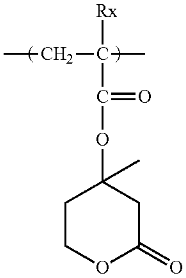
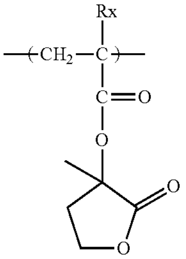
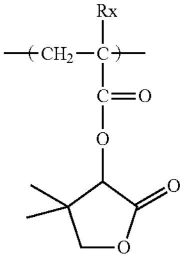
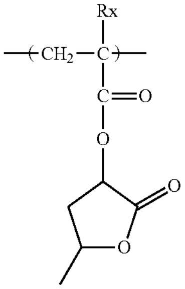
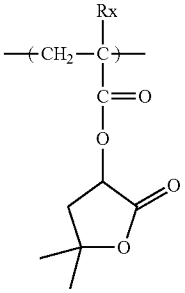
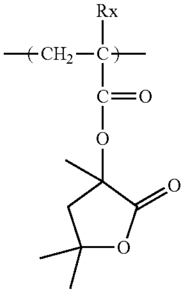
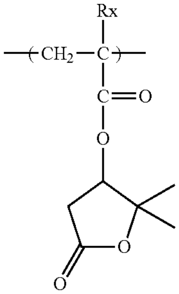
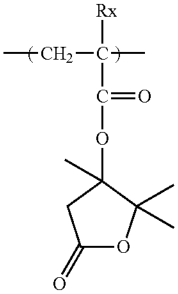
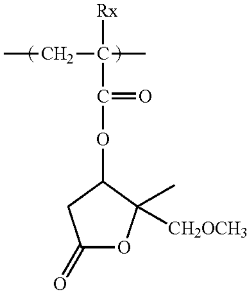
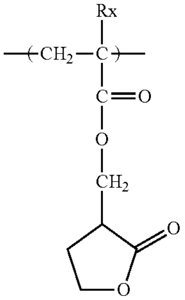
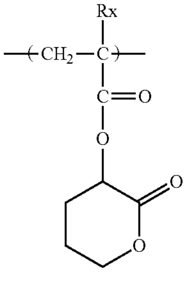
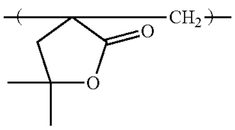
-continued
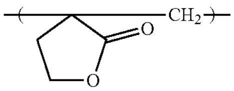
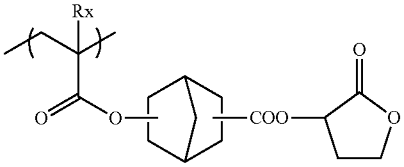
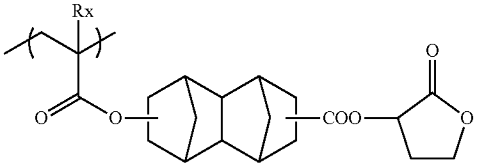
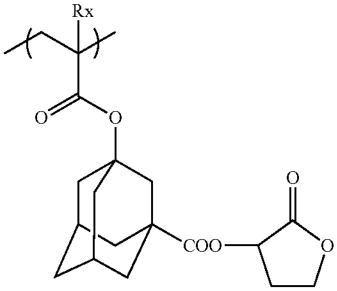
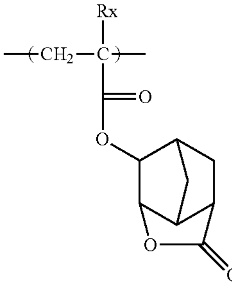
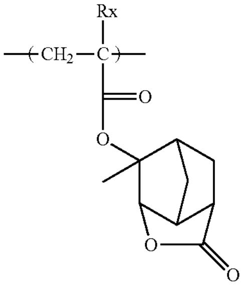
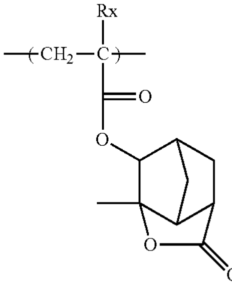
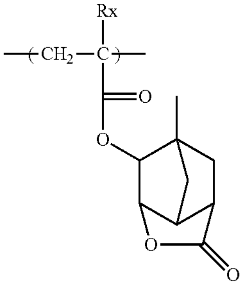
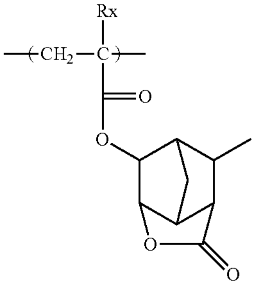
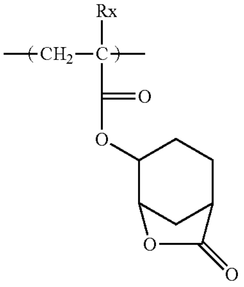

-continued
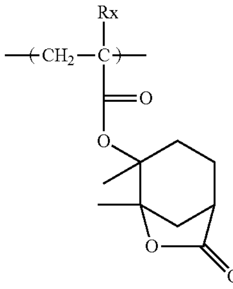
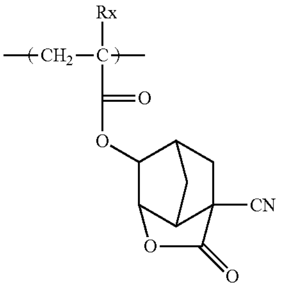
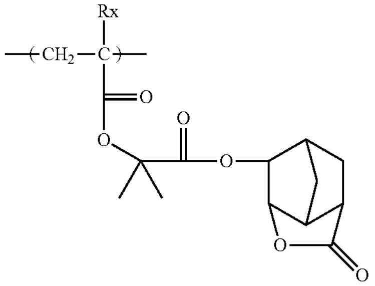
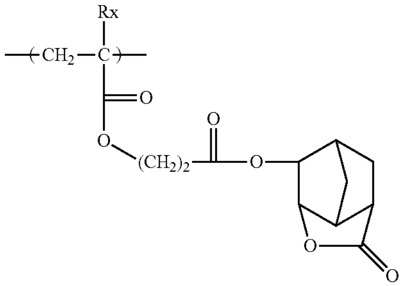
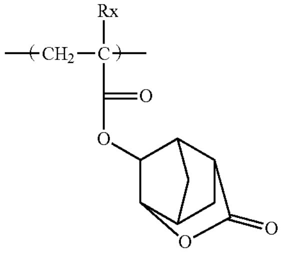
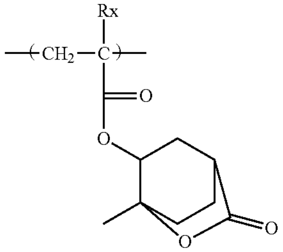
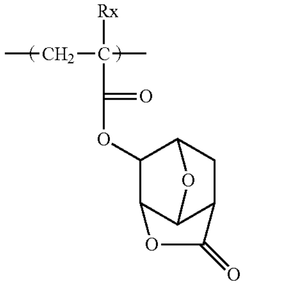
-continued
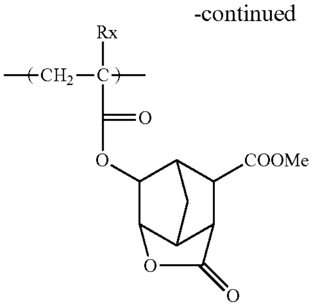
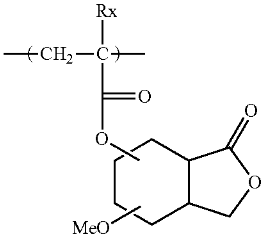
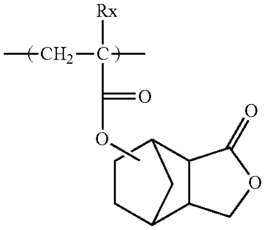
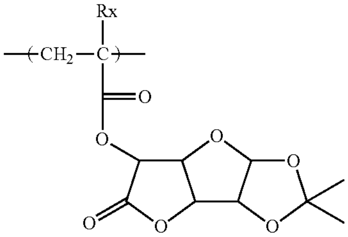
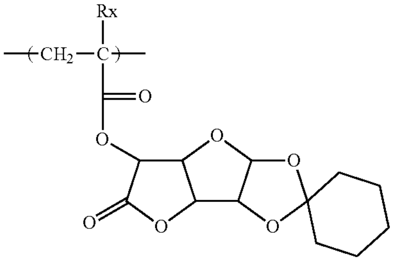
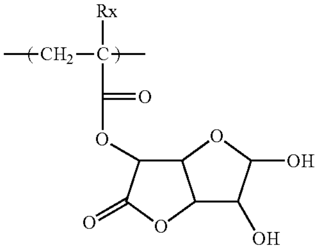
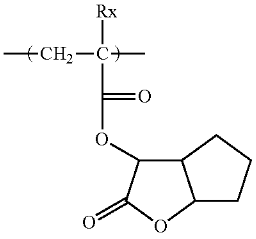
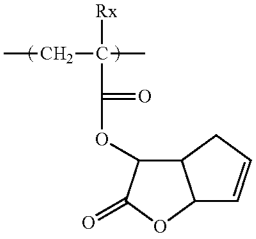

-continued
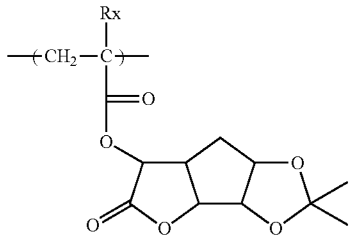
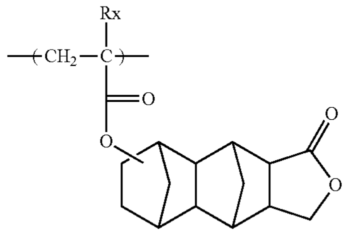
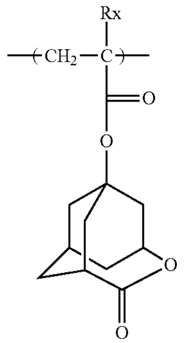
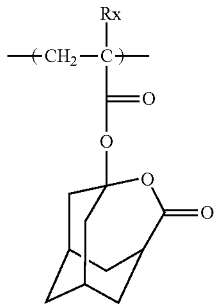
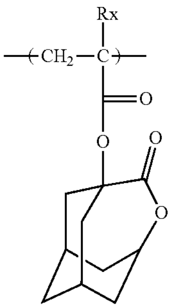
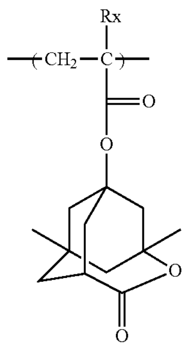
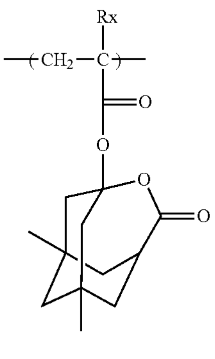
-continued
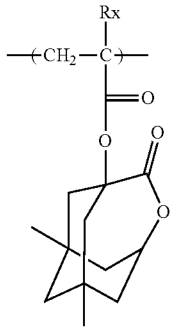
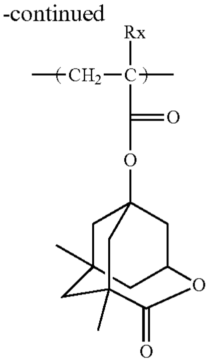
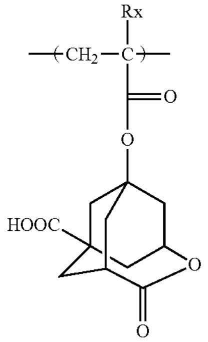
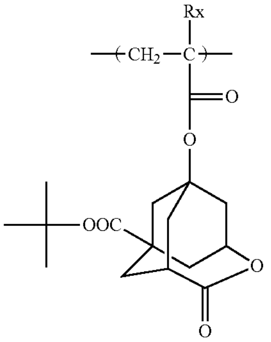
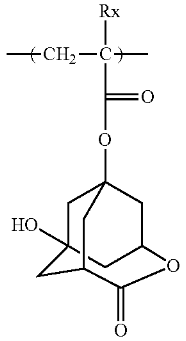
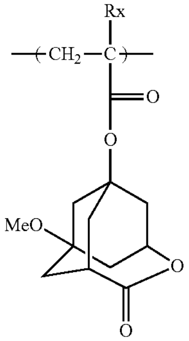
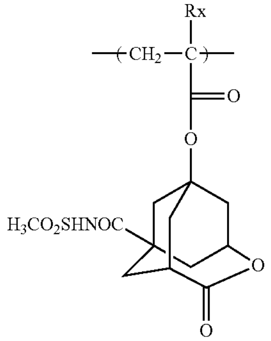
As for the repeating unit having a lactone group, the following repeating units are particularly preferred. By selecting an optimal lactone group, the pattern profile and iso/dense bias are improved. In the formulae, each of Rx and R represents H, $CH_3$, $CH_2OH$ or $CF_3$.

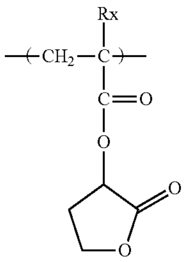
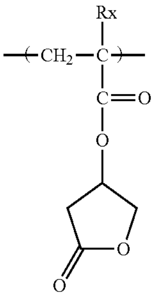
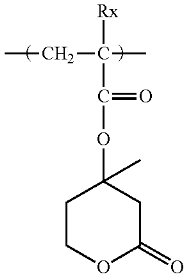
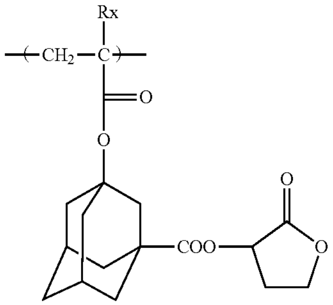
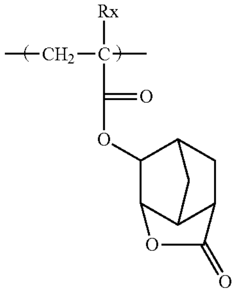
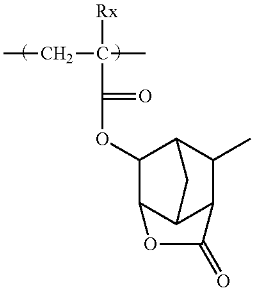
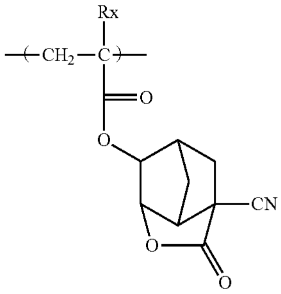
-continued
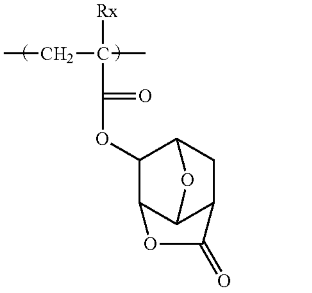
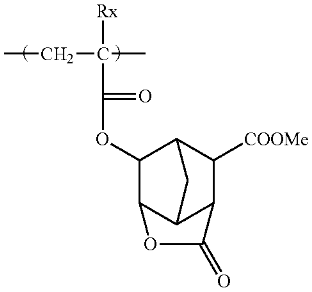
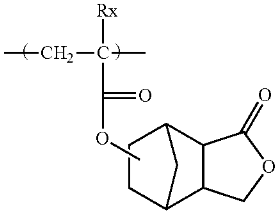
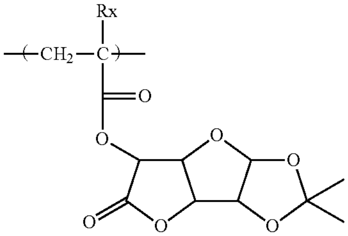
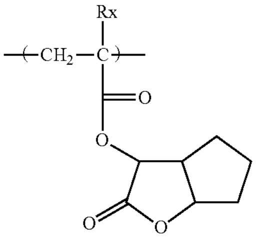
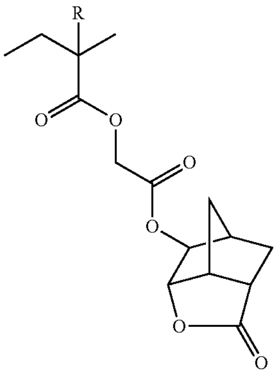

-continued
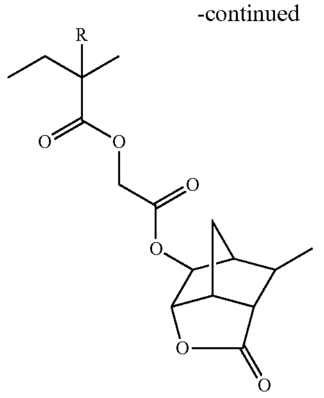
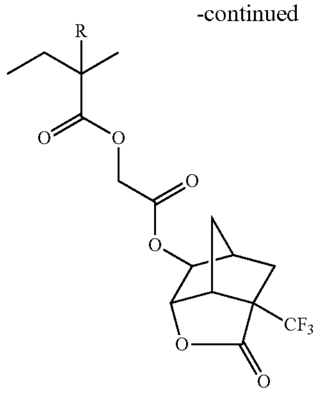
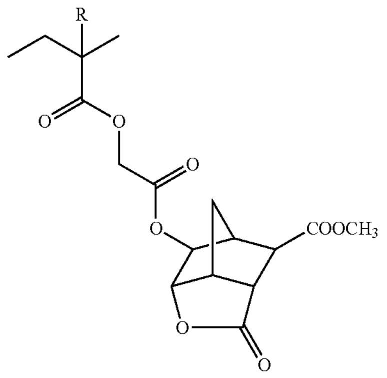
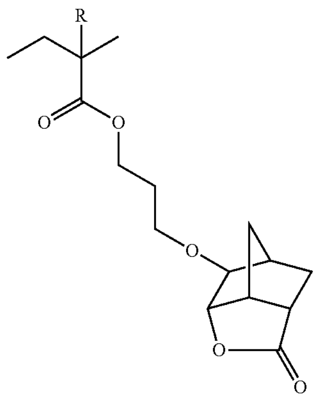
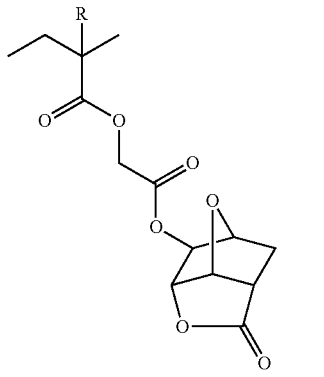
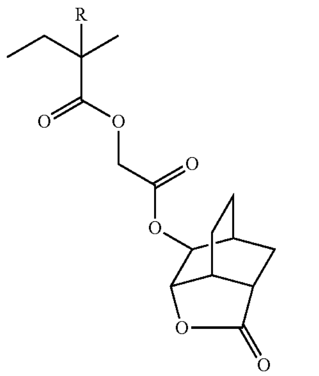
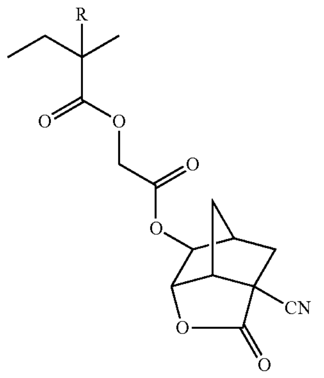
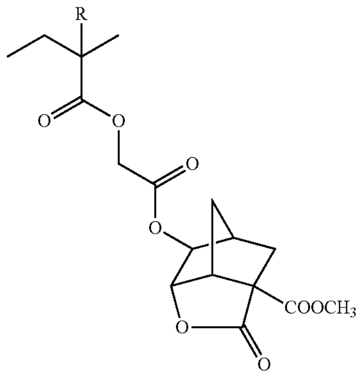

-continued

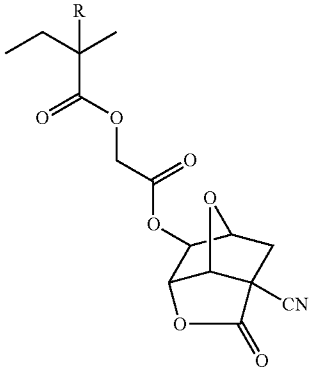

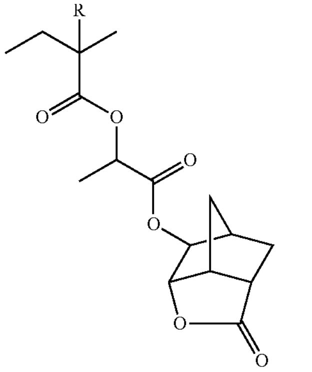

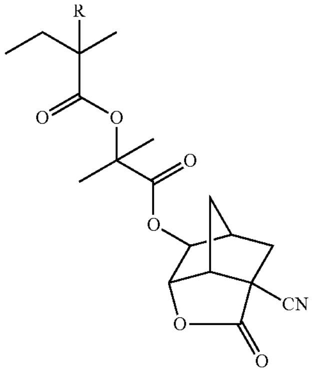

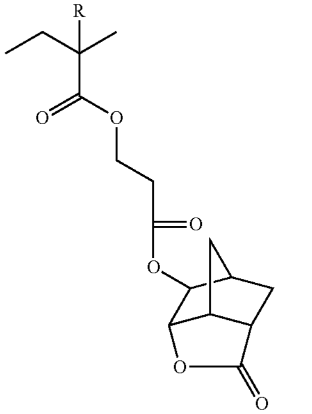

-continued

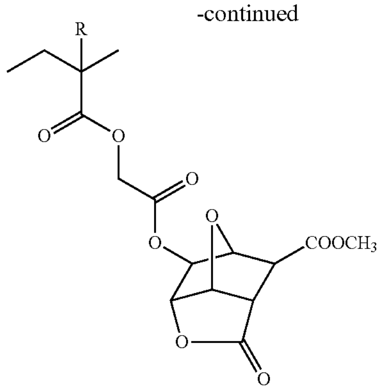

The resin (A) may or may not contain the repeating unit having a lactone structure and in the case of containing the repeating unit, the content thereof is preferably from 1 to 40 mol %, more preferably from 3 to 30 mol %, still more preferably from 5 to 15 mol %, based on all repeating units in the resin (A).

The weight average molecular weight of the resin (A) is preferably from 2,000 to 50,000, more preferably from 2,500 to 30,000. The molecular weight polydispersity (Mw/Mn) is from 1.01 to 4.0, preferably from 1.05 to 3.00. In order to obtain a polymer having such a molecular weight distribution, a technique such as anionic polymerization or radical polymerization is preferably used. Incidentally, the method for measuring the molecular weight is preferably a GPC measurement method by polystyrene conversion.

Specific examples of the resin (A) are set forth below, but the present invention is not limited thereto.

A-1

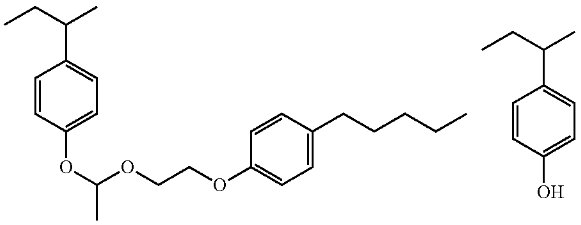

A-2

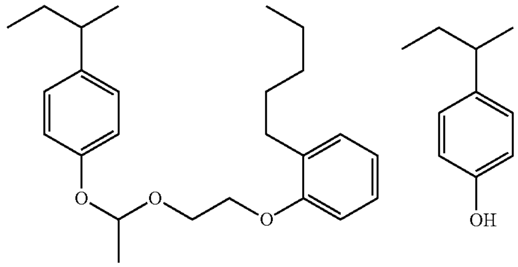

A-3

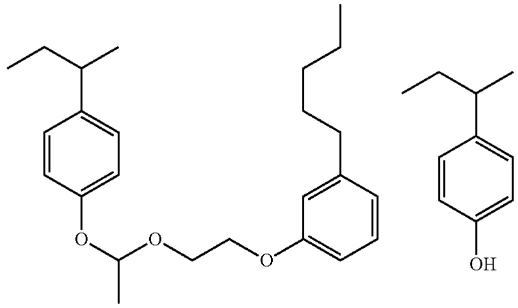

-continued
A-4
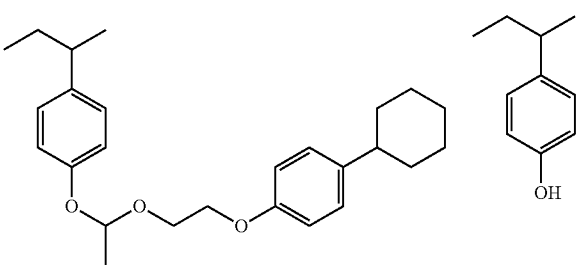
A-5
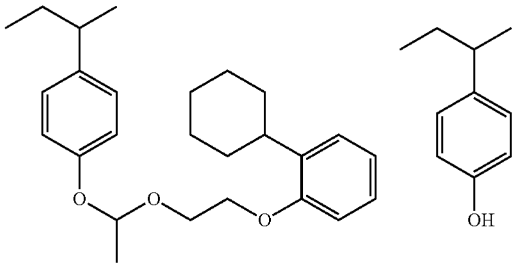
A-6
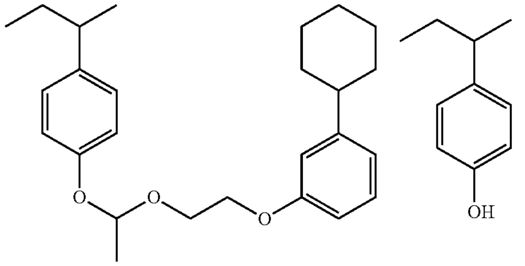
A-7
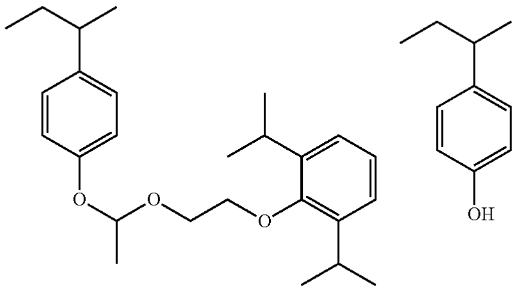
A-8
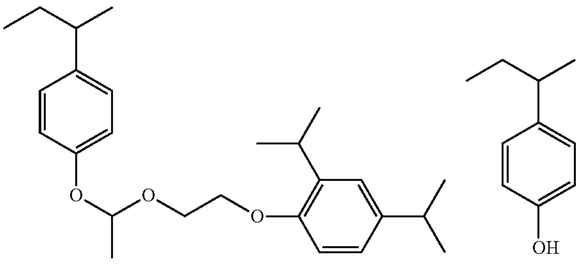
-continued
A-9
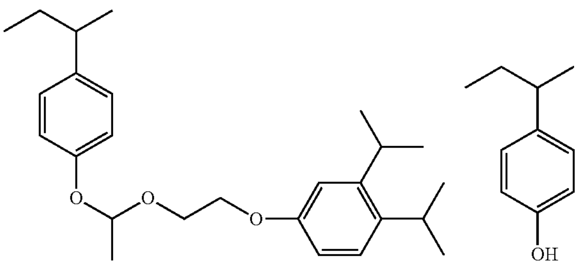
A-10
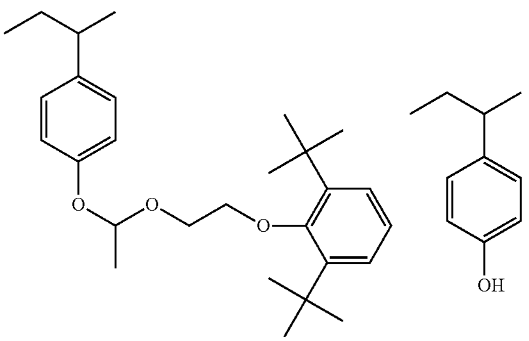
A-11
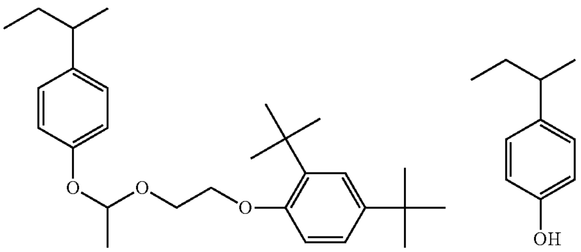
A-12
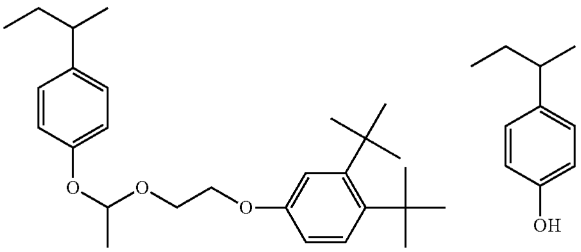
A-13
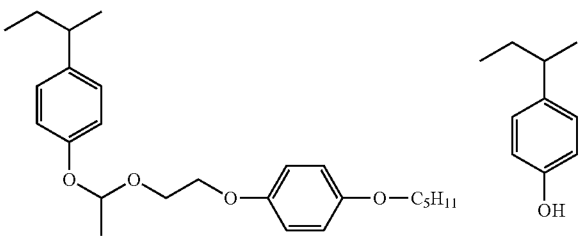

-continued
A-14
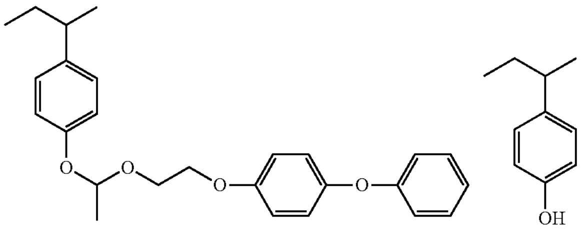
A-15
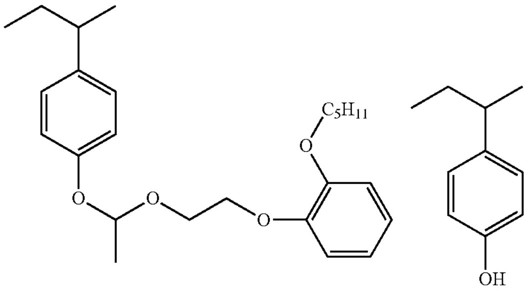
A-16
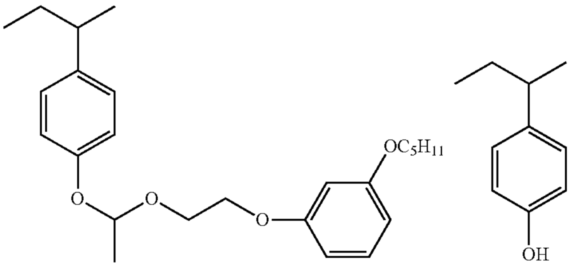
A-17
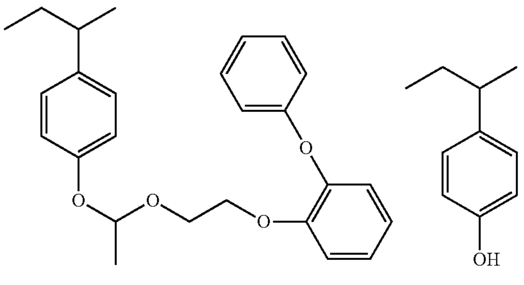
A-18
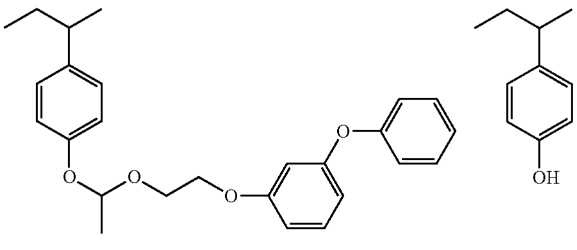
-continued
A-19
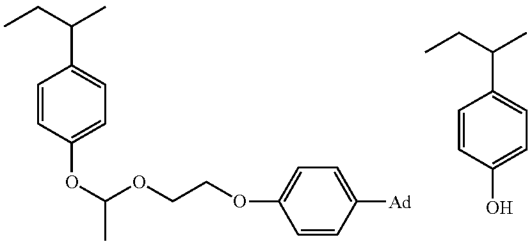
Ad: adamantyl
A-20
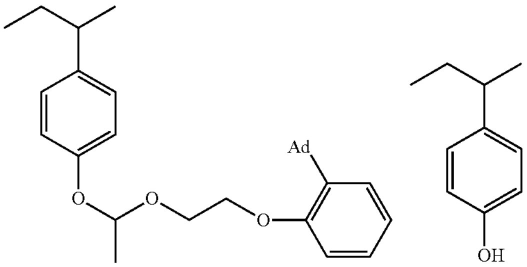
A-21
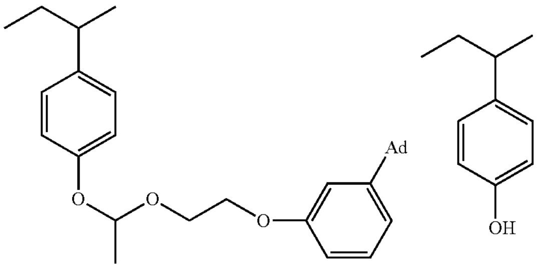
Ad: adamantyl
A-22
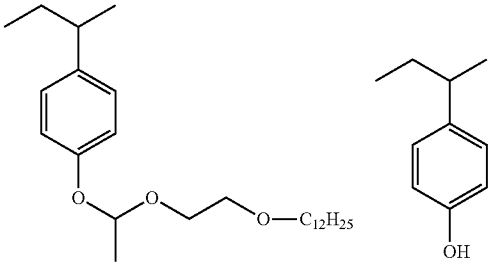
A-23
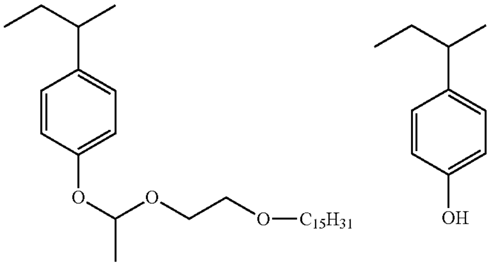

-continued
A-24
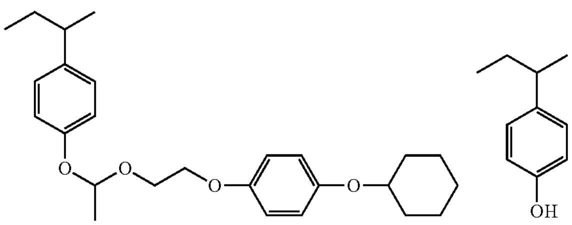
A-25
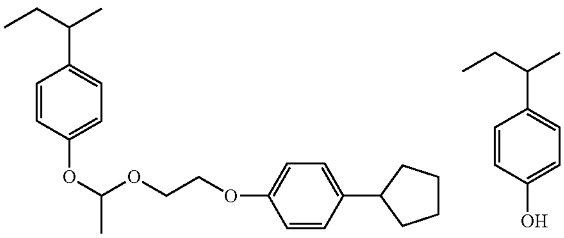
A-26
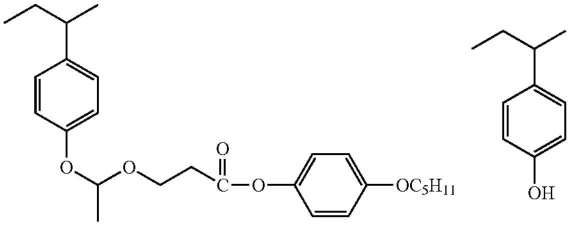
A-27
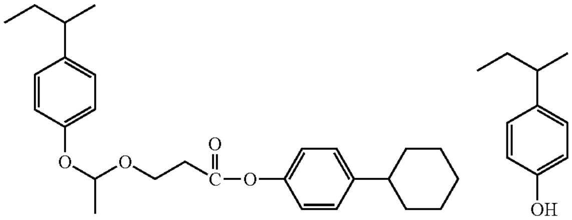
A-28
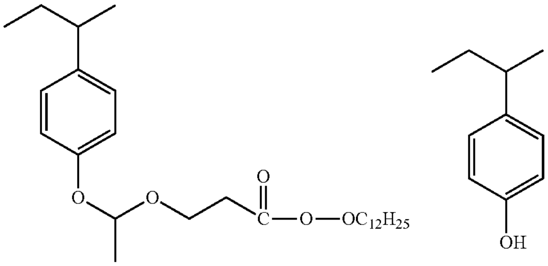
A-29
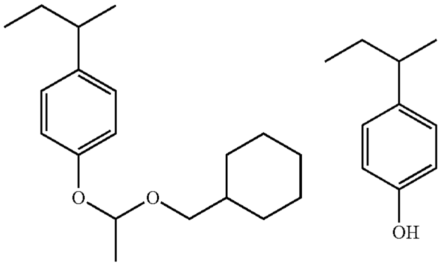
-continued
A-30
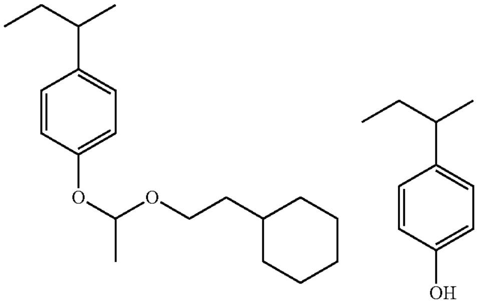
A-31
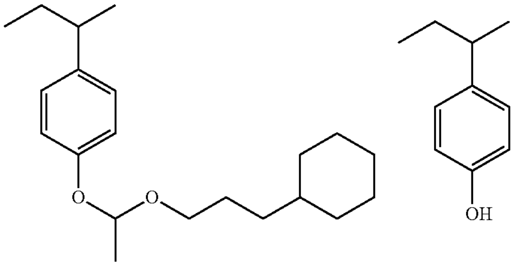
A-32
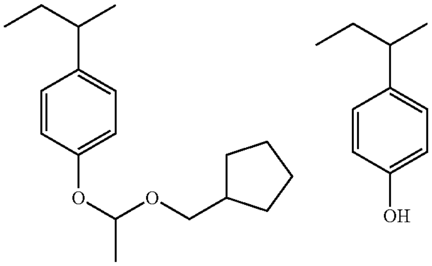
A-33
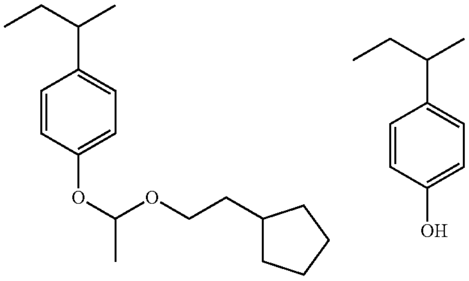
A-34
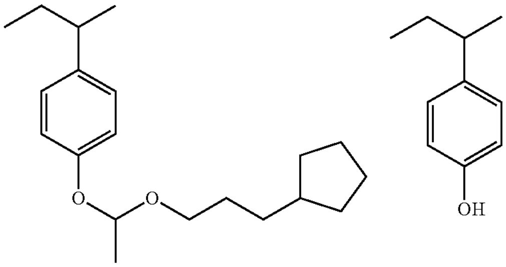

-continued
A-35
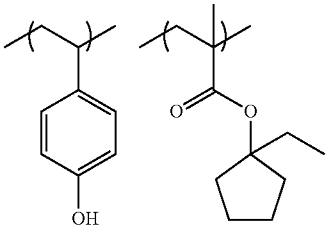
A-36
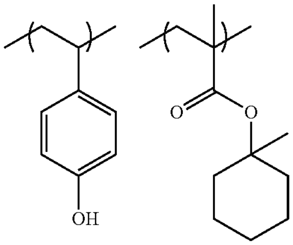
A-37
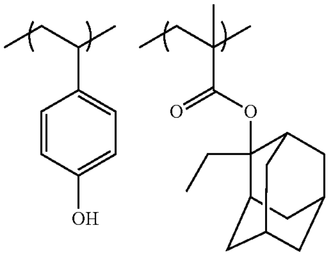
A-38
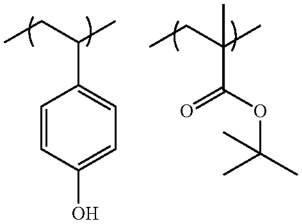
A-39
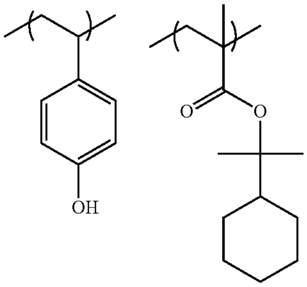
A-40
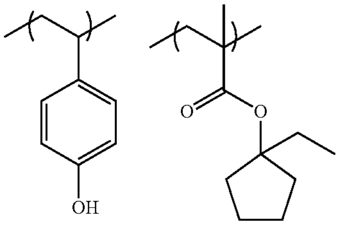
-continued
A-41
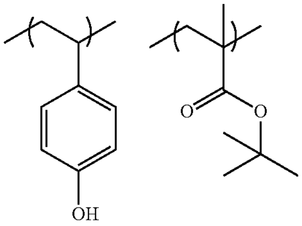
A-42
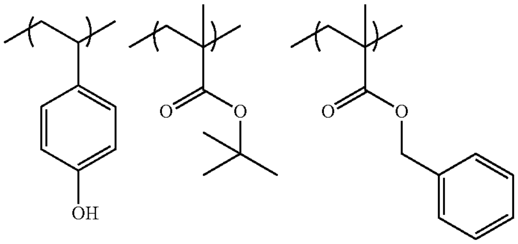
A-43
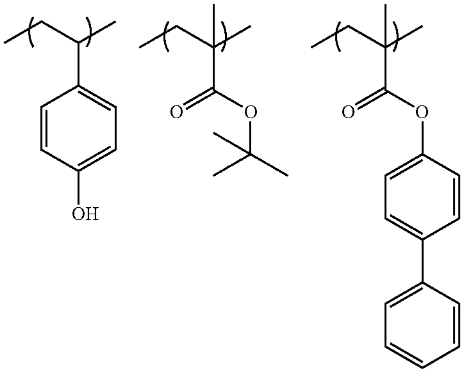
A-44
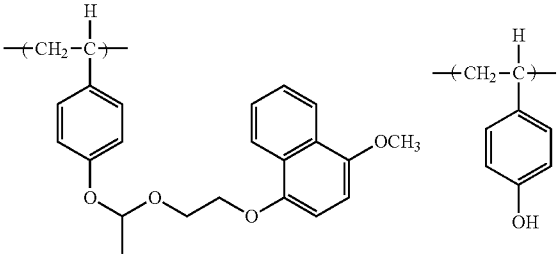
A-45
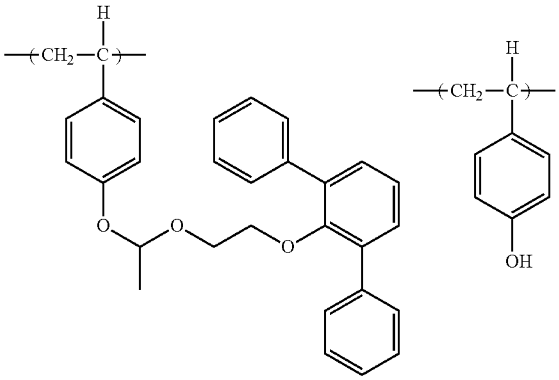

-continued

A-46

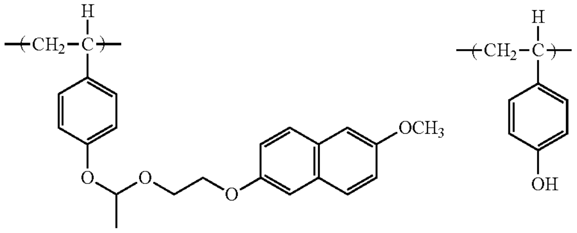

A-47

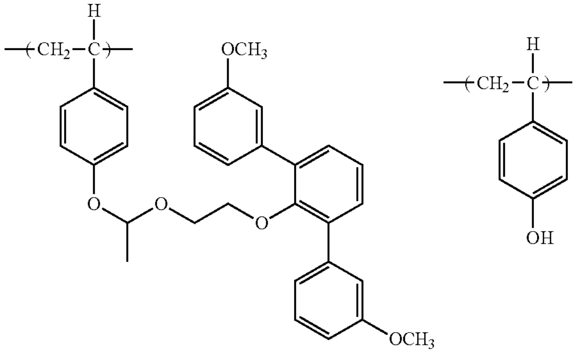

A-48

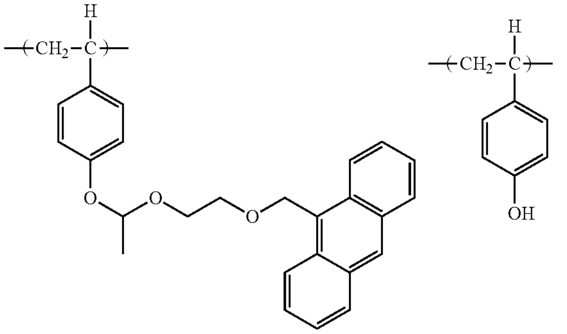

A-49

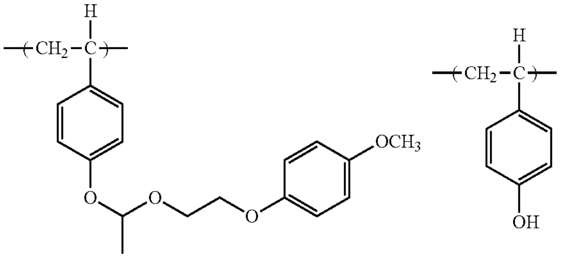

In the present invention, the amount added of the resin (A) in the composition is not particularly limited but is preferably from 60 to 97 mass %, more preferably from 70 to 90 mass %, based on the entire mass of solid contents in the composition. (In this specification, mass ratio is equal to weight ratio.)

Also, as for the resin (A) used in the present invention, a single kind of a resin may be used, or a plurality of kinds of resins may be used in combination. Alternatively, a resin (A) and another resin not coming under the resin (A) may be used in combination. In this case, the resin (A) is preferably present to occupy 50 mass % or more in all resins.

Incidentally, in the present invention, it is also a preferred embodiment to introduce a chemical structure corresponding to the later-described acid generator (B) into the side chain of the resin (A) and thereby use a resin having both (a) an acid-decomposable repeating unit and (b) a repeating unit having a structure capable of generating an acid upon irradiation with an actinic ray or radiation (hereinafter sometimes referred to as a "resin (Ap)"). In this connection, the later-described acid generator (B) may or may not be contained in the composition.

In this case, the acid-decomposable repeating unit (a) includes an acid-decomposable group-containing repeating unit contained in the resin (A). More specifically, the repeating unit includes, for example, a repeating unit having in the side chain thereof a structure represented by any one of formulae (I), (II) and (II'), and a repeating unit represented by formula (III). The repeating unit having a structure represented by formula (I) or (II) is low in the energy barrier for acid decomposition and makes it easy to achieve high sensitivity. Also, the dissolution contrast is high. On the other hand, the repeating unit represented by formula (III) is preferably used particularly in consideration from the viewpoint of LWR.

The repeating unit (b) having a structure capable of generating an acid upon irradiation with an actinic ray or radiation is preferably a repeating unit having a structure capable of generating an acid anion in the side chain of the resin upon irradiation with an actinic ray or radiation, whereby LWR can be preferably improved.

The repeating unit (b) is preferably, for example, a repeating unit represented by any one of the following formulae (IV) to (VI):

(IV)

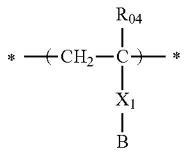

(V)

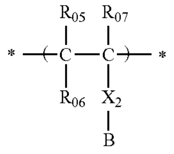

(VI)

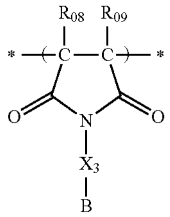

wherein each of $R_{04}$, $R_{05}$ and $R_{07}$ to $R_{09}$ independently represents a hydrogen atom, an alkyl group, a cycloalkyl group, a halogen atom, a cyano group or an alkoxycarbonyl group;

$R_{06}$ represents a cyano group, a carboxyl group, —CO—$OR_{25}$ or —CO—$N(R_{26})(R_{27})$, wherein $R_{26}$ and $R_{27}$ may combine with each other to form a ring together with the nitrogen atom;

each of $X_1$ to $X_3$ independently represents a single bond, an arylene group, an alkylene group, a cycloalkylene group, —O—, —$SO_2$—, —CO—, —COO—, —$N(R_{33})$— or a divalent linking group formed by combining a plurality of these groups;

$R_{25}$ represents an alkyl group, a cycloalkyl group, an alkenyl group, an aryl group or an aralkyl group;

each of $R_{26}$, $R_{27}$ and $R_{33}$ independently represents a hydrogen atom, an alkyl group, a cycloalkyl group, an alkenyl group, an aryl group or an aralkyl group; and B represents a structural moiety capable of decomposing upon irradiation with an actinic ray of radiation to produce an acid.

In formulae (IV) to (VI), the alkyl group of $R_{04}$, $R_{05}$ and $R_{07}$ to $R_{09}$ is preferably an alkyl group having a carbon number of 20 o less, such as methyl group, ethyl group, propyl group, isopropyl group, n-butyl group, sec-butyl group, hexyl group, 2-ethylhexyl group, octyl group and dodecyl group, more preferably an alkyl group having a carbon number of 8 or less.

The cycloalkyl group of $R_{04}$, $R_{05}$ and $R_{07}$ to $R_{09}$ is a cycloalkyl group which may be monocyclic or polycyclic, and is preferably a monocyclic cycloalkyl group having a carbon number of 3 to 8, such as cyclopropyl group, cyclopentyl group and cyclohexyl group.

The halogen atom of $R_{04}$, $R_{05}$ and $R_{07}$ to $R_{09}$ includes a fluorine atom, a chlorine atom, a bromine atom and an iodine atom and is preferably a fluorine atom.

As the alkyl group contained in the alkoxycarbonyl group of $R_{04}$, $R_{05}$ and $R_{07}$ to $R_{09}$, the same alkyl group as that in $R_{04}$, $R_{05}$ and $R_{07}$ to $R_{09}$ is preferred.

The alkyl group of $R_{25}$ to $R_{27}$ and $R_{33}$ is preferably an alkyl group having a carbon number of 20 or less, such as methyl group, ethyl group, propyl group, isopropyl group, n-butyl group, sec-butyl group, hexyl group, 2-ethylhexyl group, octyl group and dodecyl group, more preferably an alkyl group having a carbon number of 8 or less.

The cycloalkyl group of $R_{25}$ to $R_{27}$ and $R_{33}$ is a cycloalkyl group which may be monocyclic or polycyclic, and is preferably a monocyclic cycloalkyl group having a carbon number of 3 to 8, such as cyclopropyl group, cyclopentyl group and cyclohexyl group.

The alkenyl group of $R_{25}$ to $R_{27}$ and $R_{33}$ is preferably an alkenyl group having a carbon number of 2 to 6, such as vinyl group, propenyl group, allyl group, butenyl group, pentenyl group, hexenyl group and cyclohexenyl group.

The aryl group of $R_{25}$ to $R_{27}$ and $R_{33}$ is preferably a monocyclic or polycyclic aromatic group having a carbon number of 6 to 14, and specific examples thereof include a phenyl group, a tolyl group, a chlorophenyl group, a methoxyphenyl group and a naphthyl group. The aryl groups may combine with each other to form a heterocyclic ring.

The aralkyl group of $R_{25}$ to $R_{27}$ and $R_{33}$ is an aralkyl group having a carbon number of 7 to 15 which may have a substituent, such as benzyl group, phenethyl group and cumyl group.

The ring formed together with the nitrogen atom by combining $R_{26}$ and $R_{27}$ is preferably a 5- to 8-membered ring, and specific examples thereof include pyrrolidine, piperidine and piperazine.

The arylene group of $X_1$ to $X_3$ is preferably an arylene group having a carbon number of 6 to 14 which may have a substituent, and specific examples thereof include a phenylene group, a tolylene group and a naphthylene group.

The alkylene group of $X_1$ to $X_3$ is preferably an alkylene group having a carbon number of 1 to 8, such as methylene group, ethylene group, propylene group, butylene group, hexylene group and octylene group.

The cycloalkylene group of $X_1$ to $X_3$ is preferably a cycloalkylene group having a carbon number of 5 to 8, which may have a substituent, such as cyclopentylene group and cyclohexylene group.

Each of $X_1$ to $X_3$ is preferably an arylene group, an alkylene group, a cycloalkylene group, a —COO-arylene group, a —COO-alkylene group or a —COO-cycloalkylene group. Also, in view of acid strength, an electron-withdrawing substituent (for example, a fluorine atom, an alkyl fluoride group or a nitro group) is preferably substituted on $X_1$ to $X_3$. Furthermore, when a polar group such as hydroxyl group and cyano group is substituted thereon, this can be expected to bring about, for example, enhancement of solubility in an alkali developer.

Each of the groups in formulae (IV) to (VI) may further have a substituent, and specific preferred examples of the further substituent include a hydroxyl group, a halogen atom (e.g., fluorine, chlorine, bromine, iodine), a nitro group, a cyano group, an amido group, a sulfonamido group, the alkyl group set forth for $R_{04}$ to $R_{09}$, $R_{25}$ to $R_{27}$ and $R_{33}$, an alkoxy group such as methoxy group, ethoxy group, hydroxyethoxy group, propoxy group, hydroxypropoxy group and butoxy group, an alkoxycarbonyl group such as methoxycarbonyl group and ethoxycarbonyl group, an acyl group such as formyl group, acetyl group and benzoyl group, an acyloxy group such as acetoxy group and butyryloxy group, and a carboxy group. The carbon number of the substituent is preferably 8 or less.

B represents a structural moiety capable of decomposing upon irradiation with an actinic ray or radiation to produce an acid and is preferably a structure capable of producing an acid anion on the resin side as described above. B is more preferably an ionic structural moiety containing a sulfonium or iodonium salt. More specifically, B is preferably a structure represented by the following formula (ZI') or (ZII'):

(ZI')

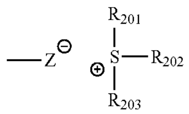

(ZII')

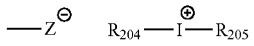

In formula (ZI'), each of $R_{201}$, $R_{202}$ and $R_{203}$ independently represents an organic group.

The carbon number of the organic group as $R_{201}$, $R_{202}$ and $R_{203}$ is generally from 1 to 30, preferably from 1 to 20.

Two members out of $R_{201}$ to $R_{203}$ may combine with each other to form a ring structure, and the ring may contain an oxygen atom, a sulfur atom, an ester bond, an amide bond or a carbonyl group. The group formed by combining two members out of $R_{201}$ to $R_{203}$ includes an alkylene group (e.g., butylene, pentylene).

$Z^-$ represents an acid anion that is generated by decomposition upon irradiation with an actinic ray or radiation, and is preferably a non-nucleophilic anion. Examples of the non-nucleophilic anion include sulfonate anion, carboxylate anion, sulfonylimide anion, bis(alkylsulfonyl)imide anion and tris(alkylsulfonyl)methyl anion.

The non-nucleophilic anion is an anion having an extremely low ability of causing a nucleophilic reaction, and this anion can suppress the decomposition with aging due to intramolecular nucleophilic reaction. Thanks to this anion, the aging stability of the resin and in turn, the aging stability of the resist are enhanced.

Specific examples and preferred examples of the acid anion $Z^-$ in formulae (ZI') and (ZII') are the same as acid anions corresponding to specific examples and preferred examples of the anion for $Z^-$ in formula ($ZI^-$) described later.

The organic group as $R_{201}$, $R_{202}$ and $R_{203}$ includes, for example, a corresponding group in the later-described compound (ZI-1).

In formula (ZII'), $Z^-$ has the same meaning as $Z^-$ in formula (ZI').

$R^{204}$ and $R_{205}$ have the same meanings as $R_{204}$ and $R_{205}$ in formula (ZII) described later.

Other embodiments of B include structures represented by the following formulae.

(ZCI)

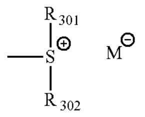

(ZCII)

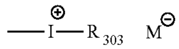

In formulae (ZCI) and (ZCII), each of $R_{301}$ and $R_{302}$ independently represents an organic group.

The carbon number of the organic group as $R_{301}$ and $R_{302}$ is generally from 1 to 30, preferably from 1 to 20.

$R_{301}$ and $R_{302}$ may combine with each other to form a ring structure, and the ring may contain an oxygen atom, a sulfur atom, an ester bond, an amide bond or a carbonyl group. The group formed by combining these members includes an alkylene group (e.g., butylene, pentylene).

Specific examples of the organic group as $R_{301}$ and $R_{302}$ include the aryl group, alkyl group and cycloalkyl group set forth as examples of $R_{201}$ to $R_{203}$ in formula (ZI) described later.

M represents an atomic group for forming an acid by accepting a proton. More specifically, the atomic group is the same as that for Z in formula (ZI) described later.

$R_{303}$ represents an organic group. The carbon number of the organic group as $R_{303}$ is generally from 1 to 30, preferably from 1 to 20. Specifically, the organic group of $R_{303}$ includes, for example, the aryl group, alkyl group and cycloalkyl group set forth as specific examples of $R_{204}$ and $R_{205}$ in formula (ZII) described later.

The resin (A) may or may not contain the repeating unit (b) and in the case of containing the repeating unit, the content thereof is preferably from 0.5 to 80 mol %, more preferably from 1 to 60 mol %, still more preferably from 3 to 40 mol %, based on all repeating units in the resin (A).

Examples of the structure corresponding to the repeating unit (b) are set forth below, but the present invention is not limited thereto.

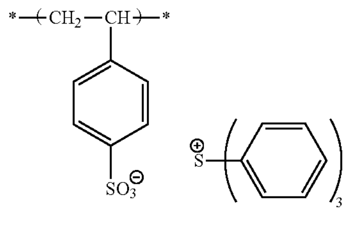

-continued

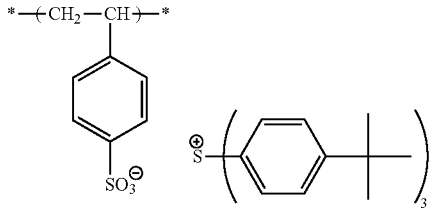

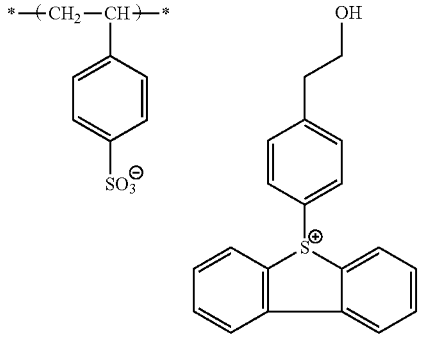

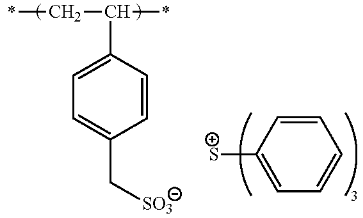

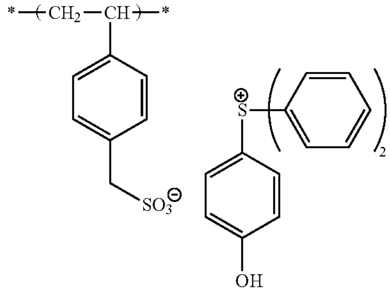

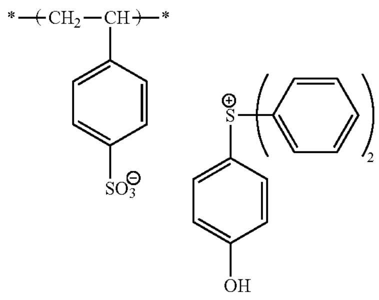

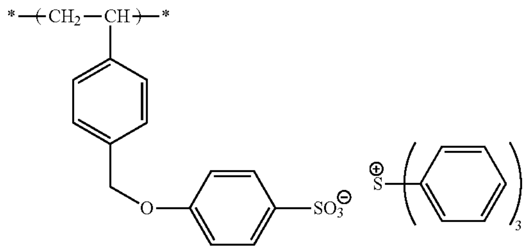

-continued
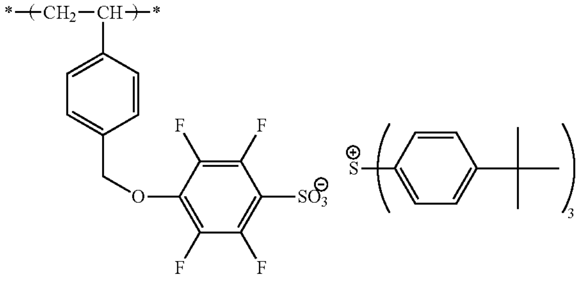
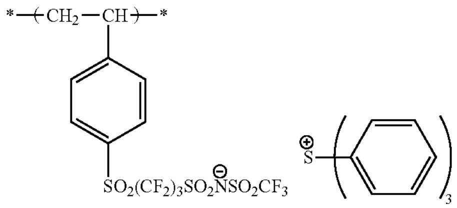
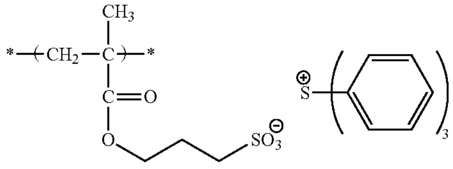
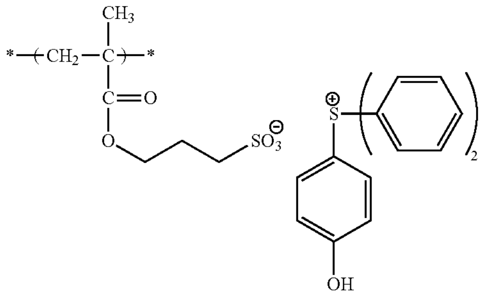
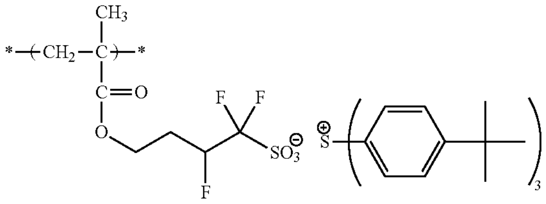
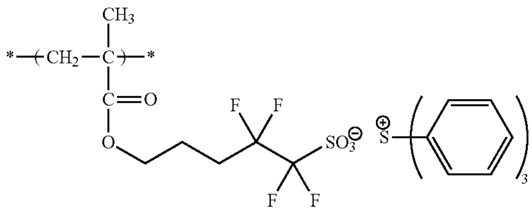
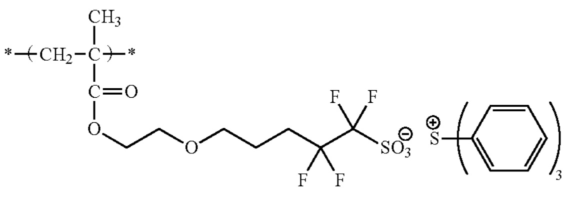
-continued
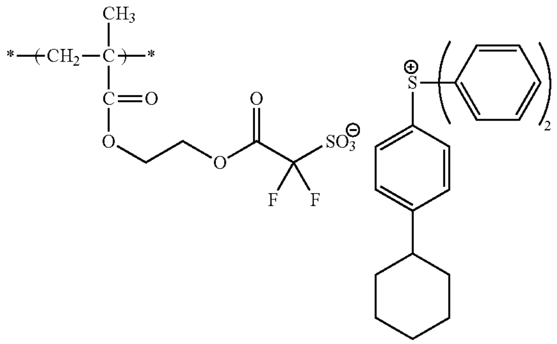
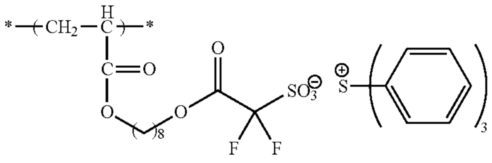
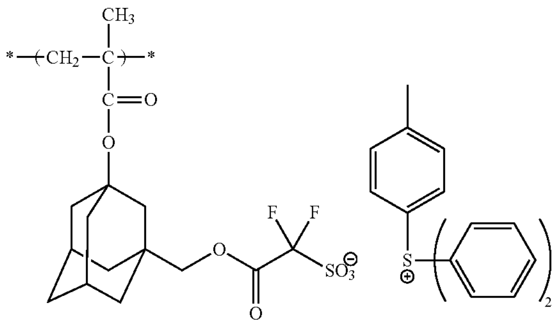
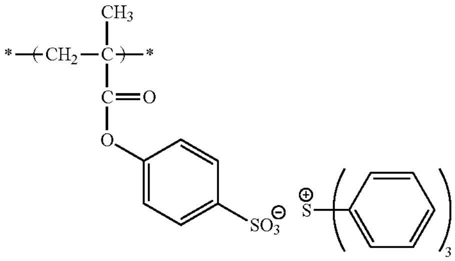
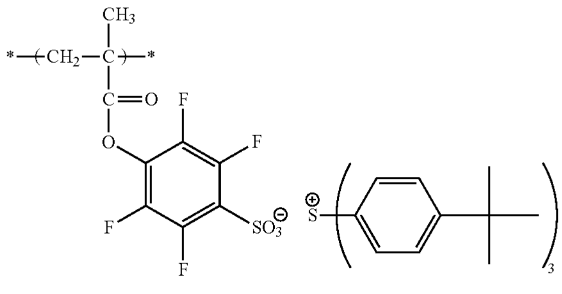
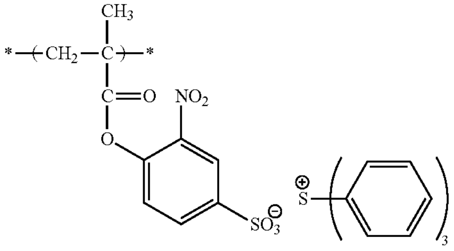

-continued
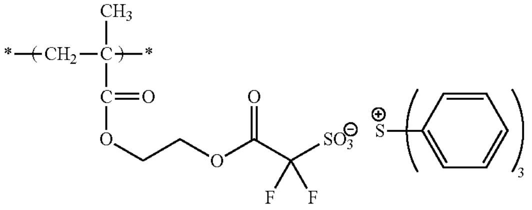
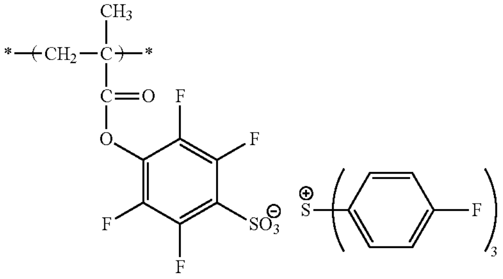
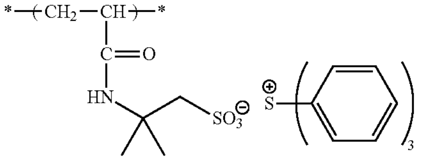
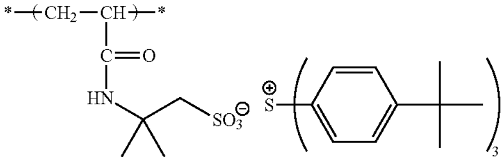
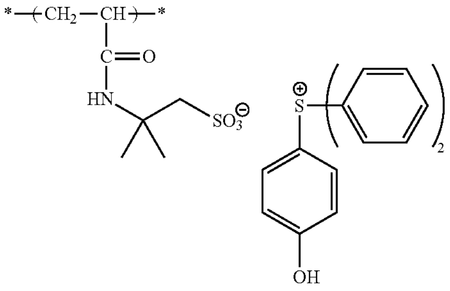
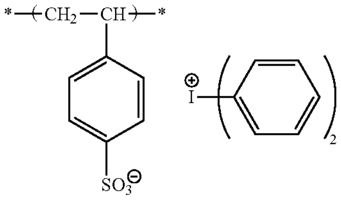
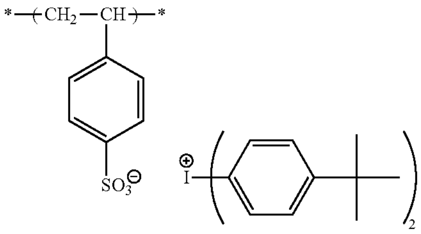
-continued
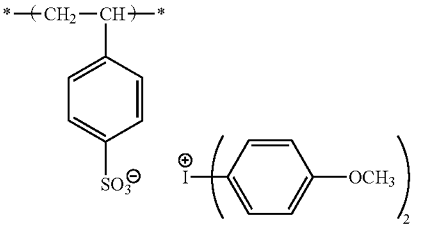
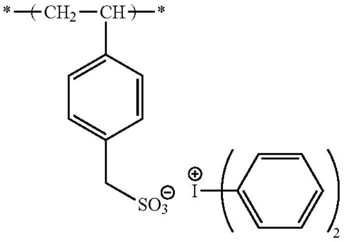
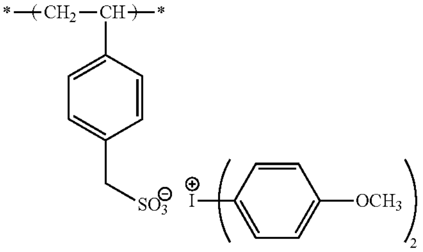
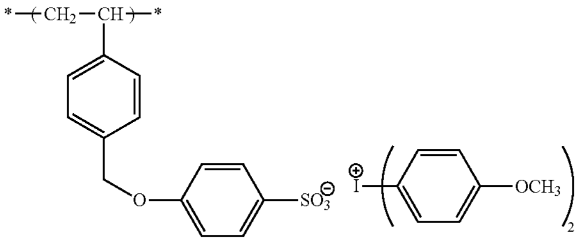
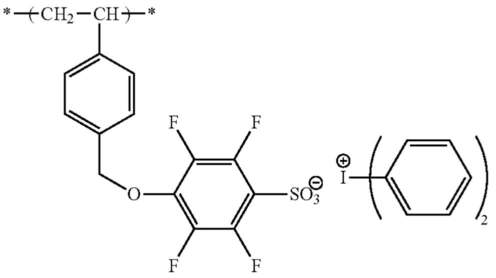
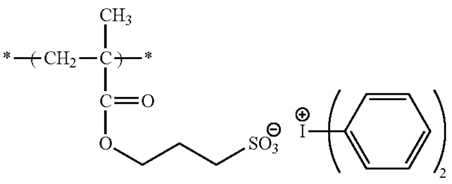
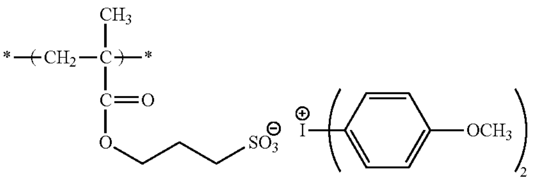

-continued
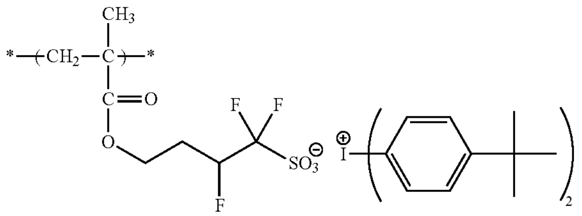
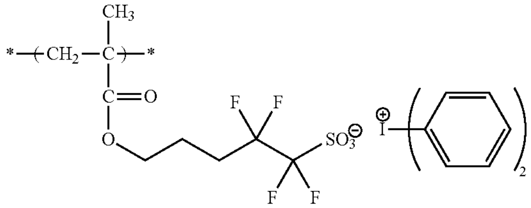
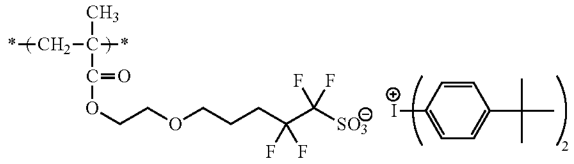
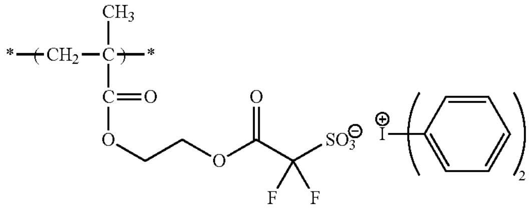
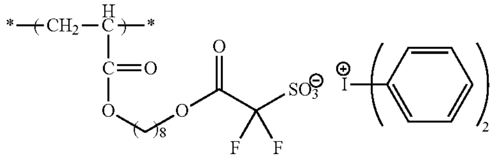
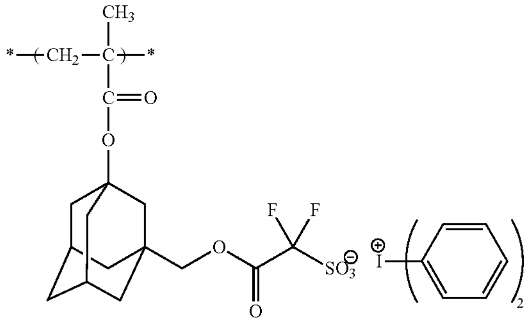
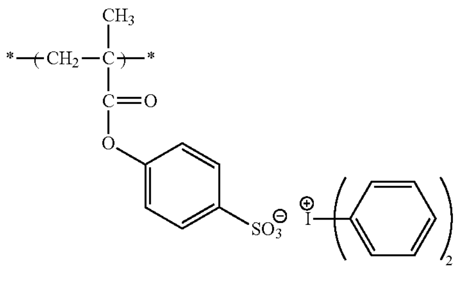
-continued
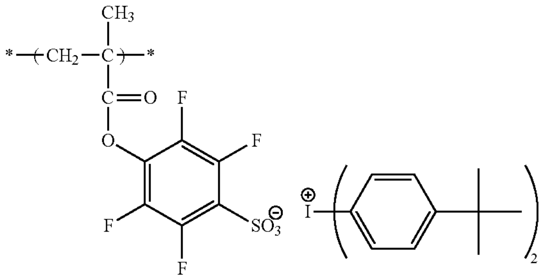
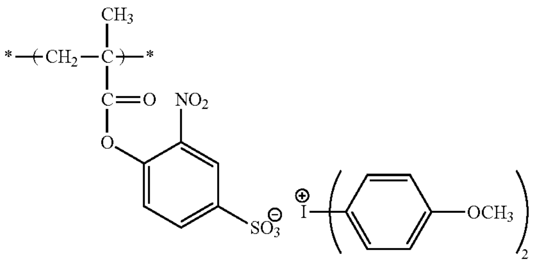
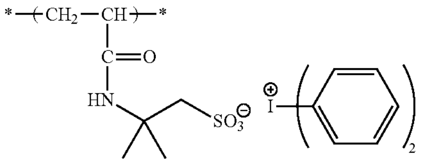
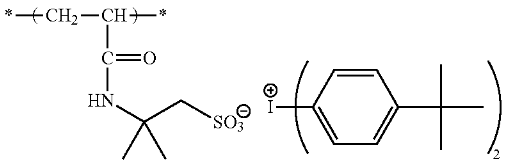
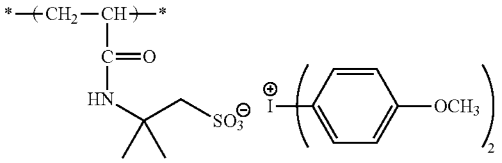
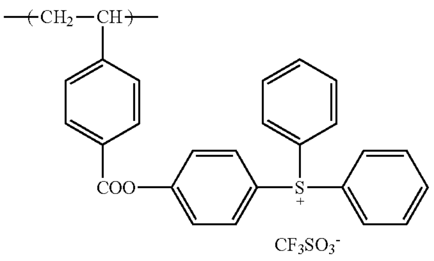
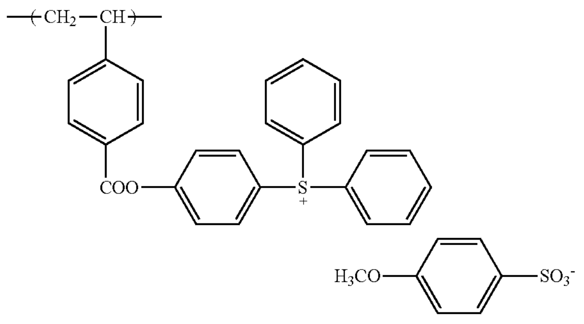

-continued
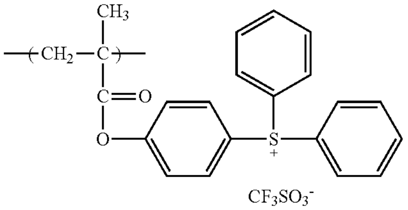
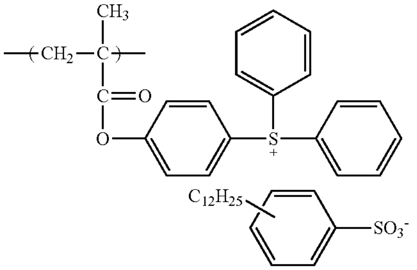
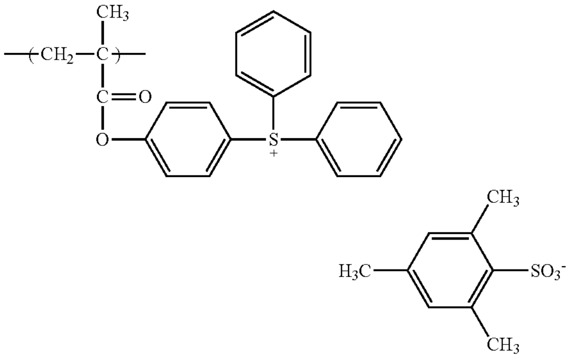
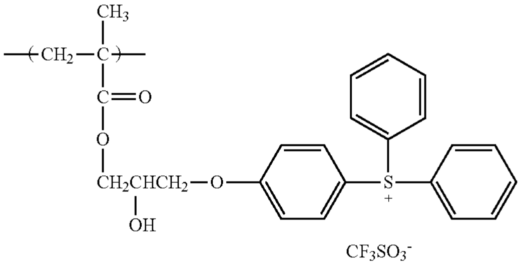
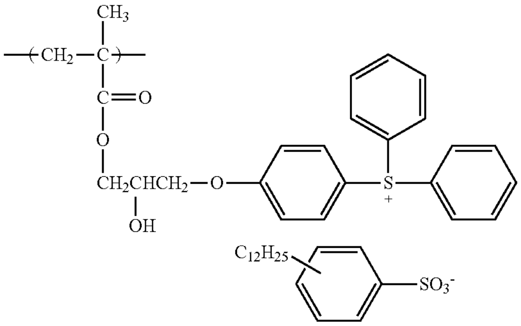
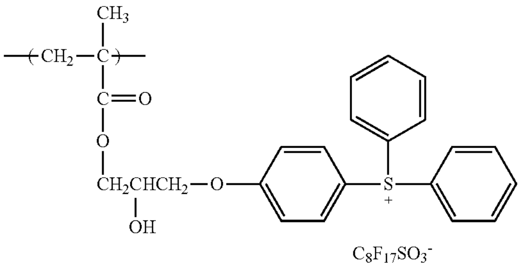
-continued
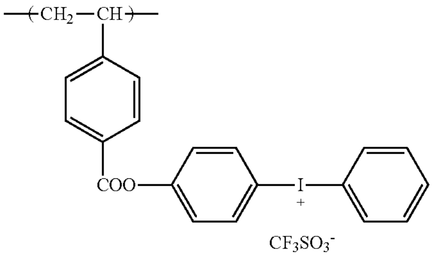
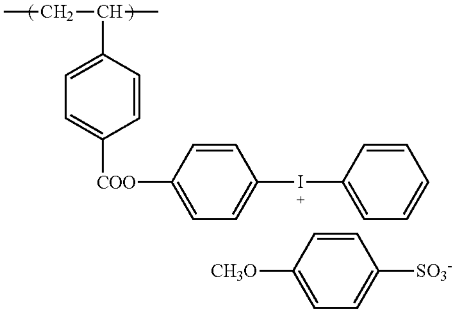
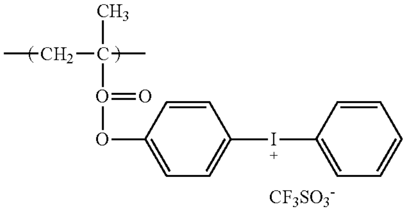
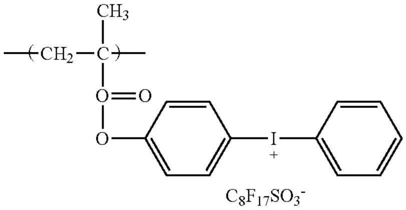
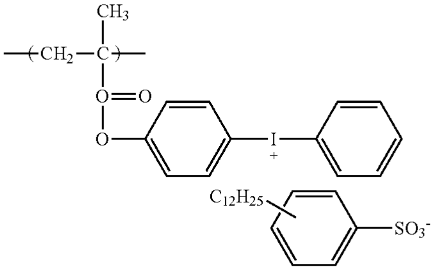
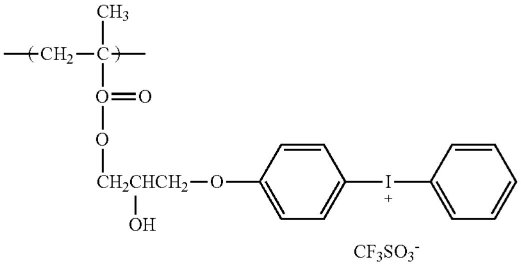

-continued
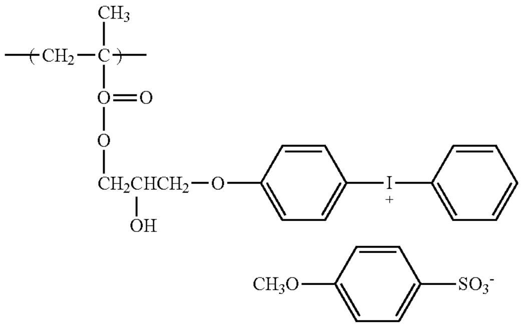
-continued
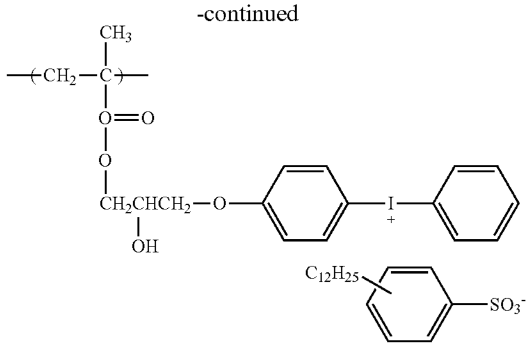
Specific examples of the resin (Ap) containing both (a) an acid-decomposable repeating unit and (b) a repeating unit having a structure capable of generating an acid upon irradiation with an actinic ray or radiation are set forth below, but the present invention is not limited thereto.
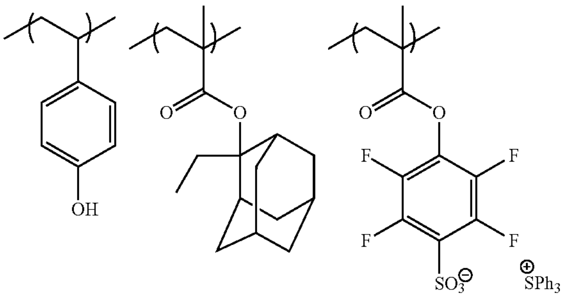
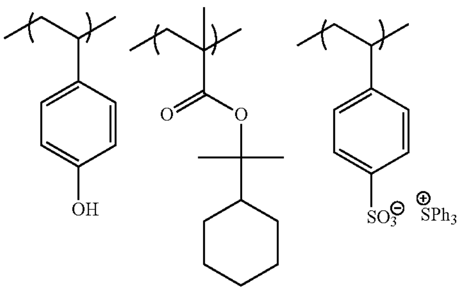
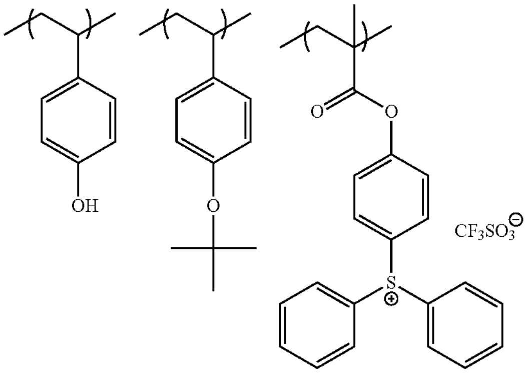
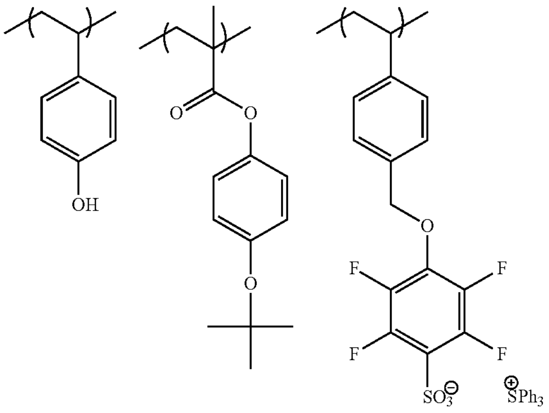
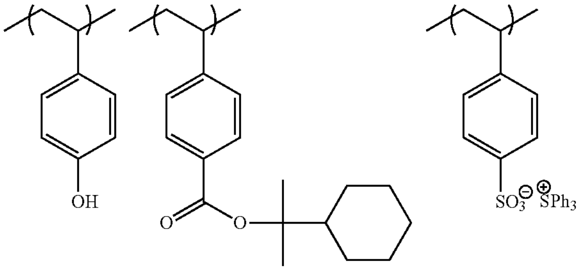
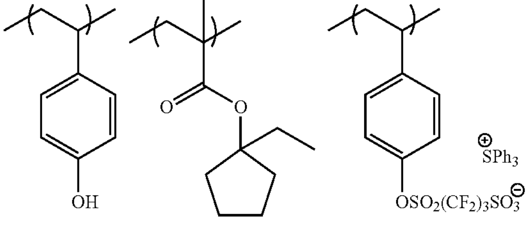

-continued
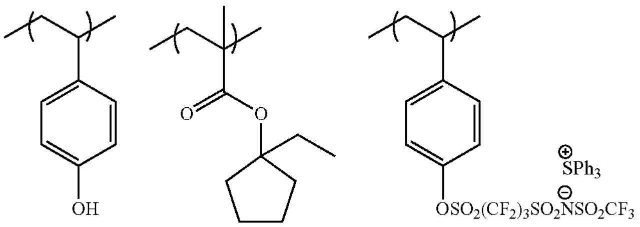
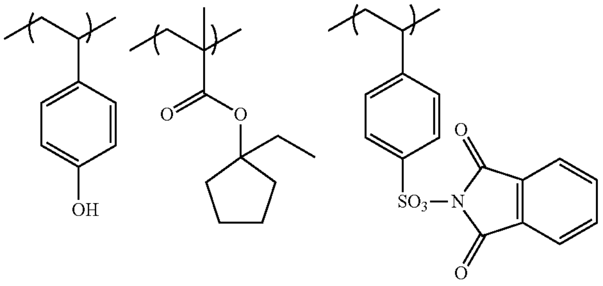
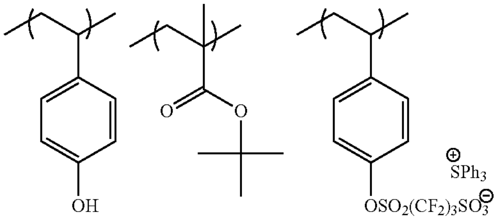
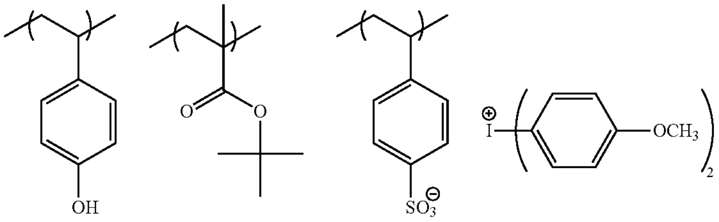
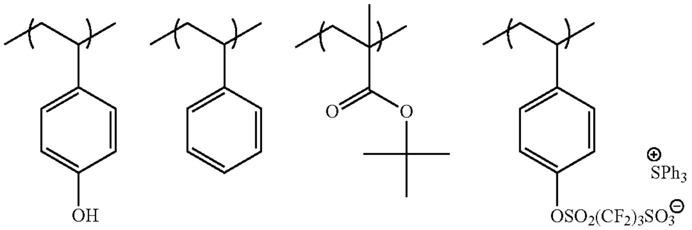
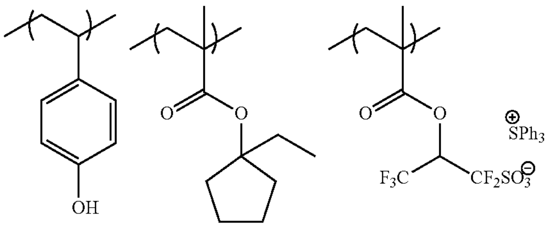
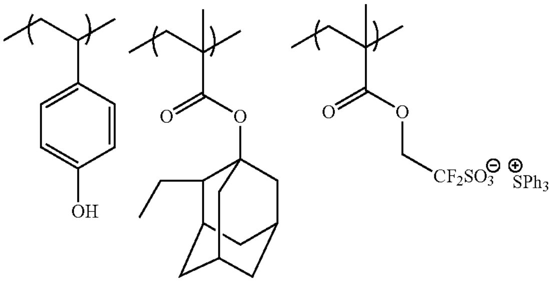
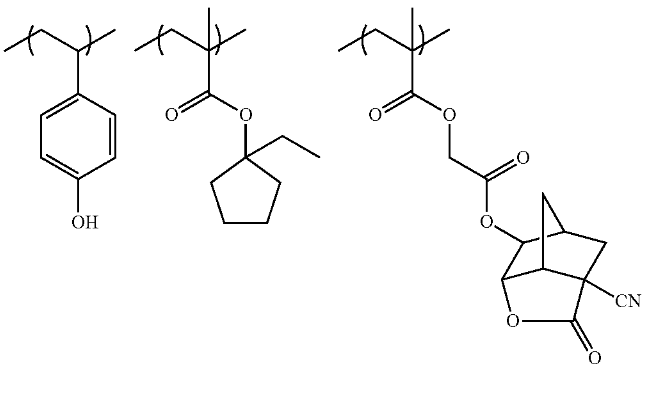
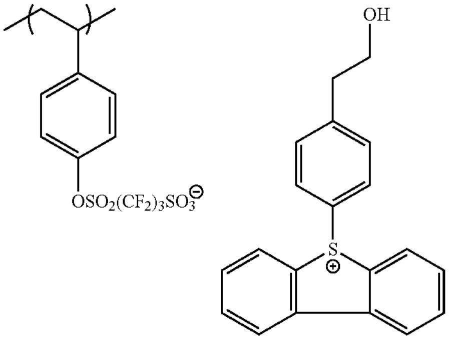

-continued

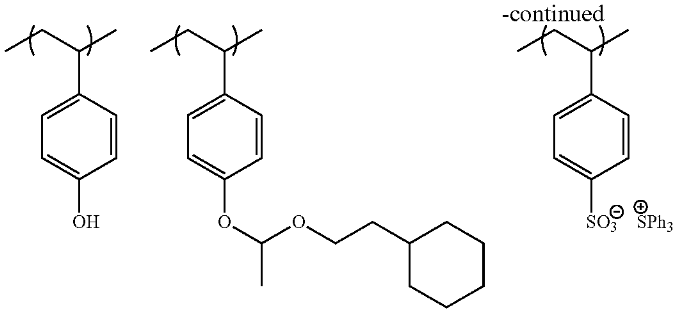

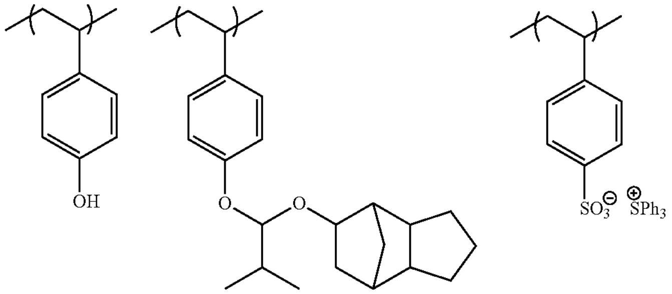

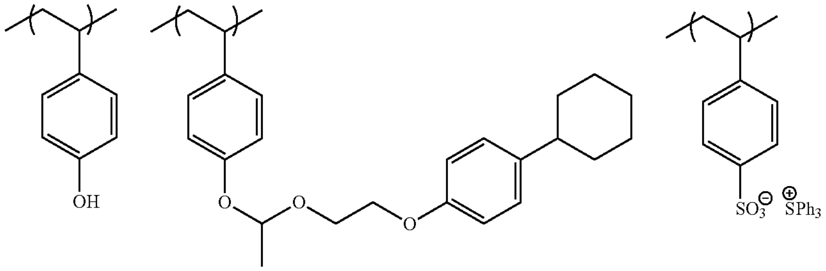

In the composition of the present invention, an alkali-soluble resin containing no acid-decomposable group may be used together with the acid-decomposable resin, and thanks to this alkali-soluble resin, the sensitivity is enhanced. The alkali-soluble resin containing no acid-decomposable group (hereinafter simply referred to as an "alkali-soluble resin") is a resin soluble in an alkali, and preferred examples thereof include polyhydroxystyrene and derivatives thereof. A p-hydroxystyrene unit-containing copolymerized resin may also be used if it is alkali-soluble. Above all, poly(p-hydroxystyrene), a poly(p/m-hydroxystyrene) copolymer, a poly(p/o-hydroxystyrene) copolymer and a poly(p-hydroxystyrene-styrene) copolymer are preferably used. In addition, a poly(alkyl-substituted hydroxystyrene) resin such as poly(4-hydroxy-3-methylstyrene) resin and poly(4-hydroxy-3,5-dimethylstyrene) resin, or a resin where phenolic hydroxyl groups of the resin above are partially alkylated or acetylated, may also be preferably used if it is alkali-soluble.

Particularly preferred alkali-soluble resins for use in the present invention are an alkali-soluble resin having a p-hydroxystyrene unit (preferably poly(p-hydroxystyrene), a poly(p/m-hydroxystyrene) copolymer, a poly(p/o-hydroxystyrene) copolymer and a poly(p-hydroxystyrene-styrene) copolymer), a poly(alkyl-substituted hydroxystyrene) resin such as poly(4-hydroxy-3-methylstyrene) resin and poly(4-hydroxy-3,5-dimethylstyrene) resins, a resin where phenolic hydroxyl groups of the resin above are partially alkylated or acetylated, a partially hydrogenated polyhydroxystyrene resin, a polyhydroxystyrene resin, and a partially hydrogenated novolak resin.

In the present invention, the polyhydroxystyrene indicates a polymer obtained by polymerizing at least one monomer selected from a p-hydroxystyrene monomer, an m-hydroxystyrene monomer, an o-hydroxystyrene monomer and a hydroxystyrene monomer where the monomer above is substituted with an alkyl group having a carbon number of 1 to 4 at the ortho position with respect to the bonding position of the hydroxyl group. (B) Compound capable of generating an acid upon irradiation with an actinic ray or radiation (hereinafter sometimes referred to as an "acid generator")

The composition of the present invention preferably contains a compound capable of generating an acid upon irradiation with an actinic ray or radiation. The acid generator which can be used may be appropriately selected from a photo-initiator for cationic photopolymerization, a photo-initiator for radical photopolymerization, a photo-decoloring agent for dyes, a photo-discoloring agent, a known compound that generates an acid and is used in microresist and the like, and a mixture thereof.

Examples thereof include a diazonium salt, a phosphonium salt, a sulfonium salt, an iodonium salt, imidosulfonate, oxime sulfonate, diazodisulfone, disulfone and o-nitrobenzyl sulfonate.

Also, a compound where such a group or compound capable of generating an acid upon irradiation with an actinic ray or radiation is introduced into the main or side chain of the polymer, for example, compounds described in U.S. Pat. No. 3,849,137, German Patent 3,914,407, JP-A-63-26653, JP-A-55-164824, JP-A-62-69263, JP-A-63-146038, JP-A-63-163452, JP-A-62-153853 and JP-A-63-146029, may be used.

Furthermore, compounds capable of generating an acid by the effect of light described, for example, in U.S. Pat. No. 3,779,778 and European Patent 126,712 may also be used.

Preferred acid generators include compounds represented by the following formulae (ZI), (ZII) and (ZIII):

ZI

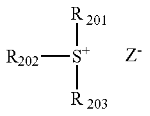

ZII

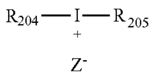

ZIII

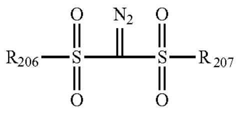

In formula (ZI), each of $R_{201}$/ $R_{202}$ and $R_{203}$ independently represents an organic group.

The carbon number of the organic group as $R_{201}$, $R_{202}$ and $R_{203}$ is generally from 1 to 30, preferably from 1 to 20.

Two members out of $R_{201}$ to $R_{203}$ may combine with each other through a single bond or a divalent linking group to form a ring structure, and the ring may contain an oxygen atom, a sulfur atom, an ester bond, an amide bond or a carbonyl group. For example, a single bond, an alkylene group (e.g., methylene, ethylene), an ether group, a thioether group, a carbonyl group and a sulfonyl group are preferred. When two members out of $R_{201}$ to $R_{203}$ are combined through a single bond or a divalent linking group to form a ring structure, this can be expected to bring about reduction of contamination in the exposure machine or elevation of sensitivity due to a rise in the ability of trapping an actinic ray or radiation.

$Z^-$ represents a non-nucleophilic anion.

Examples of the non-nucleophilic anion as $Z^-$ include sulfonate anion, carboxylate anion, sulfonylimide anion, bis(alkylsulfonyl)imide anion and tris(alkylsulfonyl)methyl anion.

The non-nucleophilic anion is an anion having an extremely low ability of causing a nucleophilic reaction, and this anion can suppress the decomposition with aging due to an intramolecular nucleophilic reaction. Thanks to this anion, the aging stability of the resist is enhanced.

Examples of the sulfonate anion include an aliphatic sulfonate anion, an aromatic sulfonate anion and a camphorsulfonate anion.

Examples of the carboxylate anion include an aliphatic carboxylate anion, an aromatic carboxylate anion and an aralkylcarboxylate anion.

The aliphatic moiety in the aliphatic sulfonate anion may be an alkyl group or a cycloalkyl group but is preferably an alkyl group having a carbon number of 1 to 30 or a cycloalkyl group having a carbon number of 3 to 30, and examples thereof include a methyl group, an ethyl group, a propyl group, an isopropyl group, an n-butyl group, an isobutyl group, a sec-butyl group, a pentyl group, a neopentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group, an eicosyl group, a cyclopropyl group, a cyclopentyl group, a cyclohexyl group, an adamantyl group, a norbornyl group and a boronyl group.

The aromatic group in the aromatic sulfonate anion is preferably an aryl group having a carbon number of 6 to 14, and examples thereof include a phenyl group, a tolyl group and a naphthyl group.

The alkyl group, cycloalkyl group and aryl group in the aliphatic sulfonate anion and aromatic sulfonate anion may have a substituent. Examples of the substituent of the alkyl group, cycloalkyl group and aryl group in the aliphatic sulfonate anion and aromatic sulfonate anion include a nitro group, a halogen atom (e.g., fluorine, chlorine, bromine, iodine), a carboxyl group, a hydroxyl group, an amino group, a cyano group, an alkoxy group (preferably having a carbon number of 1 to 5), a cycloalkyl group (preferably having a carbon number of 3 to 15), an aryl group (preferably having a carbon number of 6 to 14), an alkoxycarbonyl group (preferably having a carbon number of 2 to 7), an acyl group (preferably having a carbon number of 2 to 12), and an alkoxycarbonyloxy group (preferably having a carbon number of 2 to 7). As for the aryl group or ring structure in each group, examples of the substituent further include an alkyl group (preferably having a carbon number of 1 to 15).

Examples of the aliphatic moiety in the aliphatic carboxylate anion include the same alkyl group and cycloalkyl group as those in the aliphatic sulfonate anion.

Examples of the aromatic group in the aromatic carboxylate anion include the same aryl group as that in the aromatic sulfonate anion.

The aralkyl group in the aralkylcarboxylate anion is preferably an aralkyl group having a carbon number of 6 to 12, and examples thereof include a benzyl group, a phenethyl group, a naphthylmethyl group, and a naphthylethyl group.

The alkyl group, cycloalkyl group, aryl group and aralkyl group in the aliphatic carboxylate anion, aromatic carboxylate anion and aralkylcarboxylate anion may have a substituent. Examples of the substituent of the alkyl group, cycloalkyl group, aryl group and aralkyl group in the aliphatic carboxylate anion, aromatic carboxylate anion and aralkylcarboxylate anion include the same halogen atom, alkyl group, cycloalkyl group, alkoxy group and alkylthio group as those in the aromatic sulfonate anion.

Examples of the sulfonylimide anion include saccharin anion.

The alkyl group in the bis(alkylsulfonyl)imide anion and tris(alkylsulfonyl)methyl anion is preferably an alkyl group having a carbon number of 1 to 5, and examples thereof include a methyl group, an ethyl group, a propyl group, an isopropyl group, an n-butyl group, an isobutyl group, a sec-butyl group, a pentyl group and a neopentyl group. Examples of the substituent of such an alkyl group include a halogen atom, a halogen atom-substituted alkyl group, an alkoxy group and an alkylthio group, with a fluorine atom-substituted alkyl group being preferred.

Other examples of the non-nucleophilic anion include fluorinated phosphorus, fluorinated boron and fluorinated antimony.

The non-nucleophilic anion of $Z^-$ is preferably an aliphatic sulfonate anion substituted with a fluorine atom at the α-position of the sulfonic acid, an aromatic sulfonate anion substituted with a fluorine atom or a fluorine atom-containing group, a bis(alkylsulfonyl)imide anion in which the alkyl group is substituted with a fluorine atom, or a tris(alkylsulfonyl)methide anion in which the alkyl group is substituted with a fluorine atom. The non-nucleophilic anion is more preferably a perfluoroaliphatic sulfonate anion having a carbon number of 4 to 8 or a benzenesulfonate anion having a fluorine atom, still more preferably nonafluorobutanesulfonate anion, perfluorooctanesulfonate anion, pentafluorobenzenesulfonate anion or 3,5-bis(trifluoromethyl)benzenesulfonate anion.

Examples of the organic group as $R_{201}$, $R_{202}$ and $R_{203}$ include the corresponding groups in the compound (ZI-1) described later.

The compound may be a compound having a plurality of structures represented by formula (ZI), for example, a compound having a structure where at least one of $R_{201}$ to $R_{203}$ in the compound represented by formula (ZI) is bonded to at least one of $R_{201}$ to $R_{203}$ in another compound represented by formula (ZI).

The component (ZI) is more preferably a compound (ZI-1) described below.

The compound (ZI-1) is an arylsulfonium compound where at least one of $R_{201}$ to $R_{203}$ in formula (ZI) is an aryl group, that is, a compound having an arylsulfonium as the cation.

In the arylsulfonium compound, all of $R_{201}$ to $R_{203}$ may be an aryl group or a part of $R_{201}$ to $R_{203}$ may be an aryl group with the remaining being an alkyl group or a cycloalkyl group.

Examples of the arylsulfonium compound include a triarylsulfonium compound, a diarylalkylsulfonium compound, an aryldialkylsulfonium compound, a diarylcycloalkylsulfonium compound and an aryldicycloalkylsulfonium compound.

The aryl group in the arylsulfonium compound is preferably a phenyl group or a naphthyl group, more preferably a phenyl group. The aryl group may be an aryl group having a heterocyclic structure containing an oxygen atom, a nitrogen atom, a sulfur atom or the like. Examples of the heterocyclic structure include pyrrole, furan, thiophene, indole, benzofuran and benzothiophene. In the case where the arylsulfonium compound has two or more aryl groups, these two or more aryl groups may be the same or different.

The alkyl or cycloalkyl group which is present, if desired, in the arylsulfonium compound is preferably a linear or branched alkyl group having a carbon number of 1 to 15 or a cycloalkyl group having a carbon number of 3 to 15, and examples thereof include a methyl group, an ethyl group, a propyl group, an n-butyl group, a sec-butyl group, a tert-butyl group, a cyclopropyl group, a cyclobutyl group and a cyclohexyl group.

The aryl group, alkyl group and cycloalkyl group of $R_{201}$ to $R_{203}$ may have, as the substituent, an alkyl group (for example, having a carbon number of 1 to 15), a cycloalkyl group (for example, having a carbon number of 3 to 15), an aryl group (for example, having a carbon number of 6 to 14), an alkoxy group (for example, having a carbon number of 1 to 15), a halogen atom, a hydroxyl group or a phenylthio group. The substituent is preferably a linear or branched alkyl group having a carbon number of 1 to 12, a cycloalkyl group having a carbon number of 3 to 12, or a linear, branched or cyclic alkoxy group having a carbon number of 1 to 12, more preferably an alkyl group having a carbon number of 1 to 4, or an alkoxy group having a carbon number of 1 to 4. The substituent may be substituted on any one of three members $R_{201}$ to $R_{203}$ or may be substituted on all of these three members. In the case where $R_{201}$ to $R_{203}$ are an aryl group, the substituent is preferably substituted at the p-position of the aryl group.

Incidentally, in the case where the aryl group, alkyl group or cycloalkyl group of $R_{201}$ to $R_{203}$ has, as the substituent, any one of an alkyl group, a cycloalkyl group, an aryl group and an alkoxy group, it is a preferred embodiment that such a substituent is further substituted with a hydroxyl group.

In formulae (ZII) and (ZIII), each of $R_{204}$ to $R_{207}$ independently represents an aryl group, an alkyl group or a cycloalkyl group.

The aryl group of $R_{204}$ to $R_{207}$ is preferably a phenyl group or a naphthyl group, more preferably a phenyl group. The aryl group of $R_{204}$ to $R_{207}$ may be an aryl group having a heterocyclic structure containing an oxygen atom, a nitrogen atom, a sulfur atom or the like. Examples of the heterocyclic structure include pyrrole, furan, thiophene, indole, benzofuran and benzothiophene.

The alkyl group and cycloalkyl group in $R_{204}$ to $R_{207}$ are preferably a linear or branched alkyl group having a carbon number of 1 to 10 (e.g., methyl, ethyl, propyl, butyl, pentyl) and a cycloalkyl group having a carbon number of 3 to 10 (e.g., cyclopentyl, cyclohexyl, norbornyl).

The aryl group, alkyl group and cycloalkyl group of $R_{204}$ to $R_{207}$ may have a substituent. Examples of the substituent which the aryl group, alkyl group and cycloalkyl group of $R_{204}$ to $R_{207}$ may have include an alkyl group (for example, having a carbon number of 1 to 15), a cycloalkyl group (for example, having a carbon number of 3 to 15), an aryl group (for example, having a carbon number of 6 to 15), an alkoxy group (for example, having a carbon number of 1 to 15), a halogen atom, a hydroxyl group and a phenylthio group.

$Z^-$ represents a non-nucleophilic anion, and examples thereof are the same as those of the non-nucleophilic anion of r in formula (ZI).

Other examples of the compound capable of generating an acid upon irradiation with an actinic ray or radiation, which can be used, include compounds represented by the following formulae (ZIV), (ZV) and (ZVI):

$$Ar_3—SO_2—SO_2—Ar_4$$ ZIV

ZV

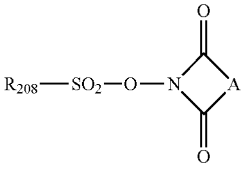

ZVI

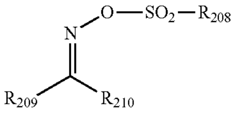

In formulae (ZIV) to (ZVI), each of $Ar_3$ and $Ar_4$ independently represents an aryl group.

Each of $R_{208}$, $R_{209}$ and $R_{210}$ independently represents an alkyl group, a cycloalkyl group or an aryl group.

A represents an alkylene group, an alkenylene group or an arylene group.

Specific examples of the aryl group of $Ar_3$, $Ar_4$, $R_{208}$, $R_{209}$ and $R_{210}$ are the same as specific examples of the aryl group as $R_{201}$, $R_{202}$ and $R_{203}$ in formula (ZI).

Specific examples of the alkyl group and cycloalkyl group of $R_{208}$, $R_{209}$ and $R_{210}$ are the same as specific examples of the alkyl group and cycloalkyl group as $R_{201}$, $R_{202}$ and $R_{203}$ in formula (ZI).

Examples of the alkylene group of A include an alkylene group having a carbon number of 1 to 12 (e.g., methylene, ethylene, propylene, isopropylene, butylene, isobutylene); examples of the alkenylene group of A include an alkenylene group having a carbon number of 2 to 12 (e.g., ethynylene, propenylene, butenylene); and examples of the arylene group of A include an arylene group having a carbon number of 6 to 10 (e.g., phenylene, tolylene, naphthylene).

Among the compounds capable of generating and acid upon irradiation with an actinic ray or radiation, more preferred are the compounds represented by formulae (ZI) to (ZIII). The acid generator is preferably a compound that generates an acid having one sulfonic acid group or imide group, more preferably a compound that generates a monovalent perfluoroalkanesulfonic acid, a compound that generates an aromatic sulfonic acid substituted with a monovalent fluorine atom or a fluorine atom-containing group, or a compound that generates an imide acid substituted with a monovalent fluorine atom or a fluorine atom-containing group, still more preferably a sulfonium salt of fluoro-substituted alkanesulfonic acid, fluorine-substituted benzenesulfonic acid, fluorine-substituted imide acid or fluorine-substituted methide acid. In particular, the acid generator which can be used is preferably a compound that generates a fluoro-substituted alkanesulfonic acid, a fluoro-substituted benzenesulfonic acid or a fluoro-substituted imide acid, where pKa of the acid generated is −1 or less, and in this case, the sensitivity can be enhanced.

In the present invention, it is particularly preferred to use, as the acid generator, a compound capable of generating an acid represented by the following formula (a) upon irradiation with an actinic ray or radiation.

(a)

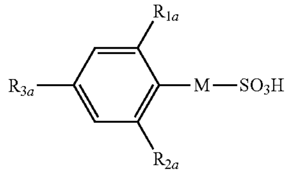

In formula (a), each of $R_{1a}$, $R_{2a}$ and $R_{3a}$ independently represents an alkyl group or a cycloalkyl group, and M represents a single bond or a divalent linking group.

The alkyl group represented by $R_{1a}$, $R_{2a}$ and $R_{1a}$ may be linear or branched, and examples thereof include an n-propyl group, an isopropyl group, an n-butyl group, an isobutyl group, an isoamyl group, a tert-amyl group, an n-pentyl group, an n-hexyl group, an n-decyl group and an n-dodecyl group. The carbon number does not have any particular upper limit but is preferably 15 or less, more preferably 12 or less.

Examples of the cycloalkyl group represented by $R_{1a}$, $R_{2a}$ and $R_{1a}$ include a cyclopropyl group, a cyclobutyl group, a cyclopentyl group, a cyclohexyl group, a norbornyl group and an adamantyl group. The carbon number is not particularly limited but is preferably from 5 to 10.

Each of $R_{1a}$, $R_{2a}$ and $R_{3a}$ is preferably a branched alkyl group or a cycloalkyl group. The carbon number is preferably 3 or more, more preferably from 3 to 12, still more preferably from 3 to 10.

The alkyl group or cycloalkyl group of $R_{1a}$, $R_{2a}$ and $R_{3a}$ may further have a substituent.

Examples of the substituent which the alkyl group as $R_{1a}$, $R_{2a}$ and $R_{3a}$ may further have include a halogen atom such as fluorine atom, chlorine atom, bromine atom and iodine atom; an alkoxy group such as methoxy group, ethoxy group and tert-butoxy group; an aryloxy group such as phenoxy group and p-tolyloxy group; an alkylthioxy group such as methylthioxy group, ethylthioxy group and tert-butylthioxy group; an arylthioxy group such as phenylthioxy group and p-tolylthioxy group; an alkoxycarbonyl group such as methoxycarbonyl group, butoxycarbonyl group and phenoxycarbonyl group; an acetoxy group; a cycloalkyl group such as cyclohexyl group; an alkenyl group such as vinyl group, propenyl group and hexenyl group; an acetylene group; an alkynyl group such as propynyl group and hexynyl group; an aryl group such as phenyl group and tolyl group; a hydroxy group; a carboxy group; a sulfonic acid group; and a carbonyl group.

Examples of the substituent which the cycloalkyl group as $R_{1a}$, $R_{2a}$ and $R_{3a}$ may further have include a linear alkyl group such as methyl group, ethyl group, propyl group, butyl group, heptyl group, hexyl group and dodecyl group; a branched alkyl group such as 2-ethylhexyl group; and examples above of the substituent which the alkyl group as $R_{1a}$, $R_{2a}$ and $R_{3a}$ may further have.

The divalent linking group represented by M is preferably a divalent linking group represented by the following formula:

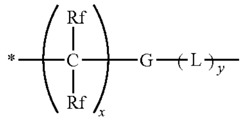

(* indicates a site at which the sulfonic acid is bonded).

In the formula, each Rf independently represents a fluorine atom or an alkyl group substituted with at least one fluorine atom, and x represents an integer of 1 or more.

G represents a single bond, an alkylene group which may contain an ether oxygen, a cycloalkylene group which may contain an ether oxygen, an arylene group, or a group formed by combining these groups, and the groups combined may be connected through an oxygen atom.

L represents a single bond or a divalent linking group, and y represents an integer of 0 or more.

When each of x and y is 2 or more, each Rf-C-Rf or L in the parenthesis may be the same as or different from every other Rf-C-Rf or L.

Rf is preferably, for example, a fluorine atom, $CF_3$, $C_2F_5$, $C_3F_7$, $C_4F_9$, $C_5F_{11}$, $C_6F_{13}$, $C_2F_{15}$, $C_8F_{17}$, $CH_2CF_3$, $CH_2CH_2C\ F_3$, $CH_2C_2F_5$, $CH_2CH_2C_2F_5$, $CH_2C_3F_7$, $CH_2CH_2C_3F_7$, $CH_2C_4F_9$ or $CH_2CH_2C_4F_9$, more preferably a fluorine atom or a perfluoroalkyl group having a carbon number of 1 to 4, still more preferably a fluorine atom or $CF_3$, and most preferably a fluorine atom.

x is preferably an integer of 1 to 8, more preferably from 1 to 4.

The alkylene group or cycloalkylene group represented by G is preferably a linear, branched or cyclic alkylene group having a carbon number of 1 to 20, more preferably from 1 to 10 (e.g., methylene, ethylene, propylene, 1,4-cyclohexylene), in which hydrogen atoms bonded to carbon may be partially or entirely replaced by a fluorine atom and which may contain an ether oxygen.

The arylene group represented by G is preferably an arylene group having a carbon number of 6 to 20, more preferably from 1 to 10 (e.g., phenylene, naphthylene), in which hydrogen atoms bonded to carbon may be partially or entirely replaced by a fluorine atom. One of these alkylene, cycloalkylene and arylene groups may be used alone, or a plurality thereof may be used in combination. In this case, such alkylene, cycloalkylene and arylene groups may be combined through an oxygen atom.

L represents a single bond or a divalent linking group. Examples of the divalent linking group include —CO—, —O—, —S—, —SO—, —$SO_2$—, —NH—, an alkylene group, a cycloalkylene group and an alkenylene group. y is preferably an integer of 0 to 4, more preferably an integer of 1 to 2.

In the present invention, the acid generator is preferably an onium salt compound. Also, two or more kinds of these compounds may be mixed.

The content of the acid generator is usually from 1 to 40 mass %, preferably from 3 to 30 mass %, more preferably from 5 to 25 mass %, based on the entire solid content (components excluding the coating solvent) of the resist composition of the present invention. In particular, when the resin (A) contains a structure represented by formula (I) or (II), the resist composition of the present invention contains an acid generator and at the same time, the content of the acid generator is preferably from 5 to 25 mass %, more preferably from 9 to 17 mass %, still more preferably from 9 to 13 mass %, based on the entire solid content of the resist composition of the present invention.

If the content of the acid generator is less than 1 mass %, the sensitivity is liable to become low, whereas if the amount of the acid generator added exceeds 40 mass %, the sensitivity tends to be lowered due to decrease in the amount of the polymer component. For these reasons, the content of the acid generator is preferably in the range above.

Incidentally, one kind of an acid generator may be used alone, or two or more kinds of acid generators may be used in combination.

Specific examples of the acid generator which can be used in the present invention are set forth below, but the present invention is not limited thereto.

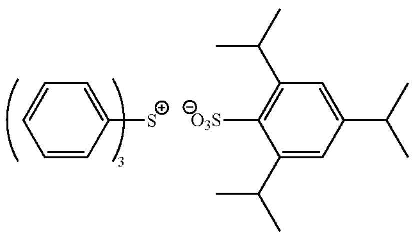

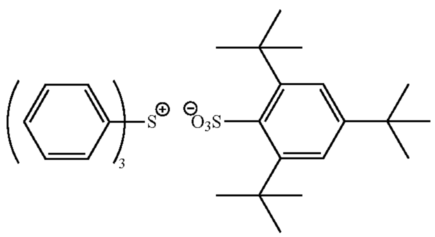

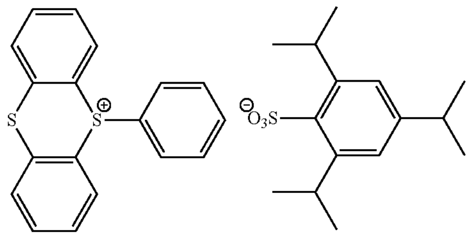

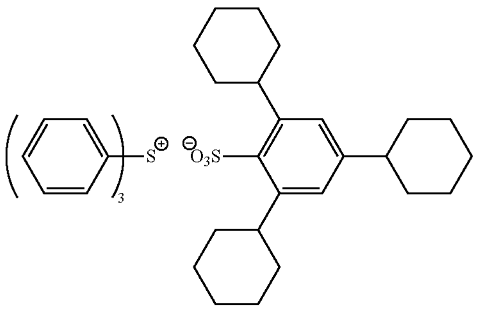

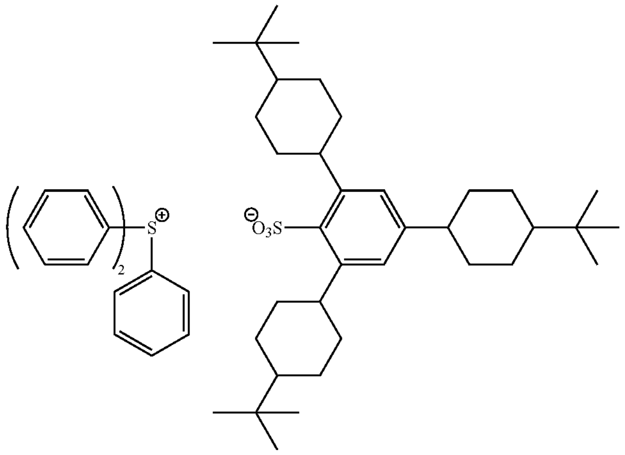

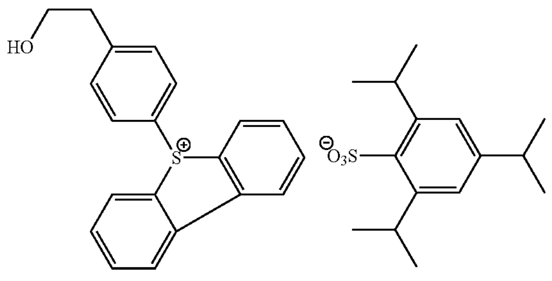

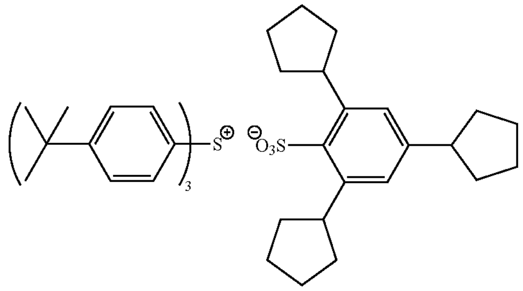

-continued
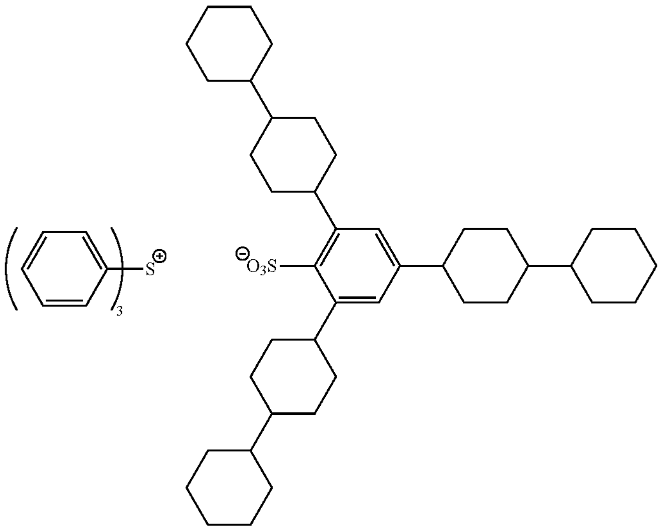
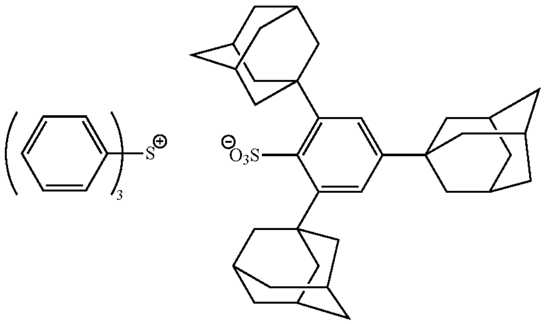
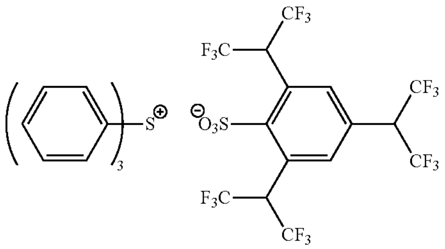
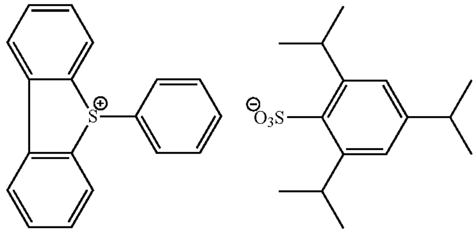
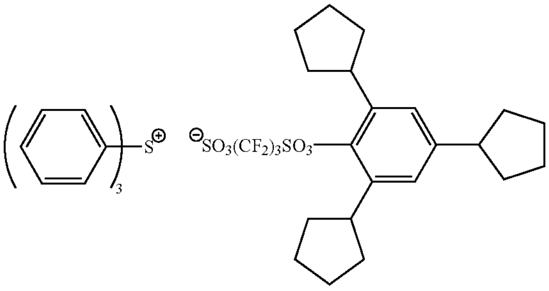
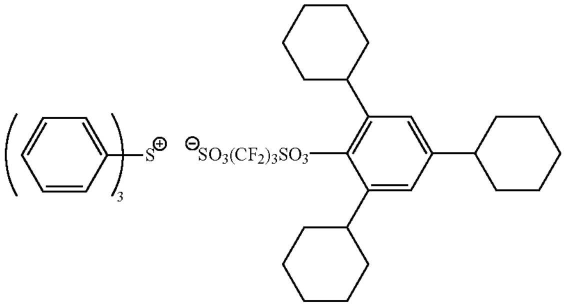
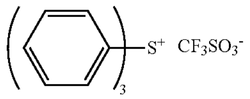
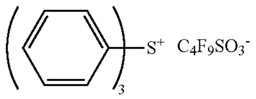
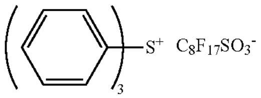
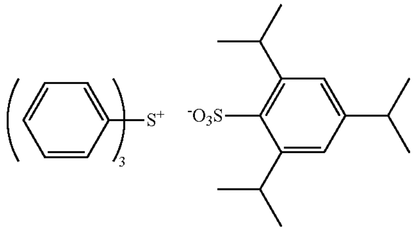
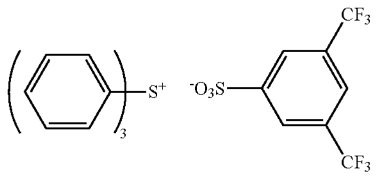

-continued
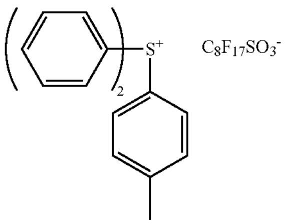
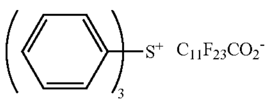
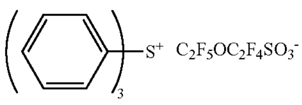
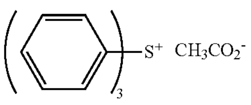
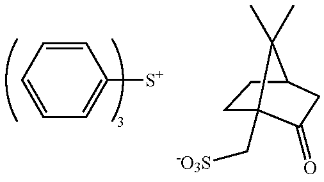
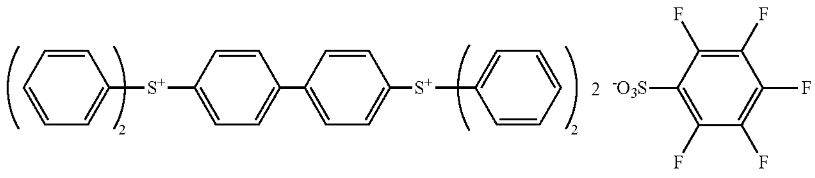
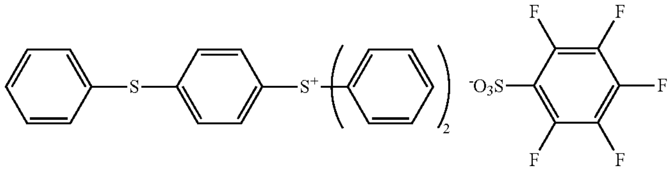
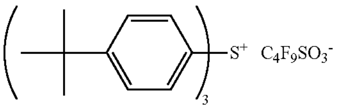
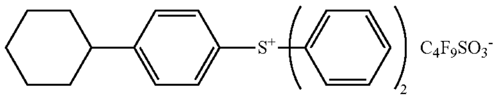
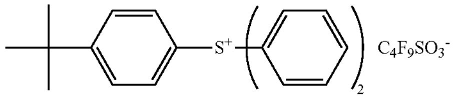
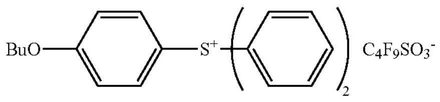
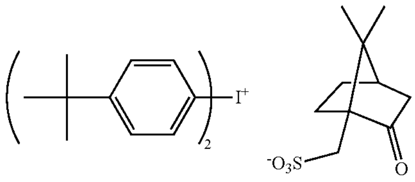
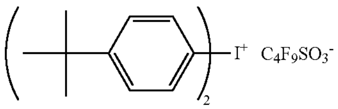
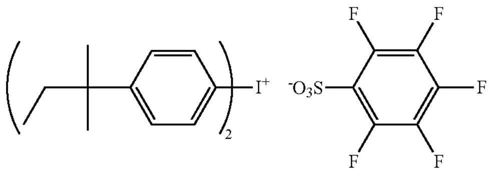
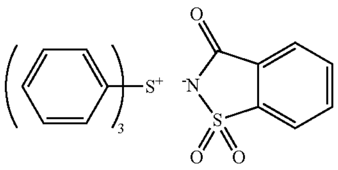
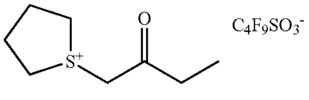
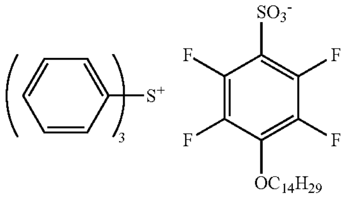
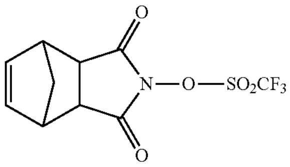
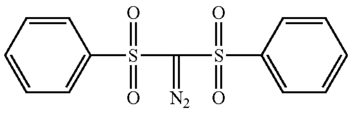
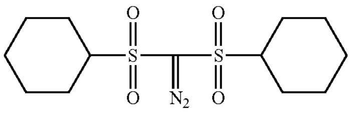
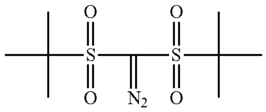
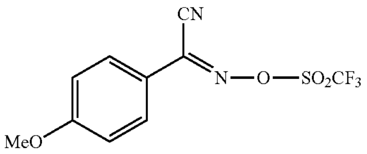

-continued
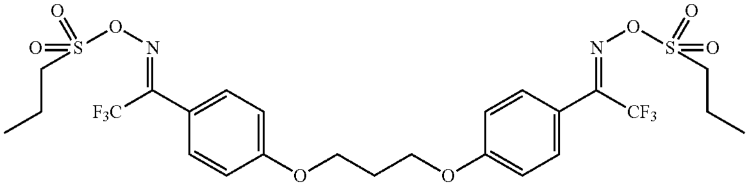
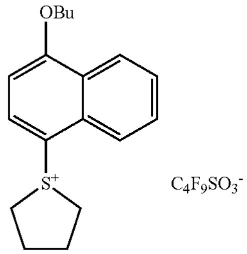
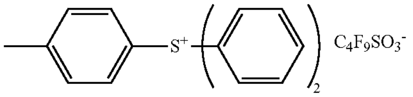
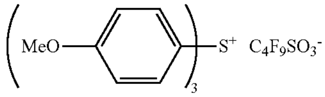
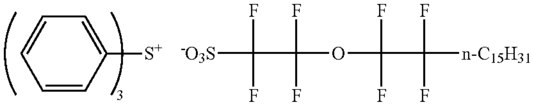
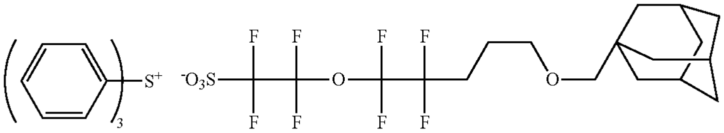
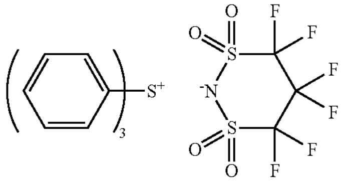
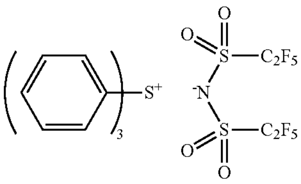
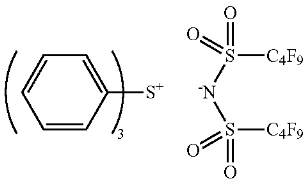
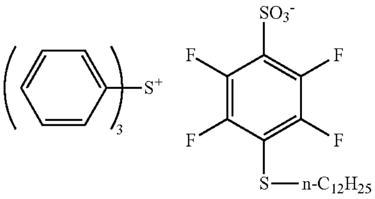
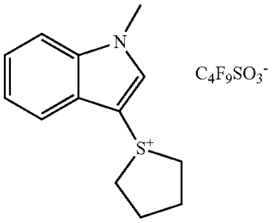
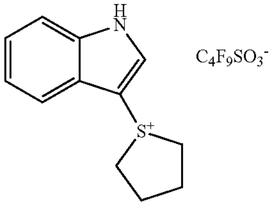
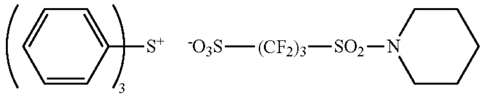
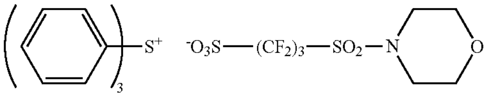
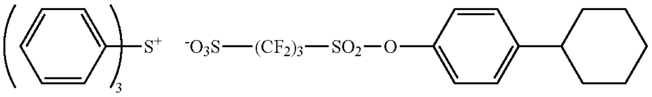
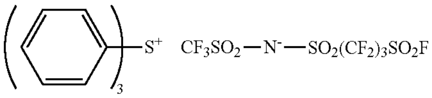
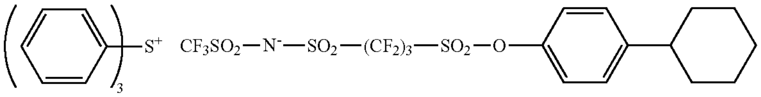
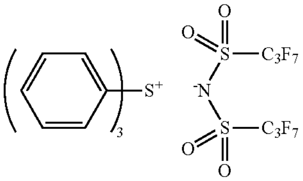
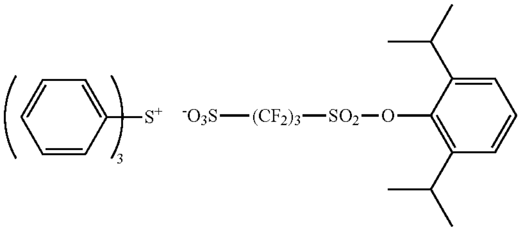
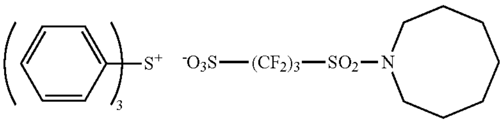

-continued
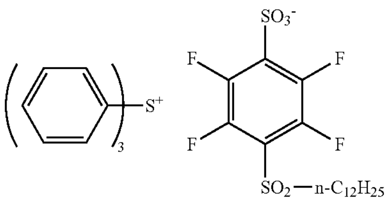
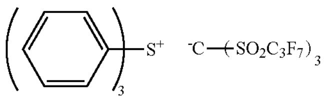
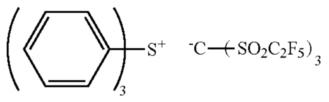
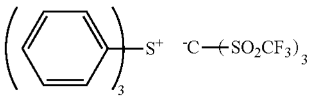
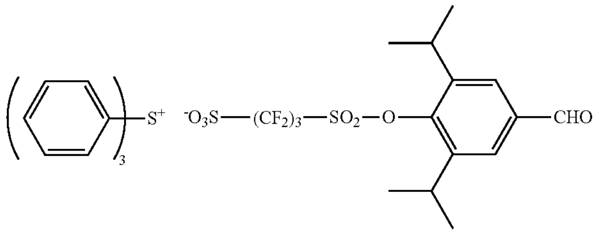
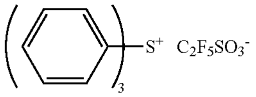
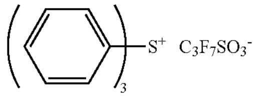
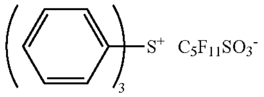
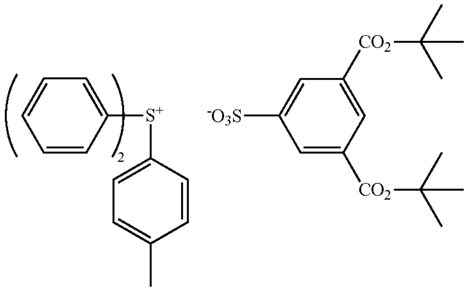
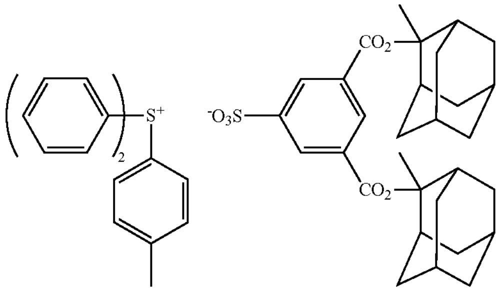
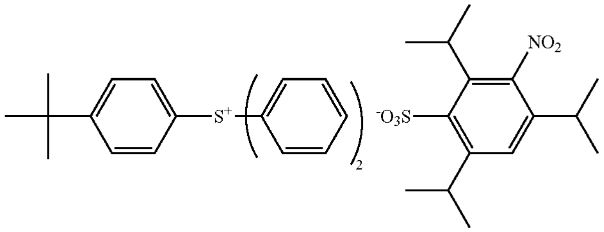
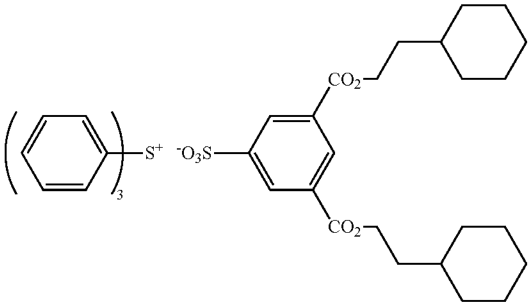
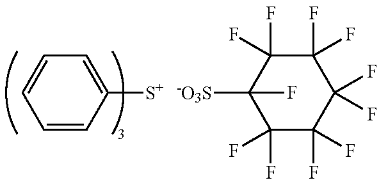
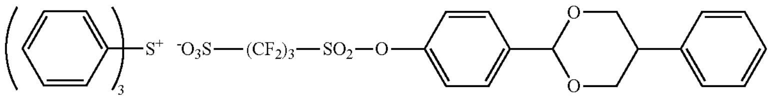
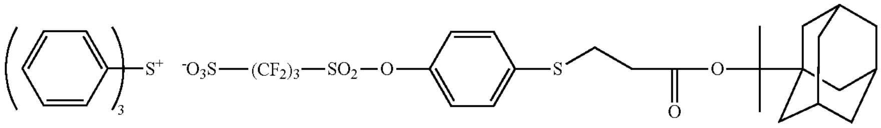
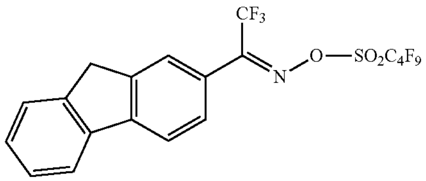
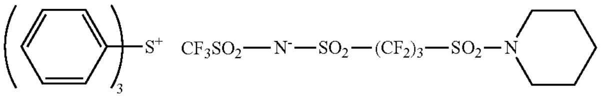

-continued

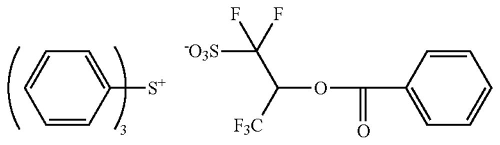

(C) Organic Basic Compound

In the composition of the present invention, an organic basic compound may be used. Thanks to this compound, enhancement of stability during storage and reduction in the change of line width due to PED can be advantageously achieved. The organic basic compound which can be used in the present invention is preferably a compound having basicity stronger than that of phenol. Above all, a nitrogen-containing basic compound is preferred. The organic basic compound includes, in terms of preferred chemical environment, compounds having a structure of the following formulae (A) to (G) (each of formulae (B) to (E) is a partial structure).

(A)

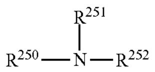

(B)

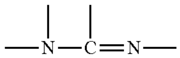

(C)

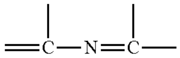

(D)

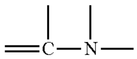

(E)

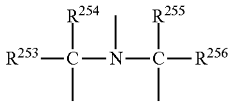

(F)

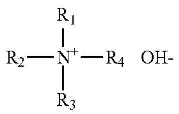

(G)

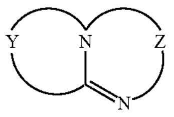

In formula (A), each of $R_{250}$, $R_{251}$ and $R_{252}$ independently represents a hydrogen atom, an alkyl group (preferably having a carbon number of 1 to 20), a cycloalkyl group (preferably having a carbon number of 3 to 20), or an aryl group (preferably having a carbon number of 6 to 20), and $R^{250}$ and $R^{251}$ may combine together to form a ring.

These groups may have a substituent, and the alkyl group or cycloalkyl group having a substituent is preferably an aminoalkyl group having a carbon number of 1 to 20, an aminocycloalkyl group having a carbon number of 3 to 20, a hydroxyalkyl group having a carbon number of 1 to 20, or a hydroxycycloalkyl group having a carbon number of 3 to 20.

Also, each of these groups may contain an oxygen atom, a sulfur atom or a nitrogen atom in the alkyl chain.

In formulae (E) and (F), each of $R^{253}$, $R^{254}$, $R^{255}$, $R^{256}$, $R_1$, $R_2$, $R_3$ and $R_4$ independently represents an alkyl group (preferably having a carbon number of 1 to 6) or a cycloalkyl group (preferably having a carbon number of 3 to 6).

In formula (G), Y represents —$(CRaRb)_{ny}$—, and Z represents —$(CRaRb)_{nz}$—.

Each of Ra and Rb independently represents a hydrogen atom, an alkyl group (preferably an alkyl group having a carbon number of 1 to 10, e.g., methyl, ethyl, propyl, butyl), a cycloalkyl group (preferably a cycloalkyl group having a carbon number of 3 to 12, e.g., cyclopropyl, cyclobutyl, cyclopentyl, cyclohexyl), or an aryl group (preferably an aryl group having a carbon number of 6 to 15, e.g., phenyl, naphthyl), and these alkyl, cycloalkyl and aryl groups may have a substituent. Each of ny and nz independently represents an integer of 2 to 10. Each of Ra and Rb is preferably a hydrogen atom, ny is preferably an integer of 2 to 6, more preferably an integer of 3 to 5, and nz is preferably an integer of 2 to 4, more preferably 2 or 3.

Preferred examples of the compound include guanidine, aminopyrrolidine, pyrazole, pyrazoline, piperazine, aminomorpholine, aminoalkylmorpholine and piperidine, and these compounds may have a substituent. More preferred examples of the compound include a compound having an imidazole structure, a diazabicyclo structure, an onium hydroxide structure, an onium carboxylate structure, a trialkylamine structure, an aniline structure or a pyridine structure; an alkylamine derivative having a hydroxyl group and/or an ether bond; and an aniline derivative having a hydroxyl group and/or an ether bond. A compound having an onium hydroxide structure (particularly preferably a tetraalkylammonium hydroxide such as tetrabutylammonium hydroxide) is preferred.

Examples of the compound having an imidazole structure include imidazole, 2,4,5-triphenylimidazole and benzimidazole. Examples of the compound having a diazabicyclo structure include 1,4-diazabicyclo[2,2,2]octane, 1,5-diazabicyclo[4,3,0]non-5-ene and 1,8-diazabicyclo[5,4,0]undec-7-ene. Examples of the compound having an onium hydroxide structure include a triarylsulfonium hydroxide, a phenacylsulfonium hydroxide, and a sulfonium hydroxide having a 2-oxoalkyl group, specifically, triphenylsulfonium hydroxide, tris(tert-butylphenyl)sulfonium hydroxide, bis(tert-butylphenyl)iodonium hydroxide, phenacylthiophenium hydroxide and 2-oxopropylthiophenium hydroxide. Examples of the compound having an onium carboxylate structure include a compound where the anion moiety of the compound having an onium hydroxide structure becomes a carboxylate, such as acetate, adamantane-1-carboxylate and perfluoroalkyl carboxylate. Examples of the compound having a trialkylamine structure include tri(n-butyl)amine and tri(n-octyl)amine. Examples of the aniline compound include 2,6-diisopropylaniline and N,N-dimethylaniline. Examples of the alkylamine derivative having a hydroxyl group and/or an ether bond include ethanolamine, diethanolamine, triethanolamine and tris(methoxyethoxyethyl)amine. Examples of the aniline derivative having a hydroxyl group and/or an ether bond include N,N-bis(hydroxyethyl)aniline.

The organic basic compound further includes at least one kind of a nitrogen-containing compound selected from a phenoxy group-containing amine compound, a phenoxy group-containing ammonium salt compound, a sulfonic acid ester group-containing amine compound, and a sulfonic acid ester group-containing ammonium salt compound.

As for the amine compound, a primary, secondary or tertiary amine compound can be used, and an amine compound where at least one alkyl group is bonded to the nitrogen atom is preferred. The amine compound is more preferably a tertiary amine compound. In the amine compound, as long as at least one alkyl group (preferably having a carbon number of 1 to 20) is bonded to the nitrogen atom, a cycloalkyl group (preferably having a carbon number of 3 to 20) or an aryl group (preferably having a carbon number of 6 to 12) may be bonded to the nitrogen atom in addition to the alkyl group.

The amine compound preferably has an oxygen atom in the alkyl chain to form an oxyalkylene group. The number of oxyalkylene groups within the molecule is 1 or more, preferably from 3 to 9, more preferably from 4 to 6. Among oxyalkylene groups, an oxyethylene group ($-CH_2CH_2O-$) and an oxypropylene group ($-CH(CH_3)CH_2O-$ or $-CH_2CH_2CH_2O-$) are preferred, and an oxyethylene group is more preferred.

As for the organic basic compound (C), one kind of a compound may be used alone, or two or more kinds of compounds may be used in combination.

The resist composition of the present invention may or may not contain a basic compound and in the case of containing a basic compound, the content thereof is usually from 0.001 to 10 mass %, preferably from 0.01 to 5 mass %, based on the entire solid content of the composition.

The molar ratio of the later-described photo-acid generator to the basic compound is preferably from 1.5 to 300. That is, the molar ratio is preferably 1.5 or more from the standpoint of enhancing the sensitivity and resolution, and is preferably 300 or less in terms of preventing the reduction in resolution due to thickening of the pattern after exposure before heat treatment. The molar ratio is more preferably from 2.0 to 200, still more preferably from 2.5 to 150.

In the case where the resin (A) contains at least one repeating unit selected from formulae (IV) to (VI), the amount of the photo-acid generator in the molar ratio above is based on the total amount of the repeating unit and the photo-acid generator.

(D) Organic Solvent

The resist composition of the present invention is prepared by dissolving the above-described components preferably in an organic solvent.

The entire solid content concentration in the resist composition is preferably from 1.0 to 5.0 mass %, more preferably from 1.5 to 3.5 mass %.

The entire solid content is the solid content excluding the solvent from the composition and corresponds to the mass after drying of the coating formed of the composition.

The solvent for the preparation of resist composition is preferably an organic solvent such as ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether (PGME; another name: 1-methoxy-2-propanol), propylene glycol monomethyl ether acetate (PGMEA; another name: 1-methoxy-2-acetoxypropane), toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethylsulfoxide, N-methylpyrrolidone and tetrahydrofuran, more preferably cyclohexanone, γ-butyrolactone, propylene glycol monomethyl ether, propylene glycol monomethyl ether acetate or ethyl lactate, still more preferably propylene glycol monomethyl ether.

The solvent may be one kind of a solvent alone or may be a mixed solvent obtained by mixing two or more kinds of solvents.

Out of the entire solvent amount, the content of propylene glycol monomethyl ether preferably occupies 50 mass % or more, and most preferably from 50 to 80 mass %. The solvent used in combination with propylene glycol monomethyl ether is preferably propylene glycol monomethyl ether acetate, cyclohexanone or ethyl acetate, and most preferably propylene glycol monomethyl ether acetate.

(E) Surfactant

The composition of the present invention preferably further contains a surfactant. The surfactant is preferably a fluorine- and/or silicon-containing surfactant. Examples of the surfactant coming under this type include Megaface FI76 and Megaface R08 produced by Dainippon Ink & Chemicals, Inc.; PF656 and PF6320 produced by OMNOVA; Troysol S-366 produced by Troy Chemical; Florad FC430 produced by Sumitomo 3M Inc.; and polysiloxane polymer KP-341 (produced by Shin-Etsu Chemical Co., Ltd.

A surfactant other than a fluorine- and/or silicon-containing surfactant may also be used. Specific examples thereof include polyoxyethylene alkyl ethers and polyoxyethylene alkylaryl ethers.

In addition, known surfactants can be appropriately used. Examples of the usable surfactant include surfactants described in paragraph [0273] et seq. of U.S. Patent Application Publication No. 2008/0248425 A1.

In particular, the surfactant for use in the present invention is preferably a surfactant having a structure represented by formula (II):

(II)

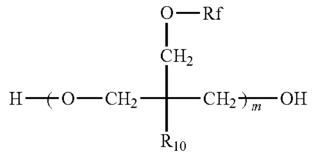

In formula (II), $R_{10}$ represents a hydrogen atom or an alkyl group,

Rf represents a fluoroalkyl group or a fluoroalkylcarbonyl group, and m represents an integer of 1 to 50.

In formula (II), the fluoroalkyl group of Rf may contain an oxygen atom in the alkyl chain or may have a double bond, and examples of the fluoroalkyl group include $-CF_3$, $-C_2F_5$, $-C_4F_9$, $-CH_2CF_3$, $-CH_2C_2F_5$, $-CH_2C_3F_7$, $-CH_2C_4F_9$, $-CH_2C_6F_{13}$, $-C_2H_4CF_3$, $-C_2H_4C_2F_5$, $-C_2H_4C_4F_9$, $-C_2H_4C_6F_{13}$, $-C_2H_4C_8F_{17}$, $-CH_2CH(CH_3)CF_3$, $-CH_2CH(CF_3)_2$, $-CH_2CF(CF_3)_2$, $-CH_2CH(CF_3)_2$, $-CF_2CF(CF_3)OCF_3$, $-CF_2CF(CF_3)OC_3F_7$, $-C_2H_4OCF_2CF(CF_3)OCF_3$, $-C_2H_4OCF_2CF(CF_3)OC_3F_7$ and $-C(CF_3)=C(CF(CF_3)_2)_2$.

Examples of the fluoroalkylcarbonyl group of Rf include $-COCF_3$, $-COC_2F_5$, $-COC_3F_7$, $-COC_4F_9$, $-COC_6F_{13}$ and $-COC_8F_{17}$.

The alkyl group as $R_{10}$ is preferably an alkyl group having a carbon number of 1 to 10, more preferably from 1 to 5.

The resist composition of the present invention may or may not contain a surfactant and in the case of containing a surfactant, the content thereof is preferably from 0.0001 to 2 mass %, more preferably from 0.001 to 1 mass° A, based on the entire solid content of the resist composition.

<Other Components>

The resist composition of the present invention may or may not further contain, for example, a dye, a plasticizer, a surfactant other than the component (E) above, a photosensitizer, and a compound for accelerating the dissolution in a developer, if desired, within the range not impairing the effects of the present invention.

(F) A dissolution inhibiting compound having a molecular weight of 3,000 or less and being capable of decomposing by the action of an acid to increase the solubility in an alkali developer, or a compound containing a structure where the phenolic hydroxyl group of a phenol compound is substituted with an acid-decomposable group. In particular, the phenol compound is preferably a compound containing from 1 to 9 phenol structures, more preferably from 2 to 6 phenol structures.

(G) A compound for accelerating dissolution in an alkali developer; in particular, a low molecular compound having a molecular weight of 1,000 or less and having two or more phenolic OH groups or one or more carboxy groups.

(H) A substance capable of decomposing by the action of an acid to produce an acid stronger than carboxylic acid (hereinafter sometimes referred to as an "acid-increasing agent"). The acid produced from the acid-increasing agent preferably has a large acid strength. Specifically, the dissolution constant (pKa) of the acid is preferably 3 or less, more preferably 2 or less. The acid generated from the acid-increasing agent is preferably a sulfonic acid.

As for the acid-increasing agent, one kind of an acid-increasing agent selected from those described in W095/29968, W098/24000, JP-A-8-305262, JP-A-9-34106, JP-A-8-248561, JP-T-8-503082 (the term "JP-T" as used herein means a published Japanese translation of a PCT patent application), U.S. Pat. No. 5,445,917, JP-T-8-503081, U.S. Pat. Nos. 5,534,393, 5,395,736, 5,741,630, 5,334,489, 5,582,956, 5,578,424, 5,453,345 and 5,445,917, European Patents 665, 960, 757,628 and 665,961, U.S. Pat. No. 5,667,943, JP-A-10-1508, JP-A-10-282642, JP-A-9-512498, JP-A-2000-62337 and JP-A-2005-17730 may be used, or two or more kinds thereof may be used in combination.

Specifically, compounds represented by the following formulae (1) to (6) are preferred.

(1)

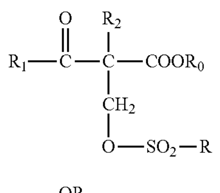

(2)

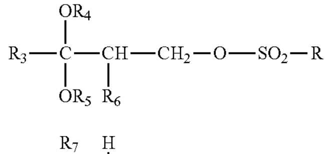

(3)

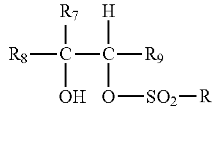

-continued (4)

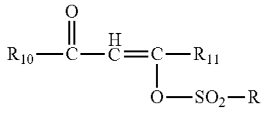

(5)

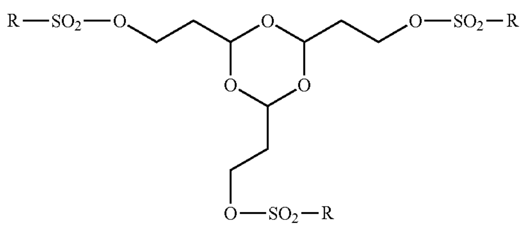

(6)

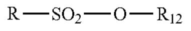

In formulae (1) to (6), R represents an alkyl group, a cycloalkyl group, an aryl group or an aralkyl group, $R_0$ represents a group capable of leaving by the action of an acid, $R_1$ represents an alkyl group, a cycloalkyl group, an aryl group, an aralkyl group, an alkoxy group or an aryloxy group, $R_2$ represents an alkyl group or an aralkyl group, $R_3$ represents an alkyl group, a cycloalkyl group, an aryl group or an aralkyl group, each of $R_4$ and $R_5$ independently represents an alkyl group, $R_4$ and $R_5$ may combine together to form a ring, $R_6$ represents a hydrogen atom or an alkyl group, $R_7$ represents a hydrogen atom, an alkyl group, a cycloalkyl group, an aryl group or an aralkyl group, $R_8$ represents an alkyl group, a cycloalkyl group, an aryl group or an aralkyl group, $R_9$ represents a hydrogen atom, an alkyl group, a cycloalkyl group, an aryl group or an aralkyl group, $R_9$ may combine with $R_7$ to form a ring, $R_{10}$ represents an alkyl group, a cycloalkyl group, an alkoxy group, an aryl group, an aralkyl group, an aryloxy group or an alkenyloxy group, $R_{11}$ represents an alkyl group, a cycloalkyl group, an alkoxy group, an aryl group, an aralkyl group, an aryloxy group or an alkenyl group, $R_{10}$ and $R_{11}$ may combine together to form a ring, and $R_{12}$ represents an alkyl group, a cycloalkyl group, an aryl group, an alkenyl group or a cyclic imide group.

In formulae (1) to (6), the alkyl group includes an alkyl group having a carbon number of 1 of 8, and specific examples thereof include a methyl group, an ethyl group, a propyl group, an isopropyl group, a butyl group and an octyl group.

The cycloalkyl group includes a cycloalkyl group having a carbon number of 3 to 10, and specific examples thereof include a cyclopropyl group, a cyclopentyl group, a cyclohexyl group, a cycloheptyl group, an adamantyl group, a boronyl group, an isoboronyl group, a tricyclodecanyl group, a dicyclopentenyl group, a norbornene epoxy group, a menthyl group, as isomenthyl group, a neomenthyl group and a tetracyclododecanyl group.

The aryl group includes an aryl group having a carbon number of 6 to 14, and specific examples thereof include a phenyl group, a naphthyl group and a tolyl group.

The aralkyl group includes an aralkyl group having a carbon number of 7 to 20, and specific examples thereof include a benzyl group, a phenethyl group and a naphthylethyl group.

The alkoxy group includes an alkoxy group having a carbon number of 1 to 8, and specific examples thereof include a methoxy group, an ethoxy group, a propoxy group and a butoxy group.

The alkenyl group includes an alkenyl group having a carbon number of 2 to 6, and specific examples thereof include a vinyl group, a propenyl group, an allyl group, a butenyl group, a pentenyl group, a hexenyl group and a cyclohexenyl group.

The aryloxy group includes an aryloxy group having a carbon number of 6 to 14, and specific examples thereof include a phenoxy group and a naphthoxy group.

The alkenyloxy group includes an alkenyloxy group having a carbon number of 2 to 8, and specific examples thereof include a vinyloxy group and an allyloxy group.

Each of the above-described substituents may further have a substituent, and examples of the substituent include a halogen atom such as Cl, Br and F, a —CN group, a —OH group, an alkyl group having a carbon number of 1 to 4, a cycloalkyl group having a carbon number of 3 to 8, an alkoxy group having a carbon number of 1 to 4, an acylamino group such as acetylamino group, an aralkyl group such as benzyl group and phenethyl group, an aryloxyalkyl group such as phenoxyethyl group, an alkoxycarbonyl group having a carbon number of 2 to 5, and an acyloxy group having a carbon number of 2 to 5, but the range of the substituent is not limited thereto.

Examples of the ring formed by combining $R_4$ and $R_5$ with each other include a 1,3-dioxolane ring and a 1,3-dioxane ring.

Examples of the ring formed by combining $R_7$ and $R_9$ with each other include a cyclopentyl ring and a cylohexyl ring.

Examples of the ring formed by combining $R_{10}$ and $R_{11}$ with each other include a 3-oxocyclohexenyl ring and a 3-oxoindenyl ring, which each may contain an oxygen atom in the ring.

Examples of the group capable of leaving by the action of an acid of $R_0$ include a tertiary alkyl group such as tert-butyl group and tert-amyl group, an isoboronyl group, a 1-alkoxyethyl group such as 1-ethoxyethyl group, 1-butoxyethyl group, 1-isobutoxyethyl group and 1-cyclohexyloxyethyl group, an alkoxymethyl group such as 1-methoxymethyl group and 1-ethoxymethyl group, a tetrahydropyranyl group, a tetrahydrofuranyl group, a trialkylsilyl group, and a 3-oxocyclohexyl group.

Preferred embodiments of R, $R_0$ and $R_1$ to $R_{11}$ are as follows:

R: a methyl group, an ethyl group, a propyl group, a butyl group, an octyl group, a trifluoromethyl group, a nonafluorobutyl group, a heptadecafluorooctyl group, a 2,2,2-trifluoroethyl group, a phenyl group, a pentafluorophenyl group, a methoxyphenyl group, a toluyl group, a mesityl group, a fluorophenyl group, a naphthyl group, a cyclohexyl group or a camphor group;

$R_0$: a tert-butyl group, a methoxymethyl group, an ethoxymethyl group, a 1-ethoxyethyl group or a tetrahydropyranyl group;

$R_1$: a methyl group, an ethyl group, a propyl group, a cyclopropyl group, a cyclopentyl group, a cyclohexyl group, a phenyl group, a naphthyl group, a benzyl group, a phenethyl group, a methoxy group, an ethoxy group, a propoxy group, a phenoxy group or a naphthoxy group;

$R_2$: a methyl group, an ethyl group, a propyl group, a butyl group or a benzyl group;

$R_3$: a methyl group, an ethyl group, a propyl group, a cyclopropyl group, a cyclopentyl group, a cylohexyl group, a phenyl group, a naphthyl group, a benzyl group, a phenethyl group or a naphthylmethyl group;

$R_4$, $R_5$: a methyl group, an ethyl group, a propyl group, or those to form an ethylene group or a propylene group when combined with each other;

$R_6$: a hydrogen atom, a methyl group or an ethyl group;

$R_7$, $R_9$: a hydrogen atom, a methyl group, an ethyl group, a propyl group, a butyl group, a pentyl group, a cyclopropyl group, a cyclopentyl group, a cyclohexyl group, a phenyl group, a naphthyl group, a benzyl group, a phenethyl group, or those to form a cyclopentyl ring or a cyclohexyl ring when combined with each other;

$R_8$: a methyl group, an ethyl group, an isopropyl group, a tert-butyl group, a neopentyl group, a cyclohexyl group, a phenyl group or a benzyl group;

$R_{10}$: a methyl group, an ethyl group, a propyl group, an isopropyl group, a butyl group, an isobutyl group, a cyclopropyl group, a cyclopentyl group, a cyclohexyl group, a methoxy group, an ethoxy group, a phenyl group, a naphthyl group, a benzyl group, a phenoxy group, a naphthoxy group, a vinyloxy group, a methylvinyloxy group, or a group to form, when combined with $R_{11}$, a 3-oxocyclohexenyl or 3-oxoidenyl ring which may contain an oxygen atom; and $R_{11}$: a methyl group, an ethyl group, a propyl group, an isopropyl group, a butyl group, an isobutyl group, a cyclopropyl group, a cyclopentyl group, a cyclohexyl group, a methoxy group, an ethoxy group, a phenyl group, a naphthyl group, a benzyl group, a phenoxy group, a naphthoxy group, a vinyl group, an allyl group, or a group to form, when combined with $R_{10}$, a 3-oxocyclohexenyl or 3-oxoindenyl ring which may contain an oxygen atom.

In formula (6), when $R_{12}$ represents an alkyl group, the alkyl group includes a linear or branched alkyl group having a carbon number of 1 to 20, and specific examples thereof include a methyl group, an ethyl group, a propyl group, a butyl group, a pentyl group, a hexyl group, a heptyl group, an octyl group, a nonyl group, a decyl group, an undecyl group, a dodecyl group, a tridecyl group, a hexadecyl group, an octadecyl group, an eicosyl group, an isopropyl group, an isobutyl group, an s-butyl group, a tert-butyl group, an isopentyl group, a neopentyl group, a 1-methylbutyl group, an isohexyl group, a 2-ethylhexyl group and a 2-methylhexyl group. Among these, a linear alkyl group having a carbon number of 1 to 12, and a branched alkyl group having a carbon number of 3 to 12 are preferred.

When $R_{12}$ represents a cycloalkyl group, the cycloalkyl group includes a cycloalkyl group having a carbon number of 3 to 20, and specific examples thereof include a cyclohexyl group, a cyclopentyl group and a 2-norbornyl group. Among these, a cycloalkyl group having a carbon number of 5 to 10 is preferred.

When $R_{12}$ represents a substituted alkyl group or a substituted cycloalkyl group, the substituent is a monovalent nonmetallic atom group excluding hydrogen, and preferred examples thereof include a halogen atom (e.g., —F, —Br, —Cl, —I), a hydroxyl group, an alkoxy group, an aryloxy group, a mercapto group, an alkylthio group, an arylthio group, an alkyldithio group, an aryldithio group, an amino group, an N-alkylamino group, an N,N-dialkylamino group, an N-arylamino group, an N,N-diarylamino group, an N-alkyl-N-arylamino group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, an acylthio group, an acylamino group, an N-alkylacylamino group, an N-arylacylamino group, a ureido group, an N'-alkylureido group, an N',N'-dialkylureido group, an N'-arylureido group, an N',N'-diarylureido group, an N'-alkyl-N'-arylureido group, an N-alkylureido group, an N-arylureido group, an N'-alkyl-N-alkylureido group, an N'-alkyl-N-arylureido group, an N',N'-dialkyl-N-alkylureido group, an N',N'-dialkyl-N-arylureido group, an N'-aryl-N-alkylureido group, an N'-aryl-N-arylureido group, an N',N'-diaryl-N-alkylureido group, an N',N'-diaryl-N-arylureido group, an N'-alkyl-N'-aryl-N-alkylureido group, an N'-alkyl-N'-aryl-N-arylureido group, an alkoxycarbonylamino group, an aryloxycarbonylamino group, an N-alkyl-N-alkoxycarbonylamino group, an N-alkyl-N-aryloxycarbonylamino group, an N-aryl-N-alkoxycarbonylamino group, an N-aryl-N-aryloxycarbonylamino group, a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N,N-diarylcarbamoyl group, an N-alkyl-N-arylcarbamoyl group, an alkylsulfinyl group, an arylsulfinyl group, an alkylsulfonyl group, an arylsulfonyl group, a sulfo group (—$SO_3H$) and a conjugate base group thereof (hereinafter referred to as a "sulfonato group"), an alkoxysulfonyl group, an aryloxysulfonyl group, a sulfinamoyl group, an N-alkylsulfinamoyl group, an N,N-dialkylsulfinamoyl group, an N-arylsulfinamoyl group, an N,N-diarylsulfinamoyl group, an N-alkyl-N-arylsulfinamoyl group, a sulfamoyl group, an N-alkylsulfamoyl group, an N,N-dialkylsulfamoyl group, an N-arylsulfamoyl group, an N,N-diarylsulfamoyl group, an N-alkyl-N-arylsulfamoyl group, a phosphono group (—$PO_3H_2$) and a conjugate base group thereof (hereinafter referred to as a "phosphonato group"), a dialkylphosphono group (—$PO_3$(alkyl)$_2$), a diarylphosphono group (—$PO_3$(aryl)$_2$), an alkylarylphosphono group (—$PO_3$(alkyl)(aryl)), a monoalkylphosphono group (—$PO_3H$(alkyl)) and a conjugate base group thereof (hereinafter referred to as an "alkylphosphonato group"), a monoarylphosphono group (—$PO_3H$(aryl)) and a conjugate base group thereof (hereinafter referred to as an "arylphosphonato group"), a phosphonoxy group (—$OPO_3H_2$) and a conjugate base group thereof (hereinafter referred to as a "phosphonatoxy group"), a dialkylphosphonoxy group (—$OPO_3$(alkyl)$_2$), a diarylphosphonoxy group (—$OPO_3$(aryl)$_2$), a alkylarylphosphonoxy group (—$OPO_3$(alkyl)(aryl)), a monoalkylphosphonoxy group (—$OPO_3H$(alkyl)) and a conjugate base group thereof (hereinafter referred to as an "alkylphosphonatoxy group"), a monoarylphosphonoxy group (—$OPO_3H$(aryl)) and a conjugate base group thereof (hereinafter referred to as an "arylphosphonatoxy group"), a cyano group, a nitro group, an aryl group, an alkenyl group and an alkynyl group.

In these substituents, specific examples of the alkyl group include the above-described alkyl groups, and specific examples of the aryl group include a phenyl group, a biphenyl group, a naphthyl group, a tolyl group, a xylyl group, a mesityl group, a cumenyl group, a chlorophenyl group, a bromophenyl group, a chloromethylphenyl group, a hydroxyphenyl group, a methoxyphenyl group, an ethoxyphenyl group, a phenoxyphenyl group, an acetoxyphenyl group, a benzoyloxyphenyl group, a methylthiophenyl group, a phenylthiophenyl group, a methylaminophenyl group, a dimethylaminophenyl group, an acetylaminophenyl group, a carboxyphenyl group, a methoxycarbonylphenyl group, an ethoxyphenylcarbonyl group, a phenoxycarbonylphenyl group, an N-phenylcarbamoylphenyl group, a phenyl group, a cyanophenyl group, a sulfophenyl group, a sulfonatophenyl group, a phosphonophenyl group and a phosphonatophenyl group. Examples of the alkenyl group include a vinyl group, a 1-propenyl group, a 1-butenyl group, a cinnamyl group and a 2-chloro-1-ethenyl group, and examples of the alkynyl group include an ethynyl group, a 1-propynyl group, a 1-butynyl group and a trimethylsilylethynyl group. $R_{13}$ in the acyl group ($R_{13}$CO—) is hydrogen or the above-described alkyl, cycloalkyl or aryl group.

Among these substituents, more preferred are a halogen atom (e.g., —F, —Br, —Cl, —I), an alkoxy group, an aryloxy group, an alkylthio group, an arylthio group, an N-alkylamino group, an N,N-dialkylamino group, an acyloxy group, an N-alkylcarbamoyloxy group, an N-arylcarbamoyloxy group, an acylamino group, a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N-alkyl-N-arylcarbamoyl group, a sulfo group, a sulfonato group, a sulfamoyl group, an N-alkylsulfamoyl group, an N,N-dialkylsulfamoyl group, an N-arylsulfamoyl group, an N-alkyl-N-arylsulfamoyl group, a phosphono group, a phosphonato group, a dialkylphosphono group, a diarylphosphono group, a monoalkylphosphono group, an alkylphosphonato group, a monoarylphosphono group, an arylphosphonato group, a phosphonoxy group, a phosphonatoxy group, an aryl group and an alkenyl group.

Examples of the alkylene group in the substituted alkyl group include a divalent organic residue structure resulting from elimination of any one hydrogen atom on the above-described alkyl group having a carbon number of 1 to 20, and a linear alkylene group having a carbon number of 1 to 12, a branched alkylene group having a carbon number of 3 to 12 and a cyclic alkylene group having a carbon number of 5 to 10 are preferred. Specific preferred examples of the substituted alkyl group obtained by combining the above-described substituent and an alkylene group include a chloromethyl group, a bromomethyl group, a 2-chloroethyl group, a trifluoromethyl group, a methoxymethyl group, a methoxyethoxyethyl group, an allyloxymethyl group, a phenoxymethyl group, a methylthiomethyl group, a tolylthiomethyl group, an ethylaminoethyl group, a diethylaminopropyl group, a morpholinopropyl group, an acetyloxymethyl group, a benzoyloxymethyl group, an N-cyclohexylcarbamoyloxyethyl group, an N-phenylcarbamoyloxyethyl group, an acetylaminoethyl group, an N-methylbenzoylaminopropyl group, a 2-oxoethyl group, a 2-oxopropyl group, a carboxypropyl group, a methoxycarbonylethyl group, an allyloxycarbonylbutyl group, a chlorophenoxycarbonylmethyl group, a carbamoylmethyl group, an N-methylcarbamoylethyl group, an N,N-dipropylcarbamoylmethyl group, an N-(methoxyphenyl)carbamoylethyl group, an N-methyl-N-(sulfophenyl)carbamoylmethyl group, a sulfobutyl group, a sulfonatobutyl group, a sulfamoylbutyl group, an N-ethylsulfamoylmethyl group, an N,N-dipropylsulfamoylpropyl group, an N-tolylsulfamoylpropyl group, an N-methyl-N-(phosphonophenyl)sulfamoyloctyl group, a phosphonobutyl group, a phosphonatohexyl group, a diethylphosphonobutyl group, a diphenylphosphonopropyl group, a methylphosphonobutyl group, a methylphosphonatobutyl group, a tolylphosphonohexyl group, a tolylphosphonatohexyl group, a phosphonoxypropyl group, a phosphonatoxybutyl group, a benzyl group, a phenethyl group, an α-methylbenzyl group, a 1-methyl-1-phenylethyl group, a p-methylbenzyl group, a cinnamyl group, an allyl group, a 1-propenylmethyl group, a 2-butenyl group, a 2-methylallyl group, a 2-methylpropenylmethyl group, a 2-propynyl group, a 2-butynyl group and a 3-butynyl group.

When $R_{12}$ represents an aryl group, the aryl group includes a condensed ring formed by 1 to 3 benzene rings and a condensed ring formed by a benzene ring and a 5-membered unsaturated ring, and specific examples thereof include a phenyl group, a naphthyl group, an anthryl group, a phenanthryl group, an indenyl group, an acenaphthenyl group and a fluorenyl group. Among these, a phenyl group and a naphthyl group are preferred. Other than the above-described carbocyclic aryl group, the aryl group includes a heterocyclic (hetero) aryl group. As for the heterocyclic aryl group, those containing from 3 to 20 carbon atoms and from 1 to 5 heteroatoms, such as pyridyl group, furyl group, quinolyl group condensed with a benzene ring, benzofuryl group, thioxanthone group and carbazole group, are used.

When $R_{12}$ represents a substituted aryl group, the substituted aryl group is an aryl group having a monovalent nonmetallic atom group (excluding hydrogen) as a substituent on the ring-forming carbon atom of the above-described aryl group. Preferred examples of the substituent include those described above as the substituent of the alkyl and cycloalkyl groups.

Specific preferred examples of the substituted aryl group include a biphenyl group, a tolyl group, a xylyl group, a mesityl group, a cumenyl group, a chlorophenyl group, a bromophenyl group, a fluorophenyl group, a chloromethylphenyl group, a trifluoromethylphenyl group, a hydroxyphenyl group, a methoxyphenyl group, a methoxyethoxyphenyl group, an allyloxyphenyl group, a phenoxyphenyl group, a methylthiophenyl group, a tolylthiophenyl group, an ethylaminophenyl group, a diethylaminophenyl group, a morpholinophenyl group, an acetyloxyphenyl group, a benzoyloxyphenyl group, an N-cyclohexylcarbamoyloxyphenyl group, an N-phenylcarbamoyloxyphenyl group, an acetylaminophenyl group, an N-methylbenzoylaminophenyl group, a carboxyphenyl group, a methoxycarbonylphenyl group, an allyloxycarbonylphenyl group, a chlorophenoxycarbonylphenyl group, a carbamoylphenyl group, an N-methylcarbamoylphenyl group, an N,N-dipropylcarbamoylphenyl group, an N-(methoxyphenyl)carbamoylphenyl group, an N-methyl-N-(sulfophenyl)carbamoylphenyl group, a sulfophenyl group, a sulfonatophenyl group, a sulfamoylphenyl group, an N-ethylsulfamoylphenyl group, an N,N-dipropylsulfamoylphenyl group, an N-tolylsulfamoylphenyl group, an N-methyl-N-(phosphonophenyl)sulfamoylphenyl group, a phosphonophenyl group, a phosphonatophenyl group, a diethylphosphonophenyl group, a diphenylphosphonophenyl group, a methylphosphonophenyl group, a methylphosphonatophenyl group, a tolylphosphonophenyl group, a tolylphosphonatophenyl group, an allyl group, a 1-propenylmethyl group, a 2-butenyl group, a 2-methylallylphenyl group, a 2-methylpropenylphenyl group, a 2-propenylphenyl group, a 2-butynylphenyl group and a 3-butynylphenyl group.

When $R_{12}$ represents an alkenyl group, a substituted alkenyl group [$-C(R_{14})=C(R_{15})(R_{16})$], an alkynyl group or a substituted alkynyl group [$-C\equiv C(R_{17})$], each of $R_{14}$ to $R_{17}$ may be a monovalent nonmetallic atom group. Each of $R_{14}$ to $R_{17}$ is preferably, for example, a hydrogen atom, a halogen atom, an alkyl group, a substituted alkyl group, an aryl group or a substituted aryl group. Specific examples of these groups include those described above as examples. Each of the substituents $R_{14}$ to $R_{17}$ is more preferably a hydrogen atom, a halogen atom, or a linear, branched or cyclic alkyl group having a carbon number of 1 to 10. Specific examples of the alkenyl group, substituted alkenyl group, alkynyl group and substituted alkynyl group include a vinyl group, a 1-butenyl group, a 1-pentenyl group, a 1-hexenyl group, a 1-octenyl group, a 1-methyl-1-propenyl group, a 2-methyl-1-propenyl group, a 2-methyl-1-butenyl group, a 2-phenyl-1-ethenyl group, a 2-chloro-1-ethenyl group, an ethynyl group, a propynyl group, and a phenylethyl group.

When $R_{12}$ represents a cyclic imide group, the cyclic imide may be a cyclic imide having a carbon number of 4 to 20, such as succinic acid imide, phthalic acid imide, cyclohexanedicarboxylic acid imide and norbornenedicarboxylic acid imide.

Specific examples of the compounds represented by formulae (1) to (6) include compounds illustrated in paragraph [0215] et seq. of JP-A-2008-209889.

<Use Method of Resist Composition of the Present Invention>

The resist composition of the present invention is, as described above, suitably used for the preparation of a mold. As long as the resist composition is used for this purpose, its use method is not particularly limited. As regards the method for mold preparation, various methods have been proposed, and some of the methods are disclosed, for example, in JP-A-2004-158287 and JP-A-2008-162101 and Science and New Technology in Nanoimprint, edited by Yoshihiko Hirai, Frontier Publishing. Here, two methods, that is, a method of directly preparing a mold by using the composition of the present invention (method 1), and a method of preparing a master mold by using the composition of the present invention and then preparing a replica mold by using the master mold (method 2), are briefly described.

In the method 1, the above-described resist composition is coated on a desired substrate to form a resist film. The material of the substrate can be appropriately selected from quartz, glass, Si, $SiO_2$, SiN, Ti, Tl, Pd, Ni, TiN, Cu, Cr, Fe, Al and the like. On the substrate, a hard mask (HM) layer is preferably formed using Cr or the like so as to enhance the selectivity of reactive ion etching (RIE) described later. The thickness of this layer is usually from 3 to 50 nm, preferably from 10 to 20 nm.

The method for coating is not particularly limited, but a coating method by spin coating or inkjet system is preferred. The thickness of the resist film is not particularly limited, but the composition is coated to a thickness of usually from 30 to 300 nm, preferably from 30 to 200 nm, more preferably from 30 to 100 nm.

The resist film is subjected to pre-exposure baking (preferably at 80 to 150° C. for about 90 seconds), if desired, and then to pattern drawing preferably with an electron beam.

After the pattern drawing, post-exposure baking, if desired, and then development with a developer are performed, whereby a resist pattern is formed.

In the case of performing post-exposure baking, the baking temperature is preferably from 80 to 150° C., more preferably from 100 to 140° C., and the baking time is preferably from 30 to 120 seconds.

The developer is usually an aqueous alkali solution such as tetramethylammonium hydroxide that is widely used for the purpose of preparing a semiconductor fine pattern, but as long as the object of the present invention is achieved, other aqueous alkali solutions, for example, an alkaline aqueous solution of inorganic alkalis such as sodium hydroxide, potassium hydroxide, sodium carbonate, sodium silicate, sodium metasilicate and aqueous ammonia, primary amines such as ethylamine and n-propylamine, secondary amines such as diethylamine and di-n-butylamine, tertiary amines such as triethylamine and methyldiethylamine, alcohol amines such as dimetylethanolamine and triethanolamine, quaternary ammonium salts such as tetraethylammonium hydroxide, or cyclic amines such as pyrrole and piperidine, may be used.

Furthermore, the alkali developer may be used after adding thereto alcohols and a surfactant each in an appropriate amount.

The alkali concentration of the alkali developer is usually from 0.1 to 20 mass %.

The pH of the alkali developer is usually from 10.0 to 15.0.

The substrate having thereon the thus-formed resist pattern is subjected to an etching treatment (preferably reactive ion etching (RIE)) to form a concave-convex structure. At this time, the resist pattern functions as a mask for the etching.

The gas that can be used for the RIE process is not particularly limited, but representative examples thereof include a fluorocarbon-based gas (e.g., $CHF_3$, $CF_4$, $C_4F_8$, $C_4F_6$), $SF_6$, $CH_4$ and $CF_3I$. Also, a rare gas such as Ar and He is often used as a gas for diluting the gas used in the process.

The conditions of the RIE process are not particularly limited, but the flow rate of the fluorocarbon-based gas is preferably from 5 to 50 sccm, more preferably from 10 to 30 sccm, and the flow rate of the gas for dilution is preferably from 20 to 200 sccm, more preferably from 50 to 150 scan (the "sccm" is a unit at 1 atm and 0° C.). Also, the pressure of gas is preferably from 0.5 to 10 Pa, more preferably from 1 to 6 Pa.

In addition, as regards the conditions of apparatus, for example, an RIE apparatus of inductive coupling type (ICP) is used by adjusting the antenna power (ICP power) to preferably from 50 to 600 W, more preferably from 100 to 300 W, the bias power to preferably from 10 to 300 W, more preferably from 20 to 150 W, the temperature in the apparatus (chamber, etching chamber) to preferably from 50 to 150° C., more preferably from 80 to 120° C., and the temperature of the substrate stage to preferably from −20° C. to 70° C., more preferably from 10 to 60° C.

Incidentally, before etching, resist modification (curing) may be performed by applying an energy to the resist pattern. Examples of the curing method include heat curing, ultraviolet curing and electron beam curing. For example, when electron beam curing is performed under the conditions of an accelerating voltage of 1 kV and an exposure dose of 1 $mC/cm^2$ and then etching is performed, LWR can be improved by about 0.5 nm as compared with the case of not performing electron beam curing.

After the completion of etching, the resist pattern is removed and the substrate is cleaned, whereby a mold (stamper) can be obtained. In this connection, after the cleaning of substrate, a release treatment is preferably performed so as to prevent attachment of a transfer material. As to the material for release treatment, a silane coupling agent is often used. Specific examples of the silane coupling agent include OPTOOL DSX, DURASURF HD-1100, 2100 Series (produced by Daikin Chemicals Sales Co., LTD.), and Novec ECG-1720 (produced by Sumitomo 3M Limited). Examples of the method for release treatment include a method of dipping the substrate in a silane coupling agent solution and then heating it to fix the coupling agent, and a method of thinly coating a silane coupling agent solution on the substrate by spin coating and then heating it.

The process from resist coating on a substrate to resist pattern formation of the method 2 is the same as that of the method 1, but in this process, it is particularly preferred to use an Si substrate, an $SiO_2$-treated Si substrate or the like as the substrate for master mold preparation and coat the resist composition of the present invention thereon.

After forming a resist pattern on the substrate, reactive ion etching (the outline of etching is the same as that described in the method 1) is performed using the resist pattern as a mask, the resist is removed, and the substrate is cleaned, whereby a mold (master mold) having formed thereon convex and concave is obtained.

An imprint process of pressing this mold toward a substrate coated with a curable composition is performed to transfer the concave-convex pattern of the master mold into the curable composition on the substrate, as a result, a pattern by the curable composition is formed. The curable composition may be either thermosetting or photocurable and in the case where the substrate is a material capable of transmitting light, a photocurable composition can be used. In this connection, at the time of preparing a substrate coated with a curable composition, the substrate is preferably subjected to the above-described release treatment with a silane coupling agent or the like.

The curable composition used here is described in more detail. The curable composition usually contains a polymerizable monomer, a polymerization initiator, a surfactant and other arbitrary components. Specific examples of respective components usually contained in the curable composition include the components described in paragraphs 0032 to 0142 of JP-A-2009-016000.

Incidentally, as a commercially available curable composition, PAK-01, PAK-02 and the like produced by Toyo Gosei Co., Ltd. are also usable.

After the formation of a concave-convex pattern by a curable composition, an etching treatment (RIE) is performed using the concave-convex pattern as a mask. In the RIE treatment here, in order to remove a residual film between patterns formed by the curable composition, the RIE process for forming a concave-convex structure (RIE described in the method 1 above) is preferably performed after previously performing RIE to remove a residual film by using an $O_2$ gas, an $O_2$/Ar mixed gas or the like. In this connection, the removal of residual film between patterns is sometimes performed using the above-described fluorocarbon-based gas.

After RIE is completed, removal of the curable composition, cleaning of the substrate and preferably release treatment (the method for release treatment is the same as that described in the method 1) are performed, whereby a mold (replica mold) can be obtained.

As another method, it is also possible to obtain a replica mold made of a metal such as Ni by applying an electroforming treatment to the master mold having formed thereon protrusions and recesses. As regards details of the method for mold preparation, the mold preparation method other than the methods 1 and 2, and the like, reference can be made to, for example, JP-A-2004-158287 and JP-A-2008-162101 and Science and New Technology in Nanoimprint, edited by Yoshihiko Hirai, Frontier Publishing.

As described above, the mold preparation method of the present invention includes a step of forming a pattern on a substrate by using a chemical amplification resist composition, and a step of performing an etching treatment by using the pattern as a mask. According to this mold preparation method, a chemical amplification resist composition is used and therefore, a pattern excellent not only in the sensitivity and resolution but also in the line width roughness (LWR) performance can be formed, as a result, a mold having a fine profile can be unfailingly prepared with high precision.

EXAMPLES

[1. Synthesis of Vinyl Ether]

p-Cyclohexylphenol (83.1 g (0.5 mol)) was dissolved in 300 ml of toluene, and 150 g of 2-chloroethyl vinyl ether was added thereto. Furthermore, 25 g of sodium hydroxide, 5 g of tetrabutylammonium bromide and 60 g of triethylamine were added, and the resulting mixture was heated with stirring at 120° C. for 5 hours. The reaction solution was washed with water, and excess chloroethyl vinyl ether and toluene were removed by distillation under reduced pressure. From the obtained oil, the objective p-cyclohexylphenoxyethyl vinyl ether (X-1) was obtained by distillation under reduced pressure.

Each of the vinyl ethers shown below was obtained in the same manner as above.

X-1

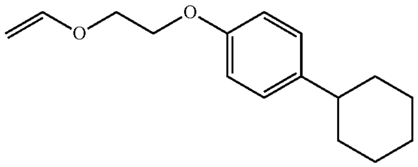

X-2

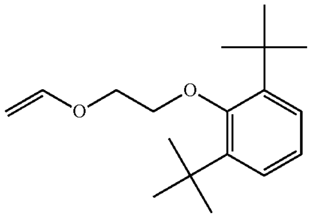

X-3

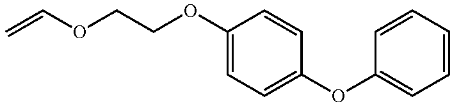

X-4

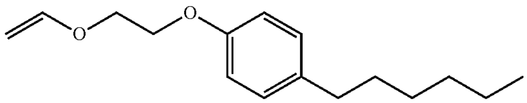

X-5

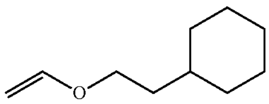

[2. Synthesis of Alkali-Soluble Resin]

p-Acetoxystyrene (32.4 g (0.2 mol)) was dissolved in 120 ml of butyl acetate, 0.066 g of azobisisobutyronitrile (AIBN) was added thereto with stirring at 80° C. three times every 2.5 hours in a nitrogen stream, and the stirring was further continued for 5 hours, thereby performing the polymerization reaction. The reaction solution was poured in 1,200 ml of hexane to precipitate a white resin, and the obtained resin was dried and then dissolved in 150 ml of methanol. An aqueous solution containing 7.7 g (0.19 mol) of sodium hydroxide/50 ml of water was added thereto, and the resulting solution was refluxed under heating for 3 hours to effect hydrolysis. The resulting reaction solution was diluted by adding 200 ml of water and neutralized with hydrochloric acid to precipitate a white resin. The precipitated resin was separated by filtration, washed with water, dried and further dissolved in 200 ml of tetrahydrofuran, and the resulting solution was added dropwise to 5 L of ultrapure water with vigorous stirring, thereby effecting reprecipitation. This reprecipitation operation was repeated three times. The obtained resin was dried in a vacuum drier at 120° C. for 12 hours to obtain poly(p-hydroxystyrene) Alkali-Soluble Resin R-1. The weight average molecular weight of the obtained resin was 3,000.

Also, polyp-hydroxystyrene) (VP-2500) produced by Nippon Soda Co., Ltd. was prepared as Alkali-Soluble Resin R-2. The weight average molecular weight was 3,500.

[3. Synthesis of Acid-Decomposable Resin]

| | | |
|---|---|---|
| Alkali soluble Resin R-1 | 20 | g |
| Propylene glycol monomethyl ether acetate | 80 | ml |
| Vinyl Ether X-1 | 6.50 | g |

These were mixed in a flask, and the flask was heated under reduced pressure to distill off the water in the system by azeotropic dehydration. Pyridinium-p-toluenesulfonic acid (10 mg) was added thereto, and the mixture was stirred at room temperature for 5 hours. The reaction was stopped by adding triethylamine to the reaction solution, an 100 mL of ultrapure water was added thereto. The contents were transferred to a liquid separating funnel and after a liquid separation operation, the aqueous layer was removed. The residue was washed with 100 mL of ultrapure water twice, and the remaining organic layer was heated under reduced pressure to thoroughly remove water by distilling off propylene glycol monomethyl ether acetate together with water, whereby Alkali-Soluble Resin B-1 having a substituent according to the present invention was obtained.

Also, Acid-Decomposable Resins B-2 to B-11 were obtained in the same manner as above by using an alkali-soluble resin and a vinyl ether shown in Table 1 below. In Table 1, the protection ratio indicates in what molar ratio the hydroxyl group of the p-hydroxystyrene unit is protected (substituted) with a group capable of leaving by the action of an acid, in other words, indicates the content (mol %) of a repeating unit having an acid-decomposable group based on all repeating units of the resin.

TABLE 1

| Resin | Vinyl Ether Used | Trunk Polymer | Molecular Weight (Mw) | Molecular Weight Polydispersity (*) | Protection Ratio (%) |
|---|---|---|---|---|---|
| B-1 | X-1 | R-1 | 3300 | 1.35 | 19 |
| B-2 | X-2 | R-1 | 3300 | 1.35 | 20 |
| B-3 | X-3 | R-1 | 3300 | 1.36 | 18 |
| B-4 | X-4 | R-1 | 3300 | 1.34 | 20 |
| B-5 | X-5 | R-1 | 3300 | 1.35 | 30 |
| B-6 | X-1 | R-2 | 3700 | 1.15 | 19 |
| B-7 | X-2 | R-2 | 3700 | 1.15 | 20 |
| B-8 | X-3 | R-2 | 3700 | 1.15 | 18 |
| B-9 | X-4 | R-2 | 3700 | 1.15 | 20 |
| B-10 | X-5 | R-2 | 3700 | 1.15 | 30 |
| B-11 | ethyl vinyl ether | R-2 | 3700 | 1.15 | 35 |

*: Defined by weight average molecular weight (Mw)/number average molecular weight (Mn). Also, the following resins were synthesized.

TABLE 2

| | Compositional Ratio (mol %) | Mw | Mw/Mn |
|---|---|---|---|
| P-1 | 65/35 | 10800 | 1.65 |
| P-2-1 | 60/40 | 12000 | 1.7 |
| P-2-2 | 65/25/10 | 14000 | 1.5 |
| P-2-3 | 64/33/3 | 20000 | 1.47 |

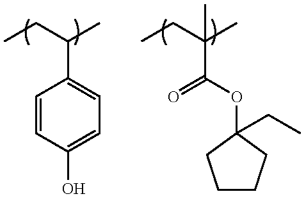

P-1

TABLE 2-continued
| | Compositional Ratio (mol %) | Mw | Mw/Mn |
|---|---|---|---|
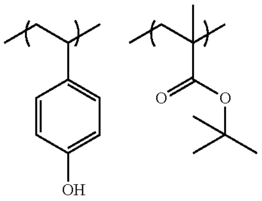
P-2-1
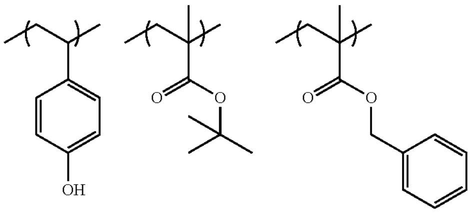
P-2-2
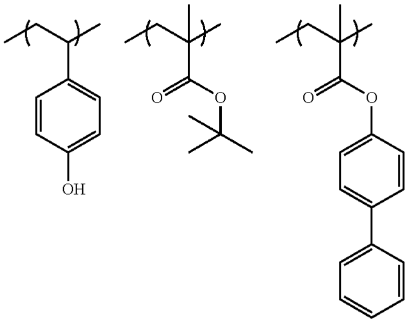
P-2-3
TABLE 3
| | Compositional Ratio (mol %) | Mw | Mw/Mn |
|---|---|---|---|
| P-3 | 76/12/12 | 20800 | 1.75 |
| P-4 | 35/58/7 | 4000 | 1.69 |
| P-5 | 60/37/3 | 5000 | 1.60 |
| P-6 | 70/25/5 | 10000 | 1.55 |
| P-7 | 60/35/5 | 16300 | 1.73 |
| P-8 | 80/20 | 11300 | 1.18 |
| P-9 | 60/36/4 | 5200 | 1.72 |
| P-10 | 65/30/5 | 4800 | 1.65 |
| P-11 | 64/31/5 | 5300 | 1.67 |
| P-12 | 71/29 | 4500 | 1.65 |
TABLE 3-continued
| | Compositional Ratio (mol %) | Mw | Mw/Mn |
|---|---|---|---|
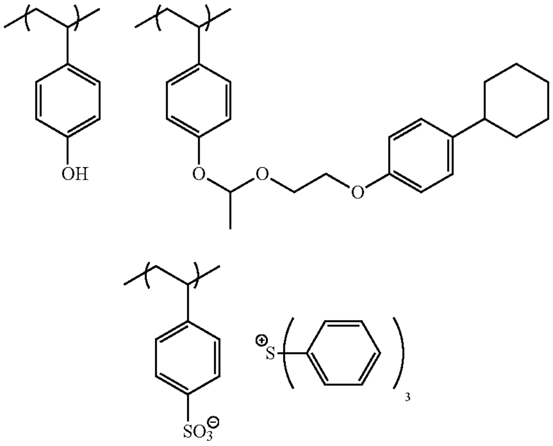
P-3
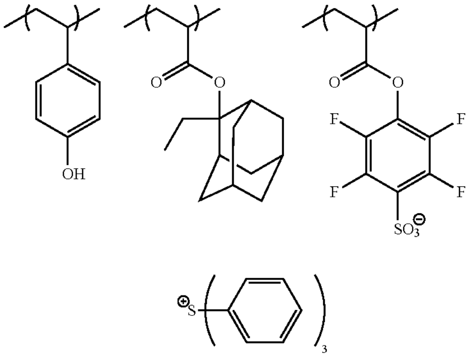
P-4
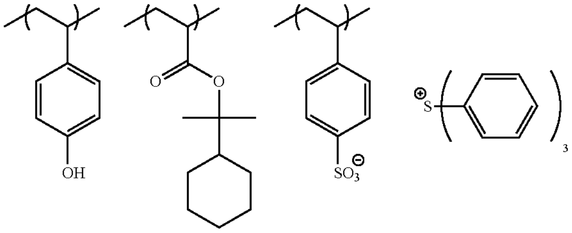
P-5
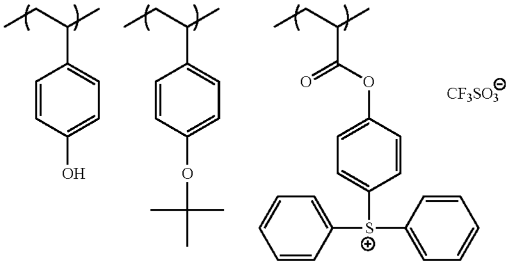
P-6

TABLE 3-continued

| | Compositional Ratio (mol %) | Mw | Mw/Mn |
|---|---|---|---|
| 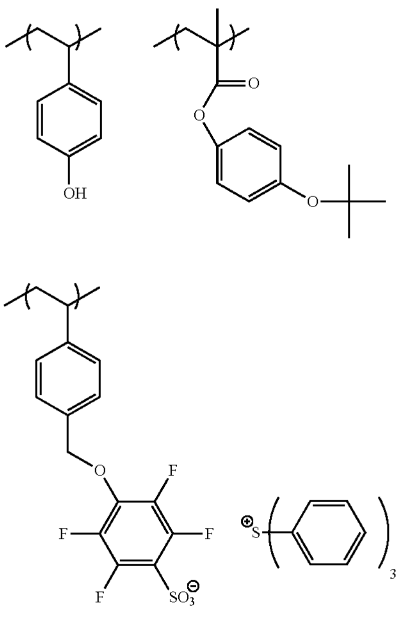 P-7 | | | |
| 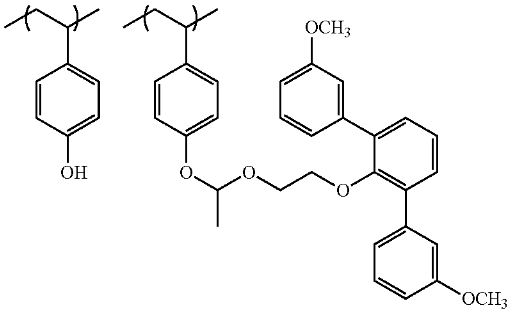 P-8 | | | |
| 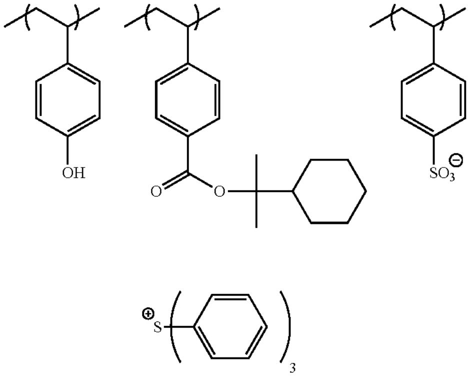 P-9 | | | |

TABLE 3-continued

| | Compositional Ratio (mol %) | Mw | Mw/Mn |
|---|---|---|---|
| 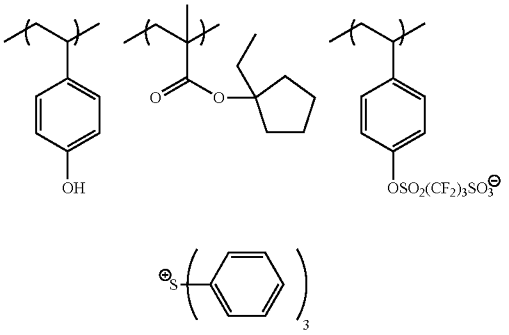 P-10 | | | |
| 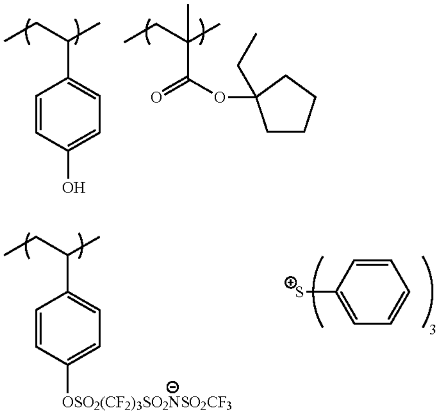 P-11 | | | |
| 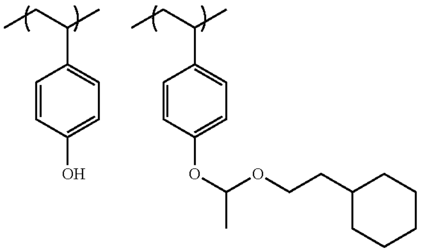 P-12 | | | |

P-3 was synthesized by the following method.

(1) Synthesis of Triphenylsulfonium 4-Styrenesulfonate

Triphenylsulfonium Br salt (50 g) was dissolved in 65 ml of methanol, and a mixed solution containing 30 g of Na 4-styrenesulfonate, 65 ml of methanol and 130 ml of ion-exchanged water was added dropwise to the solution above at room temperature with stirring. The resulting solution was subjected to extraction and washing by adding ion-exchanged water. The organic layer was concentrated, and the precipitated solid was re-slurried in hexane/ethyl acetate and then filtered to obtain 48 g of triphenylsulfonium 4-styrenesulfonate.

(2) Synthesis of Polymer P-3

10 Parts by mass of p-hydroxystyrene and 0.01 part by mass of pyridine p-toluenesulfonate were dissolved in 80 parts by mass of ethyl acetate at room temperature. While stirring the resulting solution, a mixed solution containing 20.9 parts by mass of 2-(4-cyclohexylphenoxy)ethyl vinyl ether and 20 parts by mass of ethyl acetate was added dropwise at room temperature. After the dropwise addition, the reaction was further allowed to proceed at room temperature for 24 hours. The resulting solution was made basic by adding triethylamine and washed with ion-exchanged water, and the organic layer was concentrated and purified by column chromatography with hexane/ethyl acetate to obtain Monomer M1.

4.66 Parts by mass of 1-methoxy-2-propanol was heated at 80° C. under nitrogen flow and while stirring this solution, a mixed solution containing 5.21 parts by mass of 4-hydroxystyrene, 3.05 parts by mass of the monomer (M1) obtained above, 1.74 parts by mass of triphenylsulfonium 4-styrenesulfonate obtained in (I) above, 18.6 parts by mass of 1-methoxy-2-propanol and 1.36 parts by mass of dimethyl 2,2'-azobisisobutyrate [V-601, produced by Wako Pure Chemical Industries, Ltd.] was added dropwise over 2 hours. After the completion of dropwise addition, the solution was further stirred at 80° C. for 4 hours. The resulting reaction solution was allowed to cool and then subjected to reprecipitation from a large amount of hexane/ethyl acetate and vacuum drying to obtain Resin P-3.

P-4 was synthesized in accordance with the method described in Example 12 of U.S. Patent Application Publication 2007/0117043A1.

P-5 was synthesized by the following method.

1-Methoxy-2-propanol (17.5 ml) was heated at 80° C. under nitrogen flow and while stirring this solution, a mixed solution containing 10.3 g (85.4 mmol) of 4-hydroxystyrene, 8.0 g (38.2 mmol) of 2-cyclohexyl-2-propyl acrylate, 1.7 g of (3.8 mmol) of triphenylsulfonium 4-styrenesulfonate, 5.9 g (25.5 mmol) of dimethyl 2,2'-azobisisobutyrate (V-601, produced by Wako Pure Chemical Industries, Ltd.) and 70 ml of 1-methoxy-2-propanol was added dropwise over 4 hours. After the completion of dropwise addition, the solution was further stirred at 80° C. for 2 hours. The resulting reaction solution was allowed to cool and then subjected to reprecipitation from a large amount of hexane/ethyl acetate and vacuum drying to obtain P-5.

P-6 was synthesized in accordance with the method described in JP-A-2005-084365.

P-7 was synthesized in the same manner as P-3. Here, as for the unit having a sulfonic acid-generating site, a monomer unit synthesized in accordance with the method described in Example 3 of U.S. Patent Application Publication 2007/0117043 was used.

P-8 was synthesized in the same manner as Resin B-1 except for changing the vinyl ether.

P-9 was synthesized in the same manner as P-5 except that in the synthesis of P-5, 8.0 g (38.2 mmol) of 2-cyclohexyl-2-propyl acrylate was changed to 10.4 g (38.2 mmol) of 4-(2-cyclohexyl-2-propoxycarbonypstyrene.

P-10 was synthesized by the following method.

<Synthesis of Compound (5)>

Compound (5) was synthesized by the following route.

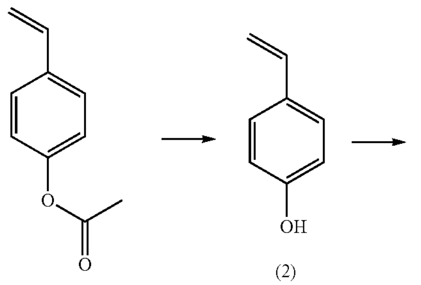

(1) (2)

-continued

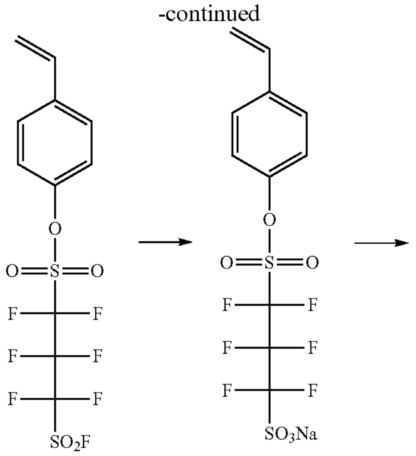

(3) (4)

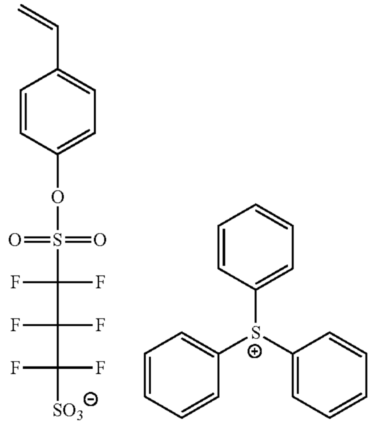

(5)

<Synthesis of Compound (2)>

Compound (1) (100.00 g) was dissolved in 400 g of ethyl acetate. The obtained solution was cooled to 0° C., and 47.60 g of sodium methoxide (a 28 mass % methanol solution) was added dropwise over 30 minutes. This mixture was stirred at room temperature over 5 hours and to the resulting reaction solution, ethyl acetate was added. The organic layer was washed with distilled water three times and dried over anhydrous sodium sulfate, and the solvent was removed by distillation. In this way, 131.70 g of Compound (2) (a 54 mass % ethyl acetate solution) was obtained.

<Synthesis of Compound (3)>

Ethyl acetate (56.00 g) was added to 18.52 g of Compound (2) (a 54 mass % ethyl acetate solution) and thereto, 31.58 g of 1,1,2,2,3,3-hexafluoroproparie-1,3-disulfonyl difluoride was added. The system was cooled to 0° C., and a solution obtained by dissolving 12.63 g of triethylamine in 25.00 g of ethyl acetate was added dropwise over 30 minutes. The resulting mixture was stirred over 4 hours while maintaining the liquid temperature at 0° C., and ethyl acetate was added thereto. Thereafter, the organic layer was washed with saturated brine three times and dried over anhydrous sodium sulfate, and the solvent was removed by distillation. In this way, 32.90 g of Compound (3) was obtained.

<Synthesis of Compound (4)>

Compound (3) (35.00 g) was dissolved in 315 g of methanol, and the resulting solution was cooled to 0° C. Subsequently, 245 g of an aqueous 1 N sodium hydroxide solution was added thereto, and the mixture was stirred at room temperature for 2 hours. The solvent was removed by distillation, and ethyl acetate was added to the residue. Thereafter, the organic layer was washed with saturated brine three times and dried over anhydrous sodium sulfate, and the solvent was removed by distillation. In this way, 34.46 g of Compound (4) was obtained.

<Synthesis of Compound (5)>

Compound (4) (28.25 g) was dissolved in 254.25 g of methanol, and 23.34 g of triphenylsulfonium bromide was added thereto. The mixture was stirred at room temperature for 3 hours, and the solvent was removed by distillation. Subsequently, distilled water was added to the residue, and the mixture was extracted with chloroform three times. The obtained organic layer was washed with distilled water three times, and the solvent was removed by distillation. In this way, 42.07 g of Compound (5) was obtained.

<Synthesis of P-10> p-Hydroxystyrene (14.75 g (a 53.1 mass % propylene glycol monomethyl ether solution)), 5.46 g of 1-ethylcyclopentyl methacrylate, 3.38 g of Compound (5) and 1.61 g of polymerization initiator V-601 (produced by Wako Pure Chemical Industries, Ltd.) were dissolved in 29.18 g of propylene glycol monomethyl ether (PGME). Subsequently, 8.80 g of PGME was charged in a reaction vessel and in a nitrogen gas atmosphere, the solution obtained above was added dropwise to the system at 85° C. over 4 hours. The reaction solution was heated with stirring for 2 hours and then allowed to cool to room temperature.

The reaction solution was diluted with 31 g of acetone, and the resulting diluted solution was added dropwise in 1,000 g of hexane/ethyl acetate=8/2 (mass ratio) to precipitate a polymer. After filtration, the collected solid was spray-washed using 250 g of hexane/ethyl acetate=8/2 (mass ratio). The obtained solid was dissolved in 65 g of acetone, and the resulting solution was added dropwise in 800 g of methanol/distilled water=2/8 (mass ratio) to precipitate a polymer. After filtration, the collected solid was spray-washed using 200 g of methanol/distilled water=2/8 (mass ratio). Thereafter, the washed solid was dried under reduced pressure to obtain 9.38 g of Resin P-10.

P-11 was synthesized in the same manner as P-10 except that in the synthesis of P-10, 3.38 g of Compound (5) was changed to 4.03 g of Compound (6) shown below.

(6)

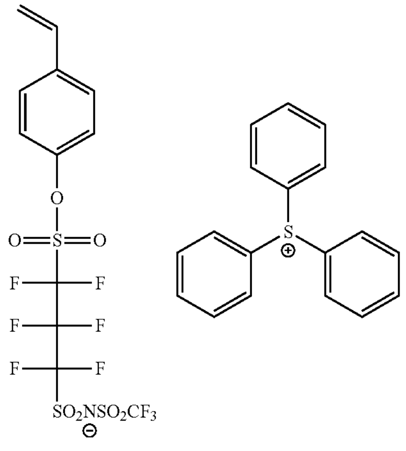

[4. Preparation of Composition]

Respective materials shown in Table 4 were dissolved in a mixed solvent of PGMEA (propylene glycol monomethyl ether acetate)/PGME (propylene glycol monomethyl ether) (mass ratio: 6/4), and the resulting solution was filtered through a polypropylene filter having a pore size of 0.1 μm to prepare a resist solution with a solid content concentration of 2.5 mass % (except that the solid content concentration of Composition 43 was 1.7 mass %). In all compositions, surfactant PF6320 produced by OMNOVA was added to give a concentration of 100 ppm in the composition.

TABLE 4

| Resist Composition | Resin | (g) | Acid Generator | (g) | Organic Basic Compound | (g) |
|---|---|---|---|---|---|---|
| 1 | B-1 | 2.0 | D-1 | 0.08 | E-2 | 0.011 |
| 2 | B-2 | 2.0 | D-1 | 0.08 | E-2 | 0.011 |
| 3 | B-3 | 2.0 | D-1 | 0.08 | E-2 | 0.011 |
| 4 | B-4 | 2.0 | D-1 | 0.08 | E-2 | 0.011 |
| 5 | B-5 | 2.0 | D-1 | 0.08 | E-2 | 0.011 |
| 6 | B-6 | 2.0 | D-1 | 0.08 | E-2 | 0.011 |
| 7 | B-7 | 2.0 | D-1 | 0.08 | E-2 | 0.011 |
| 8 | B-8 | 2.0 | D-1 | 0.08 | E-2 | 0.011 |
| 9 | B-9 | 2.0 | D-1 | 0.08 | E-2 | 0.011 |
| 10 | B-10 | 2.0 | D-1 | 0.08 | E-2 | 0.011 |
| 11 | B-6 | 2.0 | D-2 | 0.08 | E-2 | 0.011 |
| 12 | B-10 | 2.0 | D-2 | 0.08 | E-2 | 0.011 |
| 13 | B-6 | 2.0 | D-2 | 0.08 | E-1 | 0.011 |
| 14 | B-10 | 2.0 | D-2 | 0.08 | E-1 | 0.011 |
| 15 | B-6 | 1.8 | D-2 | 0.19 | E-2 | 0.0085 |
| 16 | B-10 | 1.8 | D-2 | 0.19 | E-2 | 0.0085 |
| 17 | B-6 | 1.75 | D-2 | 0.24 | E-2 | 0.0085 |
| 18 | B-10 | 1.75 | D-2 | 0.24 | E-2 | 0.0085 |
| 19 | B-11 | 2.0 | D-1 | 0.08 | E-1 | 0.011 |
| 20 | B-1 | 2.04 | D-1 | 0.04 | E-1 | 0.011 |
| 21 | P-1 | 2.0 | D-1 | 0.08 | E-2 | 0.011 |
| 22 | P-1 | 2.0 | D-3 | 0.08 | E-2 | 0.011 |
| 23 | P-1 | 2.0 | D-1 | 0.08 | E-2 | 0.011 |
| 24 | P-2-1 | 2.0 | D-3 | 0.08 | E-2 | 0.011 |
| 25 | P-2-2 | 2.0 | D-3 | 0.08 | E-1 | 0.011 |
| 26 | P-2-3 | 2.0 | D-3 | 0.08 | E-2 | 0.011 |
| 27 | P-3 | 2.05 | — | — | E-1 | 0.01 |
| 28 | P-3 | 2.05 | — | — | E-2 | 0.01 |
| 29 | P-3 | 2.05 | — | — | E-1 | 0.005 |
| 30 | P-3 | 2.05 | — | — | E-2 | 0.005 |
| 31 | P-4 | 2.05 | — | — | E-1 | 0.01 |
| 32 | P-4 | 2.05 | — | — | E-2 | 0.01 |
| 33 | P-4 | 2.05 | — | — | E-1 | 0.005 |
| 34 | P-4 | 2.05 | — | — | E-2 | 0.005 |
| 35 | P-5 | 2.05 | — | — | E-1 | 0.01 |
| 36 | P-6 | 2.05 | — | — | E-2 | 0.005 |
| 37 | P-7 | 2.05 | — | — | E-2 | 0.005 |
| 38 | P-8 | 2.0 | D-4 | 0.24 | E-2 | 0.01 |
| 39 | P-2-1 | 2.0 | D-5 | 0.13 | E-2 | 0.011 |
| 40 | P-9 | 2.05 | — | — | E-2 | 0.01 |
| 41 | P-10 | 2.05 | D-5 | 0.01 | E-2 | 0.01 |
| 42 | P-11 | 2.05 | — | — | E-2 | 0.01 |
| 43 | P-12 | 2.05 | D-5 | 0.40 | E-2 | 0.037 |

Compounds used in Examples are shown below. Here, both $C_8H_{17}$ of Compound (E-1) and $C_4H_9$ of Compound (E-2) are a linear alkyl group.

D-1

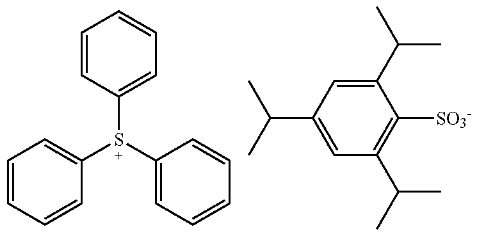

-continued

D-2

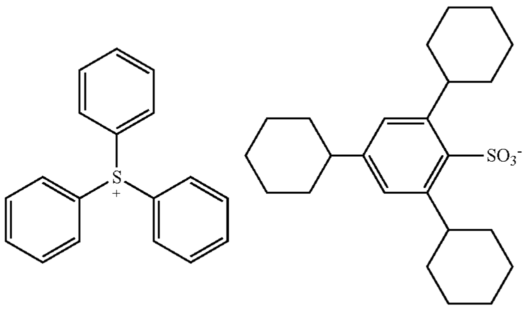

D-3

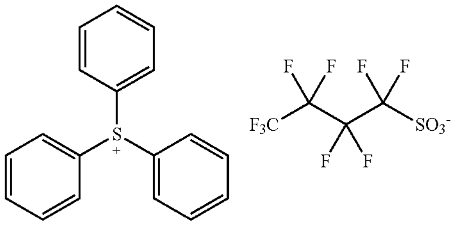

D-4

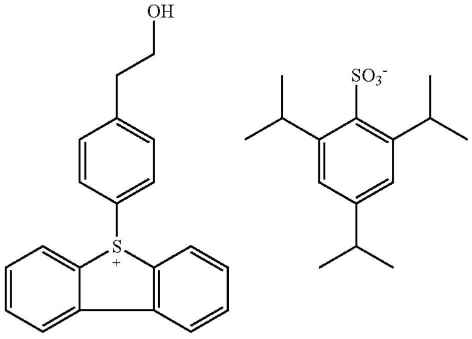

D-5

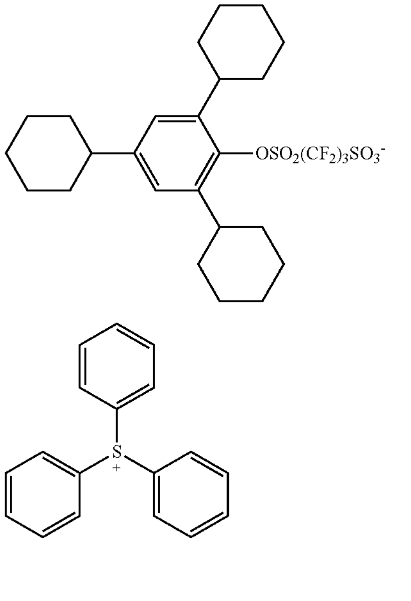

E-1

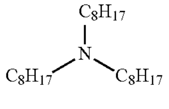

-continued

E-2

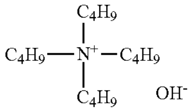

In the compounds above, D-1 was synthesized based on JP-A-10-282669.

D-2 was synthesized by the following method.

<Synthesis of Tricyclohexylbenzene>

Aluminum chloride (6.83 g) was added to 20.0 g of benzene, and the mixture was cooled with stirring at 3° C. Thereto, 40.4 g of cyclohexyl chloride was gradually added dropwise. After the dropwise addition, the reaction solution was stirred at room temperature for 5 hours and then poured in ice water. The organic layer was extracted with ethyl acetate, and the obtained organic layer was distilled off under reduced pressure at 40° C. and further distilled off under reduced pressure at 170° C. The residue was cooled, to room temperature, and 50 ml of acetone was added thereto for recrystallization. The precipitated crystal was collected by filtration to obtain 14 g of tricyclohexylbenzene.

<Synthesis of Sodium Tricyclohexylbenzenesulfonate>

Tricyclohexylbenzene (30 g) was dissolved in 50 ml of methylene chloride, and the resulting solution was cooled with stirring at 3° C. Thereto, 15.2 g of chlorosulfonic acid was gradually added dropwise. After the dropwise addition, the reaction solution was stirred at room temperature for 5 hours, and 10 g of ice was poured thereinto. Furthermore, 40 g of an aqueous 50 mass % sodium hydroxide solution was poured therein, and 20 g of ethanol was then added. This mixture was stirred at 50° C. for 1 hour, and insoluble matters were removed by filtration. The residue was distilled off under reduced pressure at 40° C., and the precipitated crystal was collected by filtration and washed with hexane to obtain 30 g of sodium 1,3,5-tricyclohexylbenzenesulfonate.

<Synthesis of D-2>

Triphenylsulfonium bromide (4.0 g) was dissolved in 20 ml of methanol, and 5.0 g of sodium 1,3,5-tricyclohexylbenzenesulfonate dissolved in 20 ml of methanol was added thereto. This mixture was stirred at room temperature for 2 hours and after adding 50 ml of ion-exchanged water, extracted with chloroform. The organic layer obtained was washed with water and distilled off under reduced pressure at 40° C., and the obtained crystal was recrystallized from a methanol/ethyl acetate solvent. In this way, 5.0 g of Compound D-2 was obtained.

D-4 was synthesized in accordance with the method described in Examples of JP-A-2007-210904.

D-5 was synthesized by the following method.

2,4,6-Tricyclohexylphenol (10.0 g) was dissolved in 400 ml of THF and in a nitrogen atmosphere, 18.7 ml of n-butyllithium (a 1.65 M hexane solution) was added thereto at 0° C. This mixture was stirred at 0° C. for 1 hour, and the resulting reaction solution was added dropwise to 100 ml of a THF solution containing 9.28 g of 1,1,2,2,3,3-hexafluoropropane-1,3-disulfonylm difluoride at 0° C. over 30 minutes. After the dropwise addition, the reaction solution was further stirred for 30 minutes. Subsequently, 100 ml of distilled water and 200 ml of ethyl acetate were added, and the organic layer was washed with saturated brine twice. The solvent was removed by distillation, and 100 ml of methanol and 200 ml of an aqueous I N sodium hydroxide solution were added to the residue. This mixture was stirred for 1 hours and after removing methanol by distillation, 200 ml of ethyl acetate was added. The organic layer was washed with saturated brine twice, and the solvent was removed by distillation. The obtained solid was dissolved in 100 ml of methanol, and 10.0 g of triphenylsulfonium bromide was added thereto. This mixture was stirred for 1 hour and after removing the solvent by distillation, ethyl acetate was added to the residue. The organic layer was washed sequentially with an aqueous saturated sodium hydrogencarbonate solution and then with water, and the solvent was removed by distillation to obtain 19.5 g of D-5.

[5. Pattern Formation]

Using each composition shown in Table 4, a resist film was formed by spin coating (1,100 rpm) on a discotic Si substrate. This resist film was formed into a film having a film thickness of 40 nm by performing baking (PB) (130° C., 90 sec). Subsequently, the substrate was set in an apparatus shown in FIG. 3 of Japanese Patent 4,109,085, and electron-beam pattern drawing was performed while rotating the substrate.

After the completion of pattern drawing, baking (PEB) (130° C., 120 sec) was performed, and the substrate was developed with an aqueous 2.38 mass % tetramethylammonium hydroxide solution and then rinsed with pure water to form a line-and-space resist pattern of 30 nm (1:1) on the substrate.

The obtained resist pattern was analyzed with a Critical Dimension SEM apparatus (Hitachi S-9380) and by observing the portion where lines and spaces were resolved at 1:1, the irradiation energy when resolving a line-and-space resist pattern of 30 nm (1:1) was defined as the sensitivity (Eopt). As this value is smaller, the sensitivity is higher.

Also, the minimum line width of a resolvable line when resolving the pattern of line:space=1:1 with the sensitivity above was observed by the scanning electron microscope above and defined as the resolution.

Furthermore, the line-and-space resist pattern of 30 nm (1:1) was observed using the Critical Dimension SEM apparatus above, and the line width was measured at arbitrary 30 points within the range of 50 μm in the longitudinal direction of the line pattern having a line width of 30 nm. From the standard deviation thereof, 3σ (nm) was computed, whereby the line width roughness (LWR) was measured.

Incidentally, Resist Compositions 19 and 20 allowed line pattern formation with a line width of 45 nm and 55 nm, respectively, and these values are directly used for the resolution.

TABLE 5

| Resist Composition | Sensitivity (μC/$cm^2$) | Resolution (nm) | LWR (nm) |
|---|---|---|---|
| 1 | 32 | 27.5 | 5.5 |
| 2 | 33 | 27.5 | 5.3 |
| 3 | 31 | 25 | 5.4 |
| 4 | 30 | 27.5 | 5.2 |
| 5 | 29 | 25 | 5.4 |
| 6 | 30 | 25 | 5.2 |
| 7 | 31 | 25 | 5.4 |
| 8 | 30 | 27.5 | 5.3 |
| 9 | 30 | 25 | 5.2 |
| 10 | 32 | 27.5 | 5.4 |
| 11 | 30 | 27.5 | 5.4 |
| 12 | 31 | 25 | 5.3 |
| 13 | 32 | 25 | 5.4 |
| 14 | 31 | 25 | 5.3 |
| 15 | 21 | 25 | 4.6 |
| 16 | 20 | 25 | 4.5 |
| 17 | 20 | 25 | 4.7 |
| 18 | 18 | 25 | 4.8 |
| 19 | 55 | 45 | 9.2 |
| 20 | 70 | 55 | 9.8 |
| 21 | 38 | 25 | 4.3 |
| 22 | 37 | 25 | 4.2 |
| 23 | 39 | 25 | 4.3 |
| 24 | 38 | 25 | 4.2 |
| 25 | 39 | 27.5 | 4.5 |
| 26 | 38 | 25 | 5.3 |
| 27 | 44 | 25 | 4.1 |
| 28 | 42 | 25 | 4.1 |
| 29 | 33 | 25 | 4.4 |
| 30 | 32 | 25 | 4.5 |
| 31 | 44 | 25 | 4.2 |
| 32 | 43 | 25 | 4.1 |
| 33 | 33 | 25 | 4.5 |
| 34 | 32 | 25 | 4.6 |
| 35 | 43 | 25 | 4.2 |
| 36 | 40 | 27.5 | 5.0 |
| 37 | 42 | 27.5 | 4.5 |
| 38 | 37 | 27.5 | 5.5 |
| 39 | 39 | 25 | 4.0 |
| 40 | 45 | 25 | 4.1 |
| 41 | 30 | 22.5 | 3.5 |
| 42 | 30 | 22.5 | 3.6 |
| 43 | 45 | 25 | 3.6 |

[6. Preparation of Stamper for Production of Magnetic Recording Medium]

The Si substrate having thereon a resist pattern formed by the process above was subjected to reactive ion etching (RIE) according to the procedure shown in FIGS. 2A and 2B of JP-A-2008-162101 to produce a stamper master (master mold) for the production of a magnetic recording medium, and a quartz-made mold structural body (replica mold) was produced using the master mold.

[7. Preparation of Mold for Production of Semiconductor Circuit (No. 1)]

Pattern formation was performed in the same manner as in the exposure method of 5. above except for using Resist Compositions 1 to 43 shown in Table 4 and changing the rotational exposure to exposure by x-y scanning (accelerating voltage: 50 kV, beam diameter: 5 nm). As a result, the resist pattern formation could be performed with good sensitivity, resolution and LWR on the same level as in Table 5.

Using the thus-formed resist pattern as a mask, etching with a $CHF_3$/Ar mixed gas (volume mixing ratio: 1:4) was performed. Thereafter, the resist pattern was removed to obtain a mold (master mold) having a concave-convex pattern.

A curable composition (photocurable resin, PAK-01, produced by Toyo Gosei Co., Ltd.) was coated on a quartz substrate to form an imprint resist layer, and the substrate was subjected to optical imprinting in the imprint resist layer by using the master mold, etching for removing residual film between patterns by using an $O_2$/Ar mixed gas (volume mixing ratio: 1:4), quartz etching with a $CHF_3$/Ar mixed gas (volume mixing ratio: 1:4), washing and then release treatment with a silane coupling agent. In this way, a quartz-made mold (stamper) was produced.

Incidentally, in 7. above, when a step of electron-beam curing the resist pattern under the conditions of an accelerating voltage of 1 kV and an exposure dose of 1 mC/$cm^2$ was added between the resist pattern formation and the etching step with a $CHF_3$/Ar mixed gas (volume mixing ratio: 1:4), LWR could be improved by about 0.5 nm as compared with the case of not performing electron beam curing.

[8. Preparation of Mold for Production of Semiconductor Circuit (No. 2)]

Pattern formation was performed in the same manner as in the exposure method of 5. above except for using Resist Compositions 1 to 43 shown in Table 4, changing the rotational exposure to exposure by x-y scanning (accelerating voltage: 50 kV, beam diameter: 5 nm), and using, as the substrate, a quartz substrate having a Cr layer on the surface. As a result, the resist pattern formation could be performed with good sensitivity, resolution and LWR on the same level as in Table 5.

Using the thus-formed resist pattern as a mask, Cr etching with a $Cl_2/O_2$ mixed gas (volume mixing ratio: 4:1) was performed and furthermore, quartz etching with a $CHF_3/Ar$ mixed gas (volume mixing ratio: 1:4) was performed. After removing and washing the resist and Cr pattern, release treatment with a silane coupling agent was performed. In this way, a mold (stamper) was produced.

Industrial Applicability

According to the present invention, a chemical amplification resist composition (preferably a chemical amplification resist composition for electron beam) suitable particularly for the preparation of a mold and capable of forming a pattern excellent not only in the sensitivity and resolution but also in the line width roughness (LWR) performance, and a mold preparation method and a resist film each using the composition, can be provided.

This application is based on Japanese patent applications No. 2009-149229, filed on Jun. 23, 2009 and No. 2010-030654, filed on Feb. 15, 2010, the entire content of which is hereby incorporated by reference, the same as if set forth at length.

The invention claimed is:

1. A method for preparing a mold, comprising:

coating a chemical amplification resist composition on a substrate to form a resist film, performing pattern drawing with an electron beam, performing development with a developer to form a resist pattern;

performing an etching treatment to the substrate having thereon the thus-formed resist pattern by using the resist pattern as a mask to form a concave-convex structure on the substrate, wherein the chemical amplification resist composition comprises:

(A) a resin capable of decomposing by an action of an acid to increase the solubility of the resin (A) in an alkali developer, wherein the resin (A) has a group represented by the following formula (I) or (II):

(I)

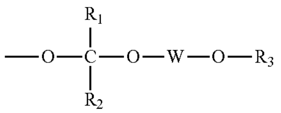

wherein each of $R_1$ and $R_2$ independently represents a hydrogen atom or an alkyl group;

W represents a divalent organic group; and $R_3$ represents an alkyl group, a cycloalkyl group, an aryl group or an aralkyl group:

(II)

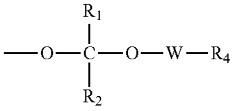

wherein $R_1$, $R_2$ and W have the same meanings as those in formula (I); and $R_4$ represents a cycloalkyl group or an aryl group.

2. The method for preparing a mold according to claim 1, wherein the mold is a mold used for forming a semiconductor microcircuit.

3. The method for preparing a mold according to claim 1, wherein the resin (A) in the chemical amplification resist composition contains a repeating unit represented by the following formula (III):

(III)

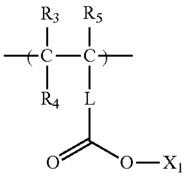

wherein each of $R_3$ to $R_5$ independently represents a hydrogen atom, a fluorine atom, a chlorine atom, a cyano group or an alkyl group;

$X_1$ represents a group capable of leaving by an action of an acid; and

L represents a single bond or a divalent linking group.

4. The method for preparing a mold according to claim 1, wherein the chemical amplification resist composition further comprises:

(B) a compound capable of generating an acid upon irradiation with an actinic ray or radiation, wherein the compound (B) contains a compound capable of generating an acid represented by the following formula (a):

(a)

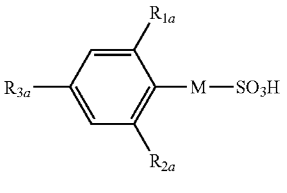

wherein each of $R_{1a}$, $R_{2a}$ and $R_{1a}$ independently represents an alkyl group or a cycloalkyl group; and M represents a single bond or a divalent linking group.

5. The method for preparing a mold according to claim 1, wherein the resin (A) in the chemical amplification resist composition has the group represented by formula (I), and $R_3$ represents an aryl group or an aralkyl group.

6. The method for preparing a mold according to claim 1, wherein the resin (A) contains a repeating unit having a lactone structure.

7. The method for preparing a mold according to claim 1, wherein the chemical amplification resist composition further comprises:

(B) a compound capable of generating an acid upon irradiation with an actinic ray or radiation, and the content of the compound (B) is from 3 to 30 mass % based on the entire solids content of the chemical amplification resist composition.

8. The method for preparing a mold according to claim 7, wherein the content of the compound (B) is from 5 to 25 mass % based on the entire solids content of the chemical amplification resist composition.

9. The method for preparing a mold according to claim 1, wherein the resin (A) in the chemical amplification resist composition further contains at least one repeating unit selected from the group consisting of the following formulae (IV) to (VI):

(IV)

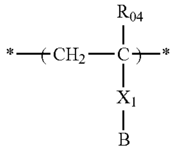

(V)

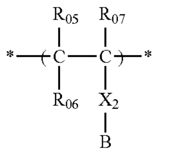

(VI)

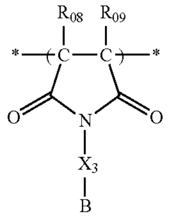

wherein each of $R_{04}$, $R_{05}$ and $R_{07}$ to $R_{09}$ independently represents a hydrogen atom, an alkyl group, a cycloalkyl group, a halogen atom, a cyano group or an alkoxycarbonyl group;

$R_{06}$ represents a cyano group, a carboxyl group, —CO—$OR_{25}$ or —CO—N($R_{26}$)($R_{27}$), wherein $R_{26}$ and $R_{27}$ may combine with each other to form a ring together with the nitrogen atom;

each of $X_1$ to $X_3$ independently represents a single bond, an arylene group, an alkylene group, a cycloalkylene group, —O—, —$SO_2$—, —CO—, —COO—, —N($R_{33}$)— or a divalent linking group formed by combining a plurality of these groups;

$R_{25}$ represents an alkyl group, a cycloalkyl group, an alkenyl group, an aryl group or an aralkyl group;

each of $R_{26}$, $R_{27}$ and $R_{33}$ independently represents a hydrogen atom, an alkyl group, a cycloalkyl group, an alkenyl group, an aryl group or an aralkyl group; and B represents a structural moiety capable of decomposing upon irradiation with an actinic ray or radiation to produce an acid.

10. The method for preparing a mold according to claim 9, wherein B in formulae (IV) to (VI) is a structure represented by the following formula (ZI') or (ZII'):

(ZI')

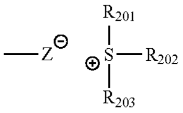

(ZII')

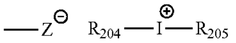

wherein each of $R_{201}$, $R_{202}$ and $R_{203}$ independently represents an organic group, two members out of $R_{201}$ to $R_{203}$ may combine with each other to form a ring structure, and the ring may contain an oxygen atom, a sulfur atom, an ester bond, an amide bond or a carbonyl group;

each of $R_{204}$ and $R_{205}$ independently represents an aryl group, an alkyl group or a cycloalkyl group; and $Z^-$ represents an acid anion that is generated by decomposition upon irradiation with an actinic ray or radiation.

11. The method for preparing a mold according to claim 10, wherein the acid anion $Z^-$ in formulae (ZI') and (ZII') is an acid anion corresponding to an aliphatic sulfonate anion substituted with a fluorine atom at the α-position, an aromatic sulfonate anion substituted with a fluorine atom or a fluorine atom-containing group, a bis(alkylsulfonyl)imide anion in which the alkyl group is substituted with a fluorine atom, or a tris(alkylsulfonyl)methide anion in which the alkyl group is substituted with a fluorine atom.

12. The method for preparing a mold according to claim 1, wherein the chemical amplification resist composition further comprises:

(C) an organic basic compound.

13. The method for preparing a mold according to claim 12, wherein the organic basic compound (C) is a compound having an onium hydroxide structure.

14. The method for preparing a mold according to claim 13, wherein the compound having an onium hydroxide structure is a tetraalkylammonium hydroxide.

15. The method for preparing a mold according to claim 1, wherein the resin (A) in the chemical amplification resist composition has a group represented by formula (II).

16. The method for preparing a mold according to claim 15, wherein W in formula (II) represents an alkylene group.

17. The method for preparing a mold according to claim 15, wherein W in formula (II) represents a linear alkylene group.

18. The method for preparing a mold according to claim 15, wherein $R_4$ in formula (II) represents a cycloalkyl group.

19. The method for preparing a mold according to claim 15, wherein $R_4$ in formula (II) represents a polycyclic cycloalkyl group.

* * * * *